US009494870B2

(12) United States Patent
Sato

(10) Patent No.: US 9,494,870 B2
(45) Date of Patent: Nov. 15, 2016

(54) EXPOSURE APPARATUS, EXPOSING METHOD, DEVICE MANUFACTURING METHOD, PROGRAM, AND RECORDING MEDIUM

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 7 days.

(21) Appl. No.: 14/047,433

(22) Filed: Oct. 7, 2013

(65) Prior Publication Data

US 2014/0253886 A1    Sep. 11, 2014

(30) Foreign Application Priority Data

Oct. 12, 2012    (JP) .................................. 2012-227214

(51) Int. Cl.
*G03B 27/52*    (2006.01)
*G03B 27/42*    (2006.01)
*G03F 7/20*    (2006.01)

(52) U.S. Cl.
CPC ................................. *G03F 7/70341* (2013.01)

(58) Field of Classification Search
CPC ............ G03F 7/70341; G03F 7/2041; G03F 7/70808; G03F 7/70816; G03F 7/70825; G03F 7/70833
USPC .............. 355/30, 52, 53, 55, 67–71, 72–75; 250/492.1, 492.2, 492.22, 493.1, 548; 430/5, 8, 22, 30, 311, 312, 321
See application file for complete search history.

(56) References Cited

U.S. PATENT DOCUMENTS 6,124,923 A * 9/2000 Horikawa ........... G03F 7/70358
355/53
6,208,407 B1    3/2001 Loopstra
(Continued)

FOREIGN PATENT DOCUMENTS

EP    1 713 113 A1    10/2006
WO    WO 01/35168 A1    5/2001
(Continued)

OTHER PUBLICATIONS

Nov. 12, 2013 International Search Report issued in International Application No. PCT/JP2013/077309 (with translation).
(Continued)

*Primary Examiner* — Christina Riddle
(74) *Attorney, Agent, or Firm* — Oliff PLC

(57) ABSTRACT

An exposure apparatus exposes a substrate by exposure light via liquid between an emitting surface of an optical member and the substrate. The exposure apparatus includes: a liquid immersion member configured to form an immersion liquid space on an object and including a first and second member, the first being disposed at at least a portion of surrounding of the optical member, the second being disposed at at least a portion of surrounding of an optical path of the exposure light below the first member, being movable with respect to the first member and including a second upper and lower surface, the second upper surface being opposite a first lower surface of the first member via a gap, the second lower surface being capable of being opposite to the object, which is movable below the optical member; and a vibration isolator configured to suppress a vibration of the first member.

59 Claims, 29 Drawing Sheets

(56) References Cited

U.S. PATENT DOCUMENTS

| | | | |
|---|---|---|---|
| 6,262,796 B1 | 7/2001 | Loopstra et al. | |
| 6,341,007 B1 | 1/2002 | Nishi et al. | |
| 6,452,292 B1 | 9/2002 | Binnard | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,119,874 B2* | 10/2006 | Cox | G03F 7/709 355/30 |
| 7,292,313 B2 | 11/2007 | Poon et al. | |
| 7,864,292 B2 | 1/2011 | Leenders et al. | |
| 8,004,651 B2 | 8/2011 | Nagasaka | |
| 8,068,209 B2 | 11/2011 | Poon et al. | |
| 8,134,685 B2 | 3/2012 | Nishii et al. | |
| 8,237,911 B2 | 8/2012 | Poon et al. | |
| 8,289,497 B2 | 10/2012 | Poon et al. | |
| 8,400,610 B2 | 3/2013 | Poon et al. | |
| 8,477,283 B2 | 7/2013 | Nishii | |
| 8,610,873 B2 | 12/2013 | Poon et al. | |
| 8,675,174 B2 | 3/2014 | Mizutani | |
| 8,743,343 B2 | 6/2014 | Poon et al. | |
| 8,891,059 B2 | 11/2014 | Nagasaka | |
| 8,896,806 B2 | 11/2014 | Sato | |
| 8,934,080 B2 | 1/2015 | Poon et al. | |
| 9,013,675 B2 | 4/2015 | Nishii et al. | |
| 9,223,225 B2 | 12/2015 | Shibazaki | |
| 2005/0007569 A1* | 1/2005 | Streefkerk | G03F 7/709 355/30 |
| 2005/0036121 A1* | 2/2005 | Hoogendam | G03F 7/70341 355/30 |
| 2005/0259233 A1* | 11/2005 | Streefkerk | G03F 7/70341 355/53 |
| 2006/0250593 A1* | 11/2006 | Nishii | G03F 7/70341 355/53 |
| 2007/0110213 A1* | 5/2007 | Leenders | G03F 7/70341 378/34 |
| 2007/0177125 A1 | 8/2007 | Shibazaki | |
| 2007/0263188 A1 | 11/2007 | Hara | |
| 2007/0288121 A1 | 12/2007 | Shibazaki | |
| 2008/0049209 A1 | 2/2008 | Nagasaka et al. | |
| 2009/0231560 A1* | 9/2009 | Poon | G03F 7/70341 355/30 |
| 2013/0265555 A1 | 10/2013 | Shibazaki | |
| 2013/0265556 A1* | 10/2013 | Sato | G03F 7/70341 355/30 |
| 2014/0022522 A1 | 1/2014 | Sato | |
| 2014/0285781 A1 | 9/2014 | Sato | |
| 2014/0300875 A1 | 10/2014 | Sato et al. | |
| 2014/0307235 A1 | 10/2014 | Sato | |

FOREIGN PATENT DOCUMENTS

| | | |
|---|---|---|
| WO | WO 2004/019128 A2 | 3/2004 |
| WO | WO 2005/093791 A1 | 10/2005 |

OTHER PUBLICATIONS

Nov. 12, 2013 Written Opinion of the International Searching Authority issued in International Application No. PCT/JP2013/077309 (with translation).

* cited by examiner

FIG. 5
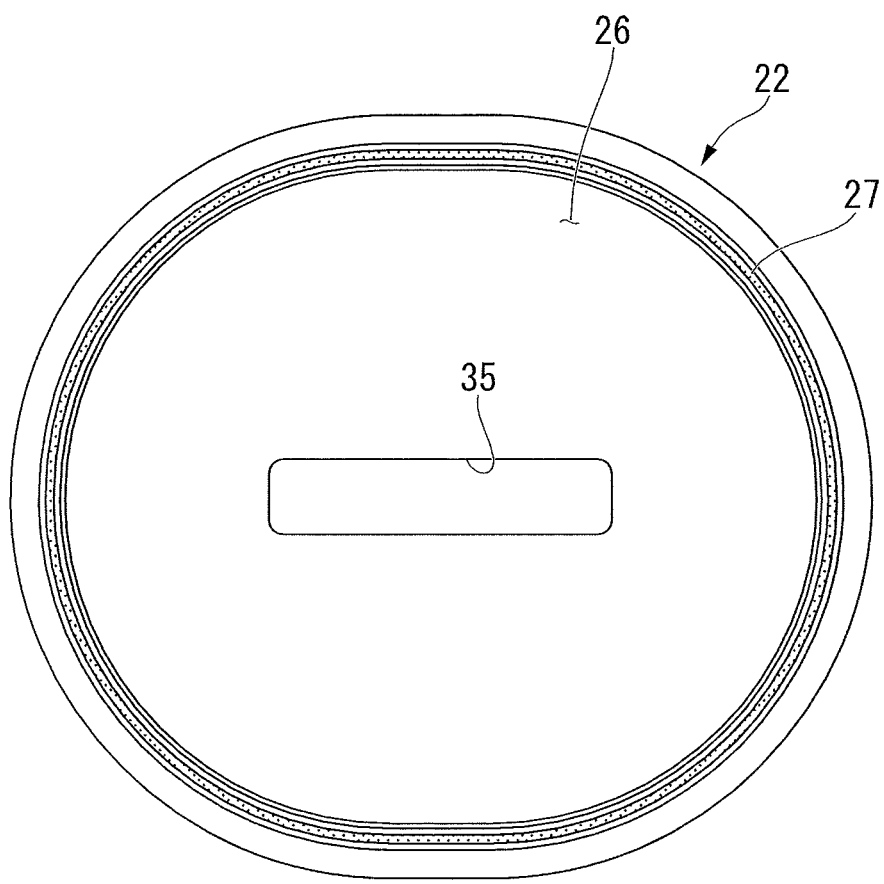
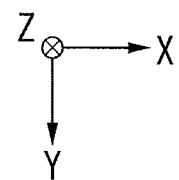

FIG. 9
(A)
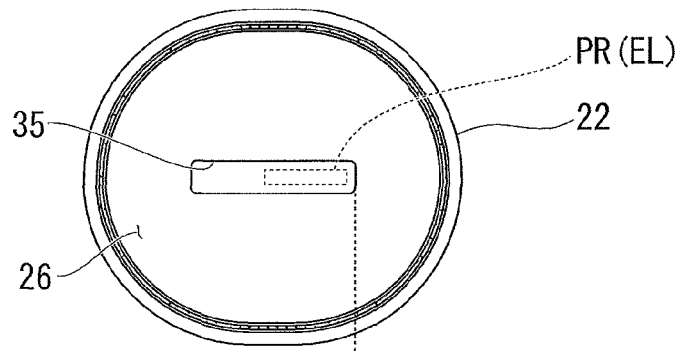
(B)
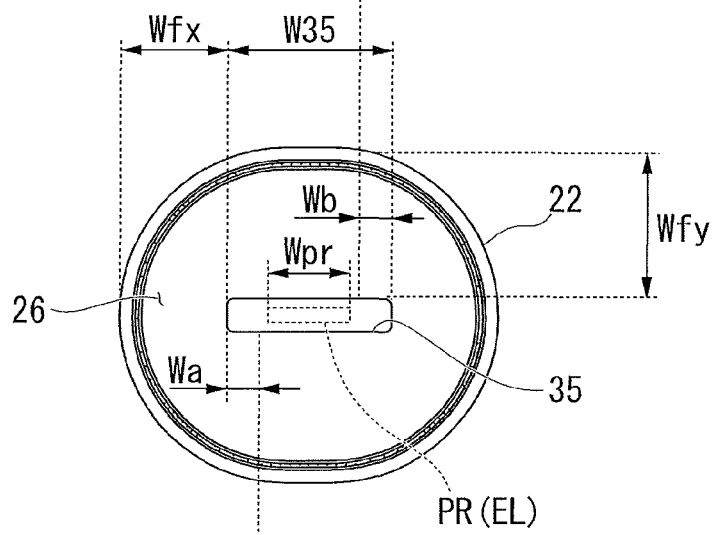
(C)
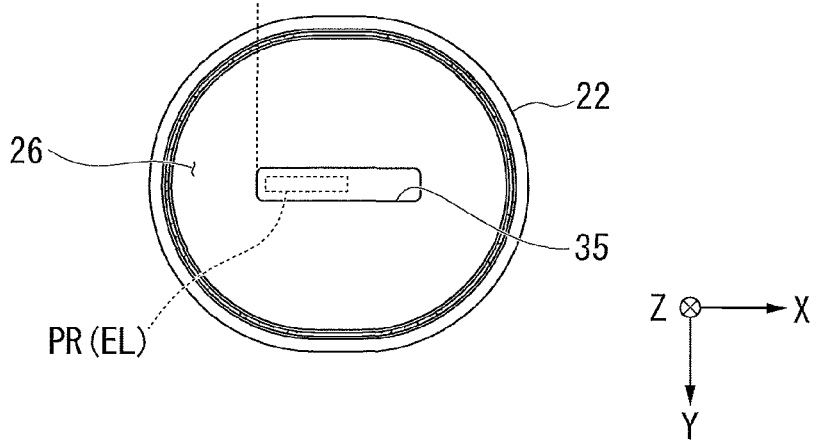

EXPOSURE APPARATUS, EXPOSING METHOD, DEVICE MANUFACTURING METHOD, PROGRAM, AND RECORDING MEDIUM

This application claims priority based on Japanese Patent Application No. 2012-227214, filed Oct. 12, 2012. In addition, this application is a non-provisional application based on U.S. Patent Provisional Application No. 61/716,821, filed Oct. 22, 2012. The contents of which are incorporated herein by reference.

TECHNICAL FIELD

The present invention relates to an exposure apparatus, an exposing method, a device manufacturing method, a program, and a recording medium.

BACKGROUND ART

For example, in an exposure apparatus which is used in a photolithographic process, as disclosed in Patent Document shown below, a liquid immersion exposure apparatus which exposes a substrate by exposure light via a liquid is known.

RELATED ART DOCUMENT

Patent Document

[Patent Document 1] U.S. Pat. No. 7,864,292

SUMMARY

Problems to be Solved by the Invention

In an exposure apparatus, if undesirable vibration occurs or a member moves to an undesirable position, exposure failure may occur. As a result, a defective device may be manufactured.

An object of an aspect of the present invention is to provide an exposure apparatus and an exposing method capable of suppressing occurrence of exposure failure. Moreover, an object of another aspect of the present invention is to provide a device manufacturing method, a program, and a recording medium capable of suppressing occurrence of a defective device.

Means for Solving the Problem

According to a first aspect of the present invention, there is provided an exposure apparatus that exposes a substrate by exposure light via liquid between an emitting surface of an optical member and the substrate, the exposure apparatus comprising: a liquid immersion member configured to form an immersion liquid space on a object and comprising a first member and a second member, the first member being disposed at at least a portion of surrounding of the optical member, the second member being disposed at at least a portion of surrounding of an optical path of the exposure light below of the first member, being movable with respect to the first member and comprising a second upper surface and a second lower surface, the second upper surface being opposite to a first lower surface of the first member via a gap, the second lower surface being capable of being opposite to the object, the object being movable below of the optical member; and a vibration isolator configured to suppress a vibration of the first member.

According to a second aspect of the present invention, there is provided an exposure apparatus that exposes a substrate by exposure light via liquid between an emitting surface of an optical member and the substrate, the exposure apparatus comprising: a liquid immersion member configured to form an immersion liquid space on a object and comprising a first member and a second member, the first member being disposed at at least a portion of surrounding of the optical member, the second member being disposed at at least a portion of surrounding of an optical path of the exposure light below of the first member, being movable with respect to the first member and comprising a second upper surface and a second lower surface, the second upper surface being opposite to a first lower surface of the first member via a gap, the second lower surface being capable of being opposite to the object, the object being movable below of the optical member; and a first driving apparatus configured to move the first member so that a displacement of the first member with respect to a reference member is suppressed.

According to a third aspect of the present invention, there is provided a device manufacturing method including: exposing the substrate by using the exposure apparatus according to the first or second aspect; and developing the exposed substrate.

According to a fourth aspect of the present invention, there is provided an exposing method in which a substrate is exposed by exposure light via liquid between an emitting surface of an optical member and the substrate, the exposing method including: forming a liquid immersion space of the liquid on the substrate by using a liquid immersion member that includes a first member and a second member, the first member being disposed at at least a portion of surrounding of the optical member, the second member being disposed at at least a portion of surrounding of an optical path of the exposure light below of the first member and comprising a second upper surface and a second lower surface, the second upper surface being opposite to a first lower surface of the first member via a gap, the second lower surface being capable of being opposite to the substrate, the substrate being movable below of the optical member; exposing the substrate via the liquid of the liquid immersion space by the exposure light emitted from the emitting surface; moving the second member with respect to the first member in at least a portion of exposure of the substrate; and suppressing vibration of the first member by using a vibration isolator.

According to a fifth aspect of the present invention, there is provided an exposing method in which a substrate is exposed by exposure light via liquid between an emitting surface of an optical member and the substrate, the exposing method including: forming a liquid immersion space of the liquid on the substrate by using a liquid immersion member that includes a first member and a second member, the first member being disposed at at least a portion of surrounding of the optical member, the second member being disposed at at least a portion of surrounding of an optical path of the exposure light below of the first member and comprising a second upper surface and a second lower surface, the second upper surface being opposite to a first lower surface of the first member via a gap, the second lower surface being capable of being opposite to the substrate, the substrate being movable below of the optical member; exposing the substrate via the liquid of the liquid immersion space by the exposure light emitted from the emitting surface; and moving the second member with respect to the first member in at least a portion of exposure of the substrate, and moving the first member by a first driving apparatus so that displacement of the first member with respect to the reference member is suppressed.

According to a sixth aspect of the present invention, there is provided a device manufacturing method including: exposing the substrate using the exposure method according to the fourth or fifth aspect; and developing the exposed substrate.

According to a seventh aspect of the present invention, there is provided a program which causes a computer to execute a control of an exposure apparatus exposing a substrate by exposure light via liquid between an emitting surface of an optical member and the substrate, the program performs: forming a liquid immersion space of the liquid on the substrate by using a liquid immersion member that includes a first member and a second member, the first member being disposed at at least a portion of surrounding of the optical member, the second member being disposed at at least a portion of surrounding of an optical path of the exposure light below of the first member and comprising a second upper surface and a second lower surface, the second upper surface being opposite to a first lower surface of the first member via a gap, the second lower surface being capable of being opposite to the substrate, the substrate being movable below of the optical member; exposing the substrate via the liquid of the liquid immersion space by the exposure light emitted from the emitting surface; moving the second member with respect to the first member in at least a portion of exposure of the substrate; and suppressing vibration of the first member by using a vibration isolator.

According to an eighth aspect of the present invention, there is provided a program which causes a computer to execute a control of an exposure apparatus exposing a substrate by exposure light via liquid between an emitting surface of an optical member and the substrate, the program performs: forming a liquid immersion space of the liquid on the substrate by using a liquid immersion member that includes a first member and a second member, the first member being disposed at at least a portion of surrounding of the optical member, the second member being disposed at at least a portion of surrounding of an optical path of the exposure light below of the first member and comprising a second upper surface and a second lower surface, the second upper surface being opposite to a first lower surface of the first member via a gap, the second lower surface being capable of being opposite to the substrate, the substrate being movable below of the optical member; exposing the substrate via the liquid of the liquid immersion space by the exposure light emitted from the emitting surface; and moving the second member with respect to the first member in at least a portion of exposure of the substrate, and moving the first member by a first driving apparatus so that displacement of the first member with respect to the reference member is suppressed.

According to a ninth aspect of the present invention, there is provided a computer-readable recording medium on which the program according to the seventh or eighth aspect is recorded.

Advantage of the Invention

According to the aspects of the present invention, occurrence of exposure failure can be suppressed. In addition, according to the aspects of the present invention, occurrence of a defective device can be suppressed.

BRIEF DESCRIPTION OF THE DRAWINGS

FIG. 5 is a view when the liquid immersion member according to the first embodiment is viewed from below.

FIG. 9 is a view for explaining an example of an operation of the liquid immersion member according to the first embodiment.

DESCRIPTION OF EMBODIMENTS

Hereinafter, embodiments of the present invention will be described with reference to the drawings. However, the present invention is not limited thereto. In the descriptions below, an XYZ rectangular coordinate system is set, and a positional relationship of each portion will be described referring to the XYZ rectangular coordinate system. A predetermined direction in a horizontal surface is set to an X axis direction, a direction orthogonal to the X axis direction in the horizontal surface is set to a Y axis direction, and a direction (that is, a vertical direction) orthogonal to each of the X axis direction and the Y axis direction is set to a Z axis direction. Moreover, the rotation (inclination) directions around the X axis, the Y axis, and the Z axis are set to the θX direction, the θY direction, and the θZ direction.

First Embodiment

Figure 1:
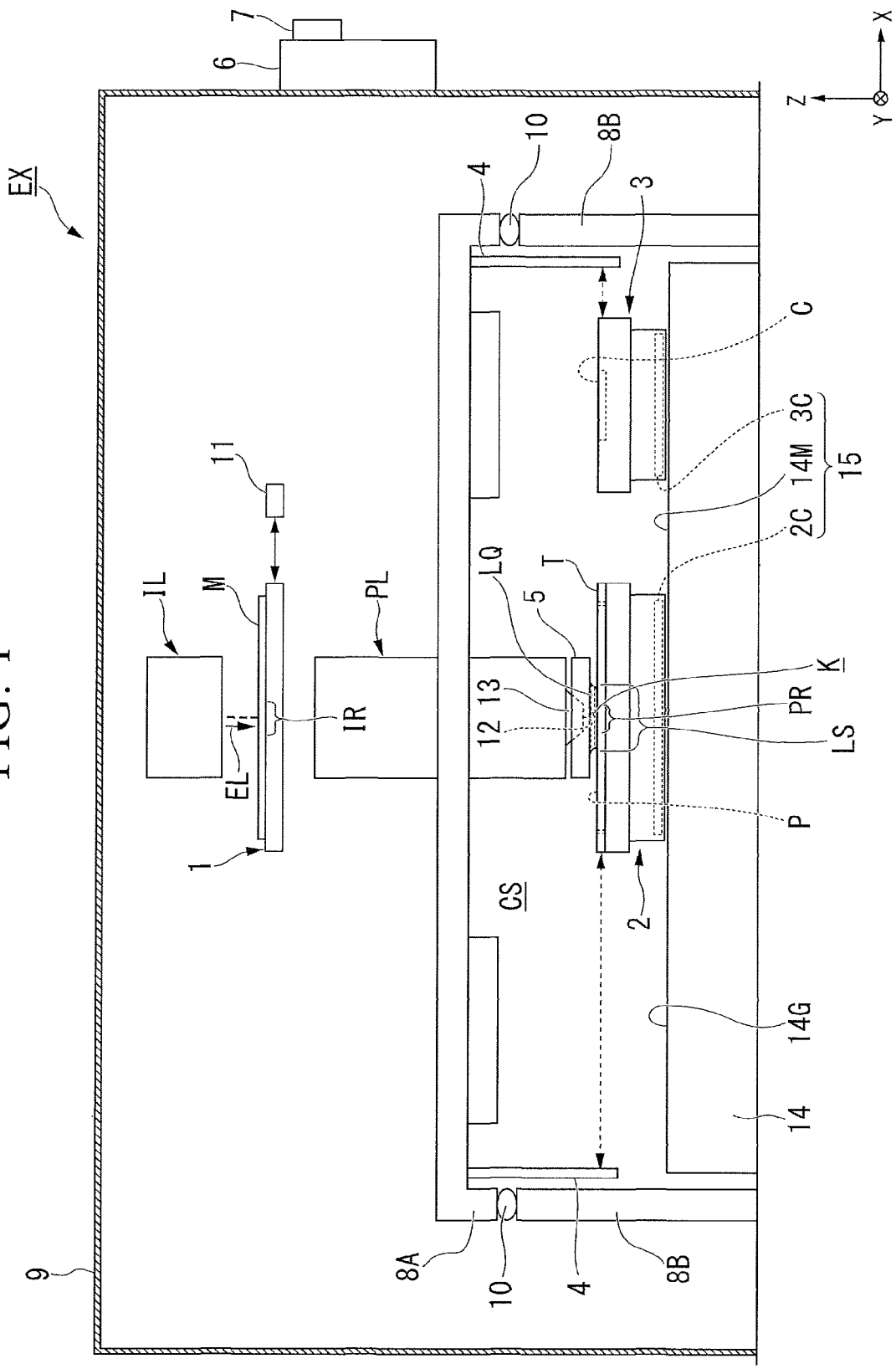
FIG. 1 is a view showing an example of an exposure apparatus according to a first embodiment.

A first embodiment will be described. FIG. 1 is a schematic configuration view showing an example of an exposure apparatus EX according to the first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path K of the exposure light EL which is radiated to the substrate P is filled with the liquid LQ. The liquid immersion space means a portion (space or region) which is filled with the liquid. The substrate P is exposed by the exposure light EL via the liquid LQ in the liquid immersion space LS. In the present embodiment, water (pure water) is used for the liquid LQ.

In addition, for example, the exposure apparatus EX of the present embodiment is an exposure apparatus which includes a substrate stage and a measurement stage as disclosed in U.S. Pat. No. 6,897,963, European Patent Application Publication No. 1713113, or the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS of a liquid LQ; a controller 6 which controls an operation of the entire exposure apparatus EX; and a storage apparatus 7 which is connected to the controller 6 and stores various information with respect to the exposure.

Moreover, the exposure apparatus EX includes a reference frame 8A which supports the projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, air mount). In addition, either one of a detection system which detects an alignment mark of the substrate P and a detection system which detects the position of the surface of an object such as the substrate P, or both detection systems may be supported by the reference frame 8A.

In addition, the exposure apparatus EX includes a chamber apparatus 9 which adjusts an environment (at least one of temperature, humidity, pressure, and a degree of cleanness) of a space CS to which the exposure light EL advances. At least the projection optical system PL, the liquid immersion member 5, the substrate stage 2, and the measurement stage 3 are disposed in the space CS. In the present embodiment, at least a portion of the mask stage 1 and the illumination system IL is also disposed in the space CS.

The mask M includes a reticle on which a device pattern projected to the substrate P is formed. For example, the mask M includes a transmission type mask which includes a transparent plate such as a glass plate, and a pattern formed on the transparent plate using a light-shielding material such as chromium. Moreover, a reflection type mask may be used for the mask M.

The substrate P is a substrate for manufacturing a device. For example, the substrate P includes a base material such as a semiconductor wafer and a photosensitive film which is formed on the base material. The photosensitive film is a film of a photosensitive material (photoresist). Moreover, the substrate P may include another film in addition to the photosensitive film. For example, the substrate P may include an antireflection film and a protective film (top coat film) which protects the photosensitive film.

The illumination system IL radiates the exposure light EL to an illumination region IR. The illumination region IR includes positions which can be radiated with the exposure light EL emitted from the illumination system IL. The illumination system IL illuminates at least a portion of the mask M disposed in the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is an ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is able to move in six directions of the X axis, the Y axis, the Z axis, the θX, the θY, and the θZ by the operation of the driving system 11. Moreover, the driving system 11 may not include a planar motor. For example, the driving system 11 may include a linear motor.

The projection optical system PL radiates the exposure light EL to a projection region PR. The projection region PR includes positions which can be irradiated with the exposure light EL emitted from the projection optical system PL. The projection optical system PL projects the image of the pattern of the mask M on at least a portion of the substrate P disposed in the projection region PR by a predetermined projection magnification. In the present embodiment, the projection optical system PL is a reduction system. The projection magnification of the projection optical system PL is ¼. In addition, the projection magnification of the projection optical system PL may be ⅕, ⅛, or the like. Moreover, the projection optical system PL may be either an equal magnification system or an enlargement system. In the present embodiment, the optical axis of the projection optical system PL is parallel to the Z axis. The projection optical system PL may be any of a refraction system which does not include a reflective optical element, a reflection system which does not include a refractive optical element, or a reflective refraction system which includes the reflective optical element and the refractive optical element. The projection optical system PL may form either an inverted image or an erected image.

The projection optical system PL includes a terminal optical element 13 which includes an emitting surface 12 from which the exposure light EL is emitted. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be irradiated with the exposure light EL emitted from the emitting surface 12. In the present embodiment, the emitting surface 12 faces the −Z direction. The exposure light EL emitted from the emitting surface 12 advances in the −Z direction. The emitting surface 12 is parallel to the XY plane. Moreover, the emitting surface 12 facing the −Z direction may have a convex surface or a concave surface. In addition, the emitting surface 12 may be inclined with respect to the XY plane and include a curved surface. In the present embodiment, the optical axis of the terminal optical element 13 is parallel to the Z axis.

With respect to the direction parallel to the optical axis of the terminal optical element 13, the emitting surface 12 side is at the −Z side, and the incident surface side is at the +Z side. With respect to the direction parallel to the optical axis of the projection optical system PL, the image surface side of the projection optical system PL is at the −Z side, and the object surface side of the projection optical system PL is at the +Z side.

The substrate stage 2 is able to move in the XY plane, which includes positions (projection region PR) which can be irradiated with the exposure light EL from the emitting surface 12, in a state where the substrate stage holds the substrate P. The measurement stage 3 is able to move in the XY plane, which includes positions (projection region PR) which can be irradiated with the exposure light EL from the emitting surface 12, in a state where a measurement member (measurement instrument) C is mounted on the measurement stage. Each of the substrate stage 2 and the measurement stage 3 is able to move on a guide surface 14G of a base member 14. The guide surface 14G and the XY plane are substantially parallel to each other.

The substrate stage 2 includes a first holding portion which releasably holds the substrate P and a second holding portion which is disposed at the surrounding of the first holding portion and releasably holds a cover member T as disclosed in, for example, United States Patent Application Publication No. 2007/0177125, United States Patent Application Publication No. 2008/0049209, and the like. The first holding portion holds the substrate P so that the surface (upper surface) of the substrate P and the XY plane are substantially parallel to each other. The upper surface of the substrate P held by the first holding portion and the upper surface of the cover member T held by the second holding portion are disposed in a substantially same plane.

With respect to the Z axis direction, a distance between the emitting surface 12 and the upper surface of the substrate P held by the first holding portion is substantially the same as a distance between the emitting surface 12 and the upper surface of the cover member T held by the second holding portion. Moreover, with respect to the Z axis direction, a situation in which the distance between the emitting surface 12 and the upper surface of the substrate P is substantially the same as the distance between the emitting surface 12 and the upper surface of the cover member T includes a situation in which the difference between the distance between the emitting surface 12 and the upper surface of the substrate P and the distance between the emitting surface 12 and the upper surface of the cover member T is within, for example, 10% of the distance (a so-called working distance) between the emitting surface 12 and the upper surface of the substrate P when the substrate P is exposed. In addition, the upper surface of the substrate P held by the first holding portion and the upper surface of the cover member T held by the second holding portion may not be disposed in the same plane. For example, with respect to the Z axis direction, the position of the upper surface of the substrate P and the position of the upper surface of the cover member T may be different from each other. For example, there may be a step between the upper surface of the substrate P and the upper surface of the cover member T. In addition, the upper surface of the cover member T may be inclined with respect to the upper surface of the substrate P, and the upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is able to move on a guide surface 14G in six directions of the X axis, the Y axis, the Z axis, the θX, the θY, and the θZ directions by the operation of the driving system 15. Moreover, the driving system 15 may not include a planar motor. The driving system 15 may include a linear motor.

The measurement system 4 includes an interferometer system. The interferometer system includes a unit which radiates measurement light to a measurement mirror of the substrate stage 2 and a measurement mirror of the measurement stage 3 and measures the positions of the substrate stage 2 and the measurement stage 3. In addition, for example, the measurement system may include an encoder system as disclosed in United States Patent Application Publication No. 2007/0288121. In addition, the measurement system 4 may include only one of the interferometer system and the encoder system.

When exposure processing of the substrate P is performed, or when predetermined measurement processing is performed, the controller 6 performs a position control of the substrate stage 2 (substrate P) and the measurement stage 3 (measurement member C) based on the measurement results of the measurement system 4.

Figure 2:
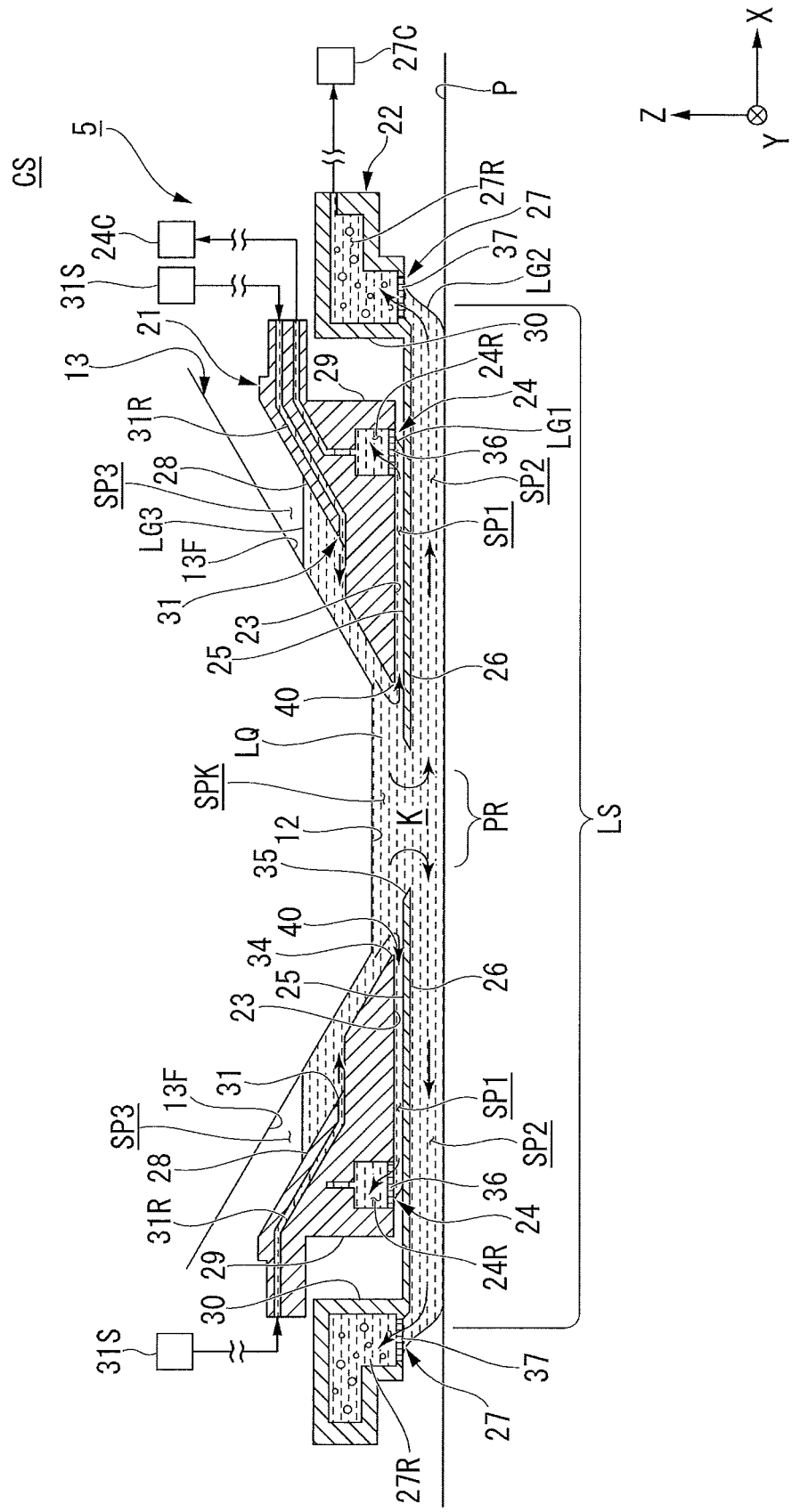
FIG. 2 is a side cross-sectional view showing an example of a liquid immersion member according to the first embodiment.
Figure 3:
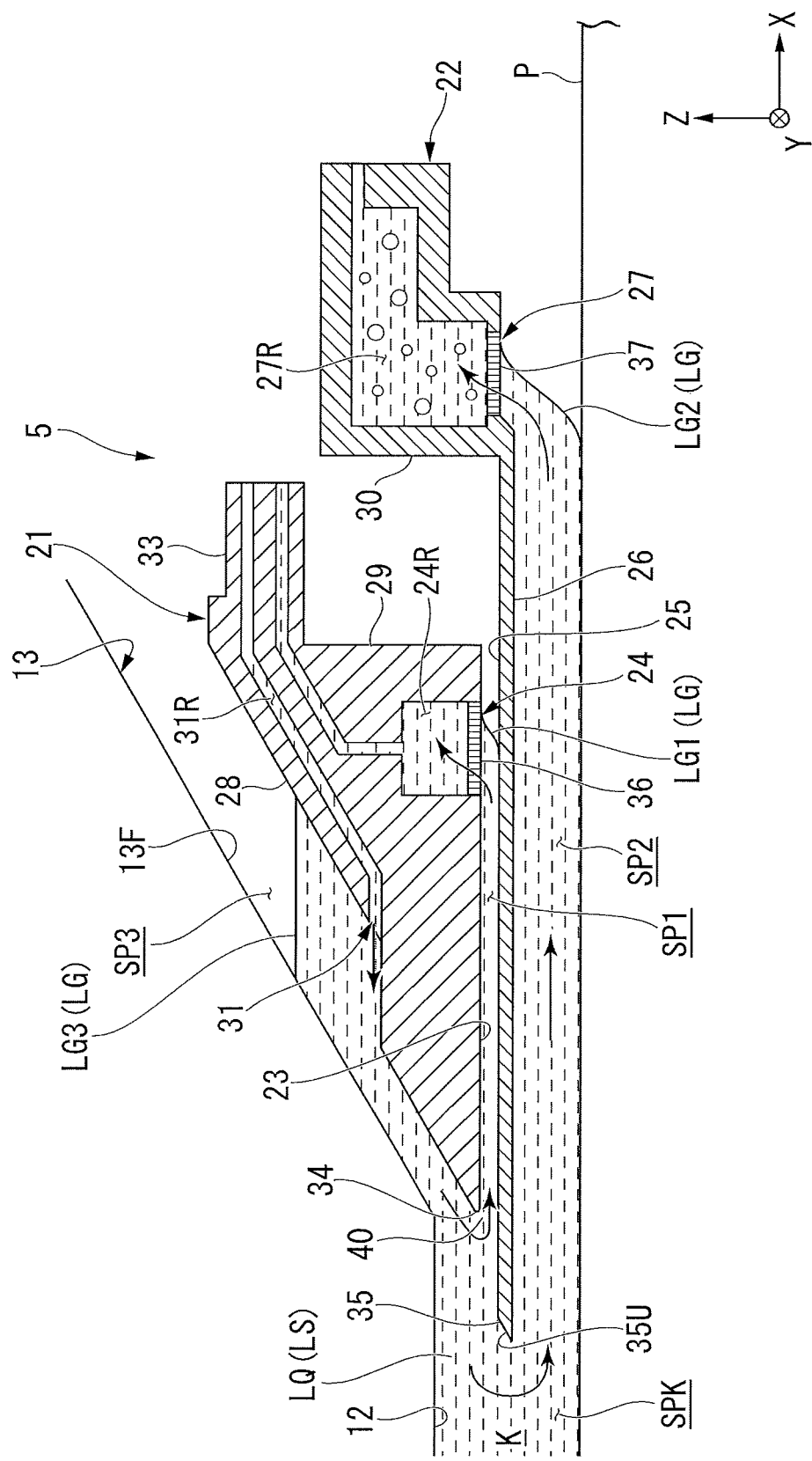
FIG. 3 is a side cross-sectional view showing a portion of the liquid immersion member according to the first embodiment.
Figure 4:
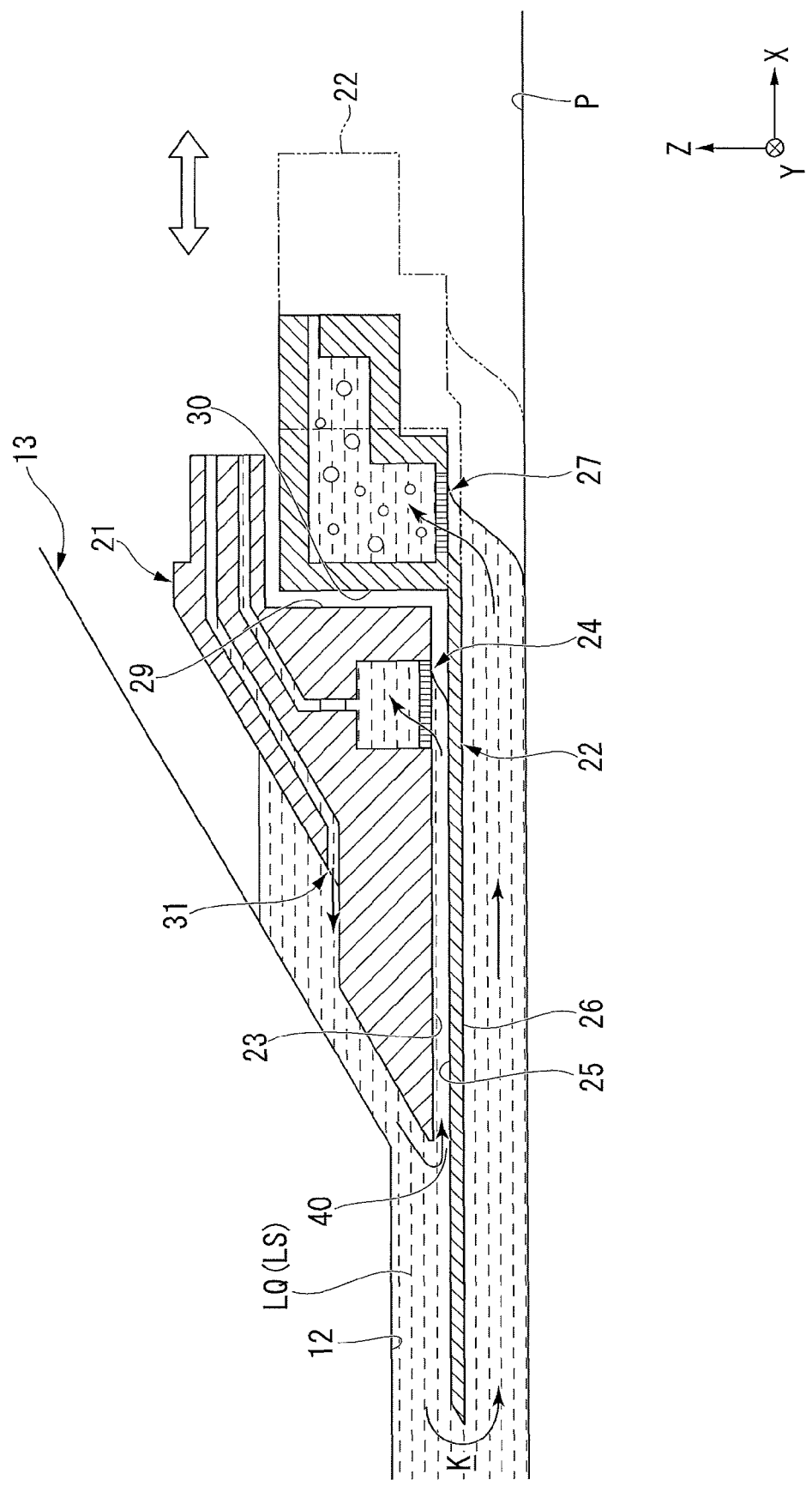
FIG. 4 is a view showing an example of an operation of the liquid immersion member according to the first embodiment.
Figure 6:
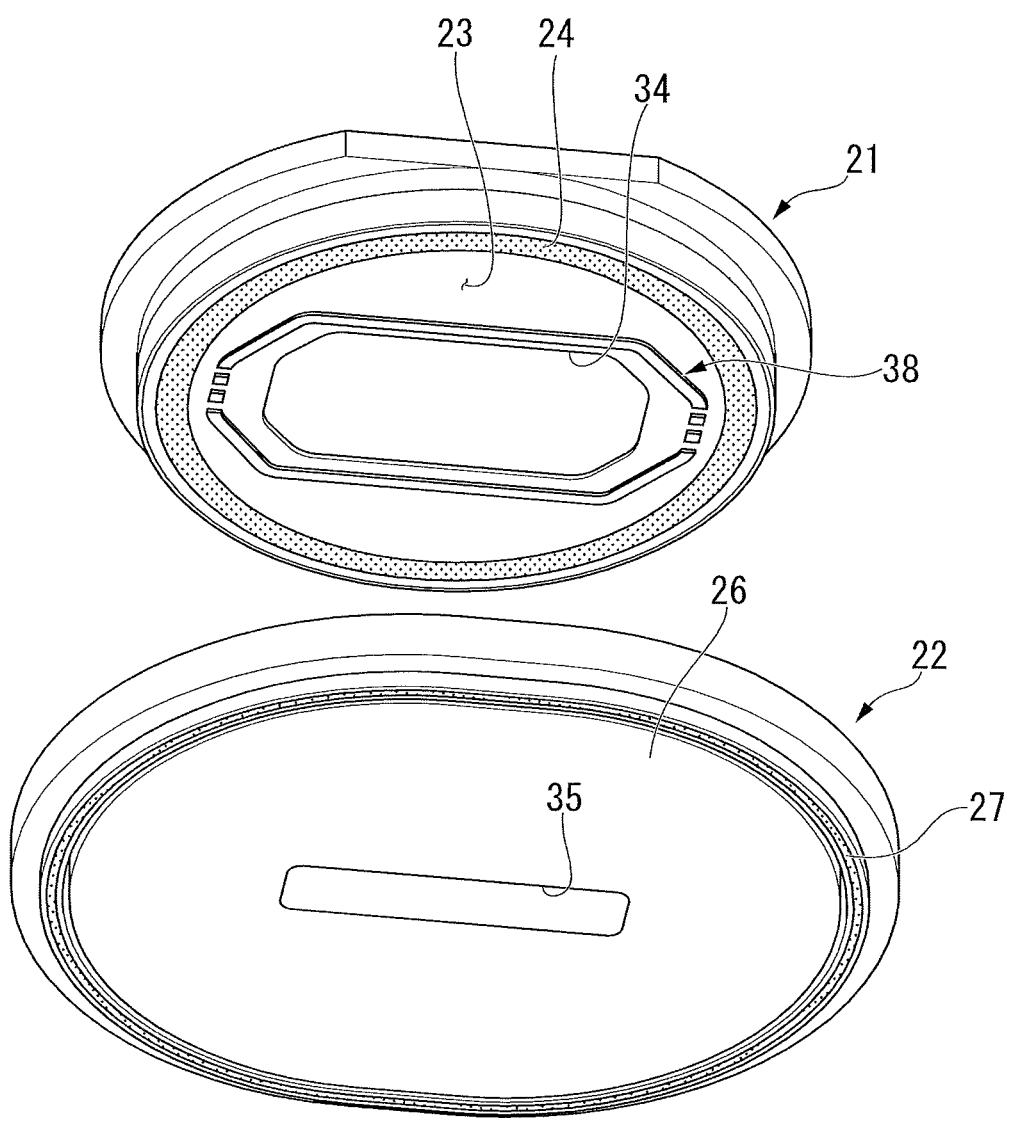
FIG. 6 is an exploded perspective view showing an example of the liquid immersion member according to the first embodiment.
Figure 7:
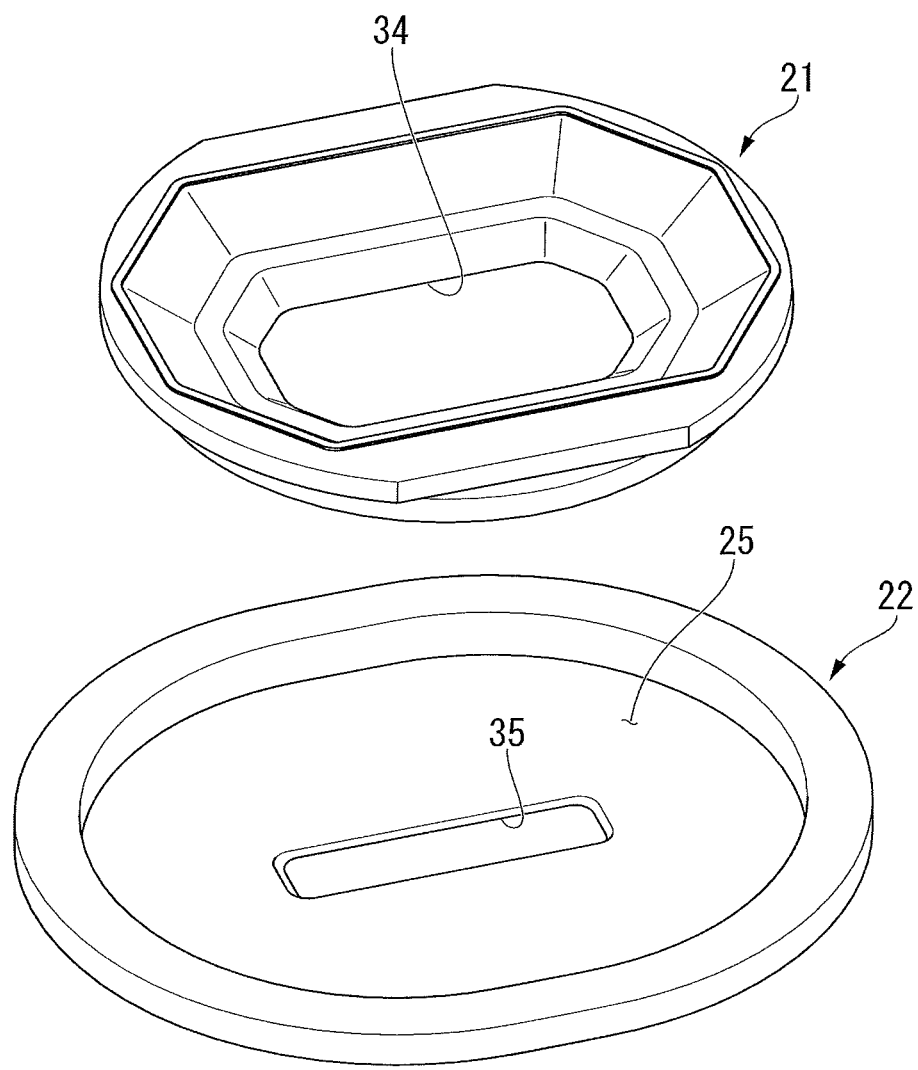
FIG. 7 is an exploded perspective view showing an example of the liquid immersion member according to the first embodiment.

Next, the liquid immersion member 5 according to the present embodiment will be described. In addition, the liquid immersion member may also be referred to as a nozzle member. FIG. 2 is a cross-sectional view of the liquid immersion member 5 parallel to the XZ plane. FIG. 3 is a view in which a portion of FIG. 2 is enlarged. FIG. 4 is a view showing an example of the operation of the liquid immersion member 5. FIG. 5 is a view when the liquid immersion member 5 is viewed from below (−Z side). FIGS. 6 and 7 are exploded perspective views of the liquid immersion member 5.

The liquid immersion member 5 forms a liquid immersion space LS of the liquid LQ above the object which is movable below the terminal optical element 13.

The object which is movable below the terminal optical element 13 is able to move in the XY plane which includes the position opposite to the emitting surface 12. The object is able to be opposite to the emitting surface 12 and be disposed in the projection region PR. The object is able to move below the liquid immersion member 5 and is able to be opposite to the liquid immersion member 5. In the present embodiment, the object includes at least one of at least a portion of the substrate stage 2 (for example, the cover member T of the substrate stage 2), the substrate P which is held by the substrate stage 2 (first holding portion), and the measurement stage 3. In the exposure of the substrate P, the liquid immersion space LS is formed so that the optical path K of the exposure light EL between the emitting surface 12 of the terminal optical element 13 and the substrate P is filled with the liquid LQ. When the exposure light EL is radiated to the substrate P, the liquid immersion space LS is formed so that only a portion of the surface region of the substrate P which includes the projection region PR is covered by the liquid LQ.

In the descriptions below, the object is the substrate P. Moreover, as described above, the object may be at least one of the substrate stage 2 and the measurement stage 3, and the object may be other than the substrate P, the substrate stage 2, and the measurement stage 3.

There is a case in which the liquid immersion space LS may be formed over two objects. For example, there is a case in which the liquid immersion space LS may be formed over the cover member T of the substrate stage 2 and the substrate P. There is a case in which the liquid immersion space LS may be formed over the substrate stage 2 and the measurement stage 3.

The liquid immersion space LS is formed so that the optical path K of the exposure light EL emitted from the emitting surface 12 of the terminal optical element 13 is filled with the liquid LQ. At least a portion of the liquid immersion space LS is formed in a space between the terminal optical element 13 and the substrate P (object). At least a portion of the liquid immersion space LS is formed in a space between the liquid immersion member 5 and the substrate P (object).

The liquid immersion member 5 includes a first member 21 which is disposed at at least a portion of the surrounding of the terminal optical element 13, and a second member 22 which is disposed at at least a portion of the surrounding of the optical path K below the first member 21. The second member 22 is movable with respect to the first member 21.

The first member 21 is disposed at a position further away from the substrate P (object) than the second member 22. At least a portion of the second member 22 is disposed between the first member 21 and the substrate P (object). At least a portion of the second member 22 is disposed between the terminal optical element 13 and the substrate P (object). In addition, the second member 22 may not be disposed between the terminal optical element 13 and the substrate P (object).

The first member 21 includes a lower surface 23 facing the −Z direction and a fluid recovery part 24 which is disposed at at least a portion of the surrounding of the lower surface 23. The second member 22 includes an upper surface 25 facing the +Z direction, a lower surface 26 facing the −Z direction, and a fluid recovery part 27 which is disposed at at least a portion of the surrounding of the lower surface 26. The fluid recovery part 24 recovers at least a portion of the liquid LQ of the liquid immersion space LS. The fluid recovery part 27 recovers at least a portion of the liquid LQ of the liquid immersion space LS.

The first member 21 includes an inner surface 28 which is opposite to a side surface 13F of the terminal optical element 13, and an outer surface 29 toward the outside with respect to the optical path K (optical axis of the terminal optical element 13). The second member 22 includes an inner surface 30 which is opposite to the outer surface 29 via a gap.

The inner surface 28 of the first member 21 is opposite to the side surface 13F of the terminal optical element 13 via a gap.

The second member 22 is able to be opposite to the lower surface 23. The second member 22 is able to be opposite to the fluid recovery part 24. At least a portion of the upper surface 25 of the second member 22 is opposite to the lower surface 23 via a gap. At least a portion of the upper surface 25 is opposite to the emitting surface 12 via a gap. Moreover, the upper surface 25 may not be opposite to the emitting surface 12.

The substrate P (object) is able to be opposite to the lower surface 26. The substrate P (object) is able to be opposite to at least a portion of the fluid recovery part 27. At least a portion of the upper surface of the substrate P is opposite to the lower surface 26 via a gap. At least a portion of the upper surface of the substrate P is opposite to the emitting surface 12 via a gap.

In the Z axis direction, a size of the gap between the upper surface of the substrate P (object) and the emitting surface 12 is larger than a size of the gap between the upper surface of the substrate P and the lower surface 26. Moreover, the size of the gap between the upper surface of the substrate P (object) and the emitting surface 12 may be substantially the same as the size of the gap between the upper surface of the substrate P and the lower surface 26. In addition, the size of the gap between the upper surface of the substrate P (object) and the emitting surface 12 may be smaller than a size of the gap between the upper surface of the substrate P and the lower surface 26.

A first space SP1 is formed between the lower surface 23 and the upper surface 25. A second space SP2 is formed between the lower surface 26 and the upper surface of the substrate P (object). A third space SP3 is formed between the side surface 13F and the inner surface 28.

The upper surface 25 has liquid repellent property against the liquid LQ. In the present embodiment, the upper surface 25 includes a surface of a resin film which includes fluorine. The upper surface 25 include a surface of a PFA (Tetra fluoro ethylene-perfluoro alkylvinyl ether copolymer) film. Moreover, the upper surface 25 may include a surface of PTFE (Poly tetra fluoro ethylene) film. A contact angle of the upper surface 25 with respect to the liquid LQ is larger than 90°. In addition, for example, the contact angle of the upper surface 25 with respect to the liquid LQ may be larger than 100°, may be larger than 110°, and may be larger than 120°.

Since the upper surface 25 has liquid repellent property with respect to the liquid LQ, occurrence of a gas portion in the liquid LQ in the first space SP1 or mixing of bubbles into the liquid LQ is suppressed.

Moreover, the contact angle of the upper surface 25 with respect to the liquid LQ may be larger than the contact angle of the upper surface of the substrate P with respect to the liquid LQ. In addition, the contact angle of the upper surface 25 with respect to the liquid LQ may be smaller than the contact angle of the upper surface of the substrate P with respect to the liquid LQ. Moreover, the contact angle of the upper surface 25 with respect to the liquid LQ may be substantially equal to the contact angle of the upper surface of the substrate P with respect to the liquid LQ.

In addition, the upper surface 25 may have a hydrophilic property with respect to the liquid LQ. The contact angle of the upper surface 25 with respect to the liquid LQ may be smaller than 90°, may be smaller than 80°, and may be smaller than 70°. Accordingly, the liquid LQ smoothly flows in the first space SP1.

Moreover, the lower surface 23 may have liquid repellent property with respect to liquid LQ. For example, both of the lower surface 23 and the upper surface 25 may have liquid repellent property with respect to liquid LQ. The contact angle of the lower surface 23 with respect to the liquid LQ may be larger than 90°, may be larger than 100°, may be larger than 110°, and may be larger than 120°.

In addition, the lower surface 23 may have liquid repellent property with respect to the liquid LQ, and the upper surface 25 may have hydrophilic property with respect to the liquid LQ. The contact angle of the lower surface 23 with respect to the liquid LQ may be larger than the contact angle of the upper surface 25 with respect to the liquid LQ.

Moreover, the lower surface 23 may have hydrophilic property with respect to the liquid LQ. For example, both of the lower surface 23 and the upper surface 25 may have hydrophilic property with respect to liquid LQ. The contact angle of the lower surface 23 with respect to the liquid LQ may be smaller than 90°, may be smaller than 80°, and may be smaller than 70°.

In addition, the lower surface 23 may have hydrophilic property with respect to the liquid LQ, and the upper surface 25 may have liquid repellent property with respect to the liquid LQ. The contact angle of the lower surface 23 with respect to the liquid LQ may be smaller than the contact of the upper surface 25 with respect to the liquid LQ.

In the present embodiment, the lower surface 26 has hydrophilic property with respect to the liquid LQ. The contact angle of the lower surface 26 with respect to the liquid LQ may be smaller than 90°, may be smaller than 80°, and may be smaller than 70°. In the present embodiment, the contact angle of the lower surface 26 with respect to the liquid LQ is smaller than the contact angle of the upper surface of the substrate P with respect to the liquid LQ. Moreover, the contact angle of the lower surface 26 with respect to the liquid LQ may be larger than or be substantially equal to the contact angle of the upper surface of the substrate P with respect to the liquid LQ.

The side surface 13F of the terminal optical element 13 is disposed at the surrounding of the emitting surface 12. The side surface 13F is a non-emitting surface from which the exposure light EL is not emitted. The exposure light EL passes through the emitting surface 12 and does not pass through the side surface 13F.

The lower surface 23 of the first member 21 does not recover the liquid LQ. The lower surface 23 is a non-recovery part and is not able to recover the liquid LQ. The lower surface 23 of the first member 21 is able to hold the liquid LQ between the lower surface and the second member 22.

The upper surface 25 of the second member 22 does not recover the liquid LQ. The upper surface 25 is a non-recovery part and is not able to recover the liquid LQ. The upper surface 25 of the second member 22 is able to hold the liquid LQ between the upper surface 25 and the first member 21.

The lower surface 26 of the second member 22 does not recover the liquid LQ. The lower surface 26 is a non-recovery part and is not able to recover the liquid LQ. The lower surface 26 of the second member 22 is able to hold the liquid LQ between the substrate P (object) and the lower surface 26.

The inner surface 28, the outer surface 29, and the inner surface 30 do not recover the liquid LQ. The inner surface 28, the outer surface 29, and the inner surface 30 are non-recovery parts and they are not able to recover the liquid LQ.

In the present embodiment, the lower surface 23 is substantially parallel to the XY plane. The upper surface 25 is also substantially parallel to the XY plane. The lower surface 26 is also substantially parallel to the XY plane. That is, the lower surface 23 and the upper surface 25 are substantially parallel to each other. The upper surface 25 and the lower surface 26 are substantially parallel to each other.

Moreover, the lower surface 23 may not be parallel to the XY plane. The lower surface 23 may be inclined with respect to the XY plane and may include a curved surface.

In addition, the upper surface 25 may not be parallel to the XY plane. The upper surface 25 may be inclined with respect to the XY plane and may include a curved surface.

Moreover, the lower surface 26 may not be parallel to the XY plane. The lower surface 26 may be inclined with respect to the XY plane and may include a curved surface.

In addition, the lower surface 23 and the upper surface 25 may be parallel to each other and may not be parallel to each other. The upper surface 25 and the lower surface 26 may be parallel to each other or may not be parallel to each other. The lower surface 23 and the lower surface 26 may be parallel to each other and may not be parallel to each other.

The first member 21 includes an opening 34 through which the exposure light EL emitted from the emitting surface 12 is able to pass. The second member 22 includes an opening 35 through which the exposure light EL emitted from the emitting surface 12 is able to pass. At least a portion of the terminal optical element 13 is disposed at the inner side of the opening 34. The lower surface 23 is arranged at the surrounding of the lower end of the opening 34. The upper surface 25 is arranged at the surrounding of the upper end of the opening 35. The lower surface 26 is arranged at the surrounding of the lower end of the opening 35.

In the present embodiment, at least a portion of an inner surface 35U of the second member 22, which defines the opening 35 facing the optical path K, is inclined upwardly and outwardly in a radial direction from the optical path K. Accordingly, the second member 22 is able to smoothly move in a state where the inner surface 35U of the second member 22 is disposed in the liquid immersion space LS. Moreover, even when the second member 22 moves in a state where the inner surface 35U of the second member 22 is disposed in the liquid immersion space LS, a change in a pressure of the liquid LQ in the liquid immersion space LS is suppressed.

The size of the opening 34 in the XY plane is larger than the size of the opening 35. With respect to the X axis direction, the size of the opening 34 is larger than the size of the opening 35. With respect to the Y axis direction, the size of the opening 34 is larger than the size of the opening 35. In the present embodiment, the first member 21 is not disposed immediately below the emitting surface 12. The opening 34 of the first member 21 is disposed at the surrounding of the emitting surface 12. The opening 34 is larger than the emitting surface 12. The lower end of the gap which is formed between the side surface 13F of the terminal optical element 13 and the first member 21 faces the upper surface 25 of the second member 22. Moreover, the opening 35 of the second member 22 is disposed to be opposite to the emitting surface 12. In the present embodiment, the shape of the opening 35 in the XY plane is a rectangular shape. The opening 35 is long in the X axis direction. Moreover, the shape of the opening 35 may be an elliptical shape which is long in the X axis direction and may be a polygonal shape which is long in the X axis direction.

In addition, the size of the opening 34 may be smaller than the size of the opening 35. Moreover, the size of the opening 34 may be substantially the same as the size of the opening 35.

The first member 21 is disposed at the surrounding of the terminal optical element 13. The first member 21 is an annular member. The first member 21 is disposed so as not to contact the terminal optical element 13. A gap is formed between the first member 21 and the terminal optical element 13. The first member 21 is not opposite to the emitting surface 12. Moreover, a portion of the first member 21 may not be opposite to the emitting surface 12. That is, a portion of the first member 21 may be disposed between the emitting surface 12 and the upper surface of the substrate P (object). In addition, the first member 21 may not be annular. For example, the first member 21 may be disposed at a portion of the surrounding of the terminal optical element 13 (optical path K). For example, a plurality of first members 21 may be disposed at the surrounding of the terminal optical element 13 (optical path K).

The second member 22 is disposed at a surrounding of the optical path K. The second member 22 is an annular member. The second member 22 is disposed so as not to contact the first member 21. A gap is formed between the second member 22 and the first member 21.

The second member 22 is able to relatively move with respect to the first member 21. The second member 22 is able to relatively move with respect to the terminal optical element 13. The relative position between the second member 22 and the first member 21 is changed. The relative position between the second member 22 and the terminal optical element 13 is changed.

The second member 22 is able to relatively move in the XY plane perpendicular to the optical axis of the terminal optical element 13. The second member 22 is able to move to be substantially parallel to the XY plane. As shown in FIG. 4, in the present embodiment, the second member 22 is able to move in at least the X axis direction. Moreover, the second member 22 is able to move in at least one direction of the Y axis, the Z axis, the θX, the θY, and the θZ directions, in addition to the X axis direction.

In the present embodiment, the terminal optical element 13 does not substantially move. The first member 21 also does not substantially move.

The second member 22 is able to move below at least a portion of the first member 21. The second member 22 is able to move between the first member 21 and the substrate P (object).

The second member 22 moves in the XY plane, and thus, the size of the gap between the outer surface 29 of the first member 21 and the inner surface 30 of the second member 22 is changed. In other words, the second member 22 moves in the XY plane, and thus, the size of the space between the outer surface 29 and the inner surface 30 is changed. For example, in the example shown in FIG. 4, the second member 22 moves in the −X direction, and thus, the size of the gap between the outer surface 29 and the inner surface 30 is decreased (the space between the outer surface 29 and the inner surface 30 is decreased) in the +X side with respect to the terminal optical element 13. The second member 22 moves in the +X direction, and thus, the size of the gap between the outer surface 29 and the inner surface 30 is increased (the space between the outer surface 29 and the inner surface 30 is increased) in the +X side with respect to the terminal optical element 13.

In the present embodiment, a movable range of the second member 22 is determined so that the first member 21 (outer surface 29) and the second member 22 (inner surface 30) do not contact each other.

The second member 22 may move in at least a part of a period in which the exposure light EL is emitted from the emitting surface 12. The second member 22 may move in at least a part of a period in which the exposure light EL is emitted from the emitting surface 12 in a state where the liquid immersion space LS is formed.

The second member 22 may move in parallel with at least a part of a period in which the substrate P (object) moves. The second member 22 may move in parallel with at least a part of a period in which the substrate P (object) moves in the state where the liquid immersion space LS is formed.

The second member 22 may move in the movement direction of the substrate P (object). For example, the second member 22 may be moved in the movement direction of the substrate P in at least a part of a period in which the substrate P is moved. For example, when the substrate P moves in one direction (for example, +X direction) in the XY plane, the second member 22 may move in one direction (the +X direction) in the XY plane in synchronization with the movement of the substrate P.

The liquid immersion member 5 includes a liquid supply part 31 which supplies the liquid LQ to form the liquid immersion space LS. The liquid supply part 31 is disposed at the first member 21.

Moreover, the liquid supply part 31 may be disposed at both of the first member 21 and the second member 22.

In addition, the liquid supply part 31 may be disposed at the first member 21 and not be disposed at the second member 22. In addition, the liquid supply part 31 may be disposed at the second member 22 and not be disposed at the first member 21. Moreover, the liquid supply part 31 may be disposed at members other than the first member 21 and the second member 22.

The liquid supply part 31 is disposed inside the fluid recovery part 24 and the fluid recovery part 27 in the radial direction from the optical path K (the optical axis of the terminal optical element 13). In the present embodiment, the liquid supply part 31 includes an opening (liquid supply port) which is disposed at the inner surface 28 of the first member 21. The liquid supply part 31 is disposed to be opposite to the side surface 13F. The liquid supply part 31 supplies the liquid LQ to the third space SP3 between the side surface 13F and the inner surface 28. In the present embodiment, the liquid supply part 31 is disposed at each of the +X side and the −X side with respect to the optical path K (terminal optical element 13).

Moreover, the liquid supply part 31 may be disposed at the Y axis direction with respect to the optical path K (terminal optical element 13), and the plurality of liquid supply parts may be disposed at the surrounding of the optical path K (terminal optical element 13) which includes the X axis direction and the Y axis direction. One liquid supply part 31 may be provided. In addition, instead of the liquid supply part 31 or in addition to the liquid supply part 31, a liquid supply part which is able to supply the liquid LQ may be provided at the lower surface 23.

In the present embodiment, the liquid supply part (liquid supply port) 31 is connected to a liquid supply apparatus 31S via a supply channel 31R which is formed in the inner portion of the first member 21. The liquid supply apparatus 31S is able to supply the cleaned liquid LQ, in which the temperature is adjusted, to the liquid supply part 31. In order to form the liquid immersion space LS, the liquid supply part 31 supplies the liquid LQ from the liquid supply apparatus 31S.

An opening 40 is formed between the inner edge of the lower surface 23 and the upper surface 25. An optical path space SPK which includes the optical path K between the emitting surface 12 and the substrate P (object) and the first space SP1 between the lower surface 23 and the upper surface 25 are connected to each other via the opening 40. The optical path space SPK includes the space between the emitting surface 12 and the substrate P (object) and the space between the emitting surface 12 and the upper surface 25. The opening 40 is disposed so as to face the optical path K. The third space SP3 between the side surface 13F and the inner surface 28 and the first space SP1 are connected to each other via the opening 40.

At least a portion of the liquid LQ from the liquid supply part 31 is supplied to the first space SP1 between the lower surface 23 and the upper surface 25 via the opening 40. At least a portion of the liquid LQ, which is supplied from the liquid supply part 31 to form the liquid immersion space LS, is supplied to the substrate P (object) opposite to the emitting surface 12 via the opening 34 and the opening 35. Accordingly, the optical path K is filled with the liquid LQ. At least a portion of the liquid LQ from the liquid supply part 31 is supplied to the second space SP2 between the lower surface 26 and the upper surface of the substrate P (object).

With respect to the Z axis direction, the size of the first space SP1 is smaller than the size of the second space SP2. In addition, with respect to the Z axis direction, the size of the first space SP1 may be substantially the same as the size of the second space SP2 and may be larger than the size of the second space SP2.

The fluid recovery part 24 is disposed outside the lower surface 23 with respect to the optical path K (with respect to an optical axis of the terminal optical element 13). The fluid recovery part 24 is disposed at surrounding of the lower surface 23. The fluid recovery part 24 is disposed at surrounding of the optical path K of the exposure light EL. Moreover, the fluid recovery part 24 may be disposed at a portion of surrounding of the lower surface 23. For example, a plurality of the fluid recovery parts 24 may be disposed at surrounding of the lower surface 23. The fluid recovery part 24 is disposed to face the first space SP1. The fluid recovery part 24 recovers at least a portion of the liquid LQ in the first space SP1.

A fluid recovery part 27 is disposed outside the lower surface 26 with respect to the optical path K (with respect to an optical axis of the terminal optical element 13). The fluid recovery part 27 is disposed at surrounding of the lower surface 26. The fluid recovery part 27 is disposed at surrounding of the optical path K of the exposure light EL. Moreover, the fluid recovery part 27 may be disposed at a portion of surrounding of the lower surface 26. For example, a plurality of the fluid recovery parts 27 may be disposed at surrounding of the lower surface 26. The fluid recovery part 27 is disposed so as to oppose the second space SP2. The fluid recovery part 27 recovers at least a portion of the liquid LQ in the second space SP2.

The fluid recovery part 27 is disposed outside the first member 21 with respect to the optical path K (the optical axis of the terminal optical element 13). The fluid recovery part 27 is disposed outside the first space SP1 with respect to the optical path K (the optical axis of the terminal optical element 13).

In the present embodiment, movement of the liquid LQ from one of the first space SP1 at the upper surface 25 side and the second space SP2 at the lower surface 26 side to the other is suppressed. The first space SP1 and the second space SP2 are partitioned by the second member 22. The liquid LQ in the first space SP1 is able to move to the second space SP2 via the opening 35. The liquid LQ in the first space SP1 is able to move to the second space SP2 only through the opening 35. The liquid LQ, which is present in the first space SP1 further outside than the opening 35 from the optical path K, is not able to move to the second space SP2. The liquid LQ in the second space SP2 is able to move to the first space SP1 via the opening 35. The liquid LQ in the second space SP2 is able to move to the first space SP1 only through the opening 35. The liquid LQ, which is present in the second space SP2 further outside than the opening 35 from the optical path K, is not able to move to the first space SP1. That is, in the present embodiment, the liquid immersion member 5 does not have a channel which fluidly connects the first space SP1 and the second space SP2, other than the opening 35.

In the present embodiment, the fluid recovery part 27 recovers at least a portion of the liquid LQ in the second space SP2 and does not recover the liquid LQ in the first space SP1. The fluid recovery part 24 recovers at least a portion of the liquid LQ in the first space SP1 and does not recover the liquid LQ in the second space SP2.

Moreover, the liquid LQ, which moves outside (outside the outer surface 29) the first space SP1 from the optical path K, is suppressed from being moved to the substrate P (second space SP2) due to the inner surface 30.

The fluid recovery part 24 includes an opening (fluid recovery port) which is disposed at at least a portion of surrounding of the lower surface 23 of the first member 21. The fluid recovery part 24 is disposed to be opposite to the upper surface 25. The fluid recovery part 24 is connected to a liquid recovery apparatus 24C via a recovery channel (space) 24R which is formed in the inner portion of the first member 21. The liquid recovery apparatus 24C is able to connect the fluid recovery part 24 and a vacuum system. The fluid recovery part 24 is able to recover at least a portion of the liquid LQ in the first space SP1. At least a portion of the liquid LQ in the first space SP1 is able to flow into the recovery channel 24R via the fluid recovery part 24.

In the present embodiment, the fluid recovery part 24 includes a porous member 36, and the fluid recovery port includes holes of the porous member 36. In the present embodiment, the porous member 36 includes a mesh plate. The porous member 36 includes a lower surface to which the upper surface 25 is able to be opposite, an upper surface which faces the recovery channel 24R, and the plurality of holes which connect the lower surface and the upper surface. The fluid recovery part 24 recovers the liquid LQ via the holes of the porous member 36. The liquid LQ in the first space SP1 recovered from the fluid recovery part 24 (holes of the porous member 36) flows into the recovery channel 24R, flows to the recovery channel 24R, and is recovered by the liquid recovery apparatus 24C.

In the present embodiment, substantially only the liquid LQ is recovered via the fluid recovery part 24, and the recovery of gas via the fluid recovery part 24 is limited. A controller 6 adjusts a pressure difference between pressure (pressure of the first space SP1) at the lower surface side of the porous member 36 and pressure (pressure of the recovery channel 24R) at the upper surface side of the porous member 36 so that the liquid LQ in the first space SP1 passes through the holes of the porous member 36 and flows into the recovery channel 24R and gas does not pass through the holes of the porous member 36. Moreover, for example, an example of technology which recovers only liquid via the porous member is disclosed in U.S. Pat. No. 7,292,313 or the like.

In addition, both of the liquid LQ and the gas may be recovered (sucked) via the porous member 36. Moreover, the porous member 36 may not be provided at the first member 21. That is, the fluid (one or both of liquid LQ and gas) in the first space SP1 may be recovered without through the porous member.

In the present embodiment, the lower surface of the fluid recovery part 24 includes the lower surface of the porous member 36. The lower surface of the fluid recovery part 24 is disposed at the surrounding of the lower surface 23. In the present embodiment, the lower surface of the fluid recovery part 24 is substantially parallel with the XY plane. In the present embodiment, the lower surface of the fluid recovery part 24 and the lower surface 23 are disposed in the same plane (flush with each other).

Moreover, the lower surface of the fluid recovery part 24 may be disposed more at the +Z side than the lower surface 23 and may be disposed more at the −Z side than the lower surface 23. In addition, the lower surface of the fluid recovery part 24 may be inclined with respect to the lower surface 23 and may include a curved surface.

Moreover, the fluid recovery part 24 for recovering the fluid (one or both of liquid LQ and gas) in the first space SP1 may be disposed at the second member 22 to face the first space SP1. The fluid recovery part 24 may be disposed at both of the first member 21 and the second member 22. The fluid recovery part 24 may be disposed at the first member 21 and may not be disposed at the second member 22. The fluid recovery part 24 may be disposed at the second member 22 and may not be disposed at the first member 21.

The fluid recovery part 27 includes an opening (fluid recovery port) which is disposed at at least a portion of the surrounding of the lower surface 26 of the second member 22. The fluid recovery part 27 is disposed to be opposite to the upper surface of the substrate P (object). The fluid recovery part 27 is connected to a liquid recovery apparatus 27C via a recovery channel (space) 27R which is formed in the inner portion of the second member 22. The liquid recovery apparatus 27C is able to connect the fluid recovery part 27 and a vacuum system. The fluid recovery part 27 is able to recover at least a portion of the liquid LQ at the second space SP2. At least a portion of the liquid LQ at the second space SP2 is able to flow into the recovery channel 27R via the fluid recovery part 27.

In the present embodiment, the fluid recovery part 27 includes a porous member 37, and the fluid recovery port includes holes of the porous member 37. In the present embodiment, the porous member 37 includes a mesh plate.

The porous member 37 includes a lower surface to which the upper surface of the substrate P (object) is able to be opposite, an upper surface which faces the recovery channel 27R, and the plurality of holes which connect the lower surface and the upper surface. The liquid recovery part 27 recovers the fluid (one or both of the liquid LQ and the gas) via the holes of the porous member 37. The liquid LQ in the second space SP2 recovered from the fluid recovery part 27 (holes of the porous member 37) flows into the recovery channel 27R, flows to the recovery channel 27R, and is recovered by the liquid recovery apparatus 27C.

The recovery channel 27R is disposed outside the inner surface 30 with respect to the optical path K (the optical axis of the terminal optical element 13). The recovery channel 27R is disposed above the liquid recovery part 27. The second member 22 moves, and thus, the fluid recovery part 27 and the recovery channel 27R of the second member 22 moves outside the outer surface 29 of the first member 21.

The gas is recovered via the fluid recovery part 27 along with the liquid LQ. Moreover, only the liquid LQ is recovered via the porous member 37, and the recovery of the gas via the porous member 37 may be limited. In addition, the porous member 37 may not be provided at the second member 22. That is, the fluid (one or both of liquid LQ and gas) in the second space SP2 may be recovered without through the porous member.

In the present embodiment, the lower surface of the fluid recovery part 27 includes the lower surface of the porous member 37. The lower surface of the fluid recovery part 27 is disposed at the surrounding of the lower surface 26. In the present embodiment, the lower surface of the fluid recovery part 27 is substantially parallel with the XY plane. In the present embodiment, the lower surface of the fluid recovery part 27 may be disposed more at the +Z side than the lower surface 26.

Moreover, the lower surface of the fluid recovery part 27 and the lower surface 26 may be disposed in the same plane (may be flush with each other). The lower surface of the fluid recovery part 27 may be disposed more at the −Z side than the lower surface 26. In addition, the lower surface of the fluid recovery part 27 may be inclined with respect to the lower surface 26 and may include a curved surface.

In the present embodiment, since the recovery operation of the liquid LQ from the fluid recovery part 27 is performed in parallel with the supply operation of the liquid LQ from the liquid supply part 31, the liquid immersion space LS is formed between the terminal optical element 13 and the liquid immersion member 5 at one side and the substrate P (object) at the other side, by the liquid LQ.

Moreover, in the present embodiment, the recovery operation of the fluid from the fluid recovery part 24 is performed in parallel with the supply operation of the liquid LQ from the liquid supply part 31 and the recovery operation of the fluid from the fluid recovery part 27.

The second member 22 may be moved in parallel with the supply of the liquid LQ from the liquid supply part 31.

The second member 22 may be moved in parallel with the recovery of the liquid LQ from the fluid recovery part 24. The second member 22 may be moved in parallel with the recovery of the liquid LQ from the fluid recovery part 27. The second member 22 may be moved in parallel with the supply of the liquid LQ from the liquid supply part 31 and the recovery of the liquid LQ from the fluid recovery part 24 (fluid recovery part 27).

In the present embodiment, a portion of an interface LG of the liquid LQ in the liquid immersion space LS is formed between the second member 22 and the substrate P (object).

In the present embodiment, a portion of the interface LG of the liquid LQ in the liquid immersion space LS is formed between the first member 21 and the second member 22.

In the present embodiment, a portion of the interface LG of the liquid LQ in the liquid immersion space LS is formed between the terminal optical element 13 and the first member 21.

In the descriptions below, the interface LG of the liquid LQ which is formed between the first member 21 and the second member 22 is appropriately referred to as a first interface LG1. The interface LG which is formed between the second member 22 and the substrate P (object) is appropriately referred to as a second interface LG2. The interface LG which is formed between the terminal optical element 13 and the first member 21 is appropriately referred to as a third interface LG3.

In the present embodiment, the first interface LG1 is formed between the lower surface of the liquid recovery part 24 and the upper surface 25. The second interface LG2 is formed between the lower surface of the liquid recovery part 27 and the upper surface of the substrate P (object).

In the present embodiment, the first interface LG1 is formed between the lower surface of the liquid recovery part 24 and the upper surface 25, and the movement of the liquid LQ in the first space SP1 to the space (for example, the space between the outer surface 29 and the inner surface 30) outside the liquid recovery part 24 is suppressed. The liquid LQ is not present in the space between the outer surface 29 and the inner surface 30. The space between the outer surface 29 and the inner surface 30 becomes a space with gas.

The space between the outer surface 29 and the inner surface 30 is connected to the space CS. In other words, the space between the outer surface 29 and the inner surface 30 is opened to the atmosphere. When the pressure of the space CS is at atmospheric pressure, the space between the outer surface 29 and the inner surface 30 is opened to the atmosphere. Accordingly, the second member 22 is able to smoothly move. Moreover, the pressure of the space CS may be higher or lower than the atmospheric pressure.

Figure 8:
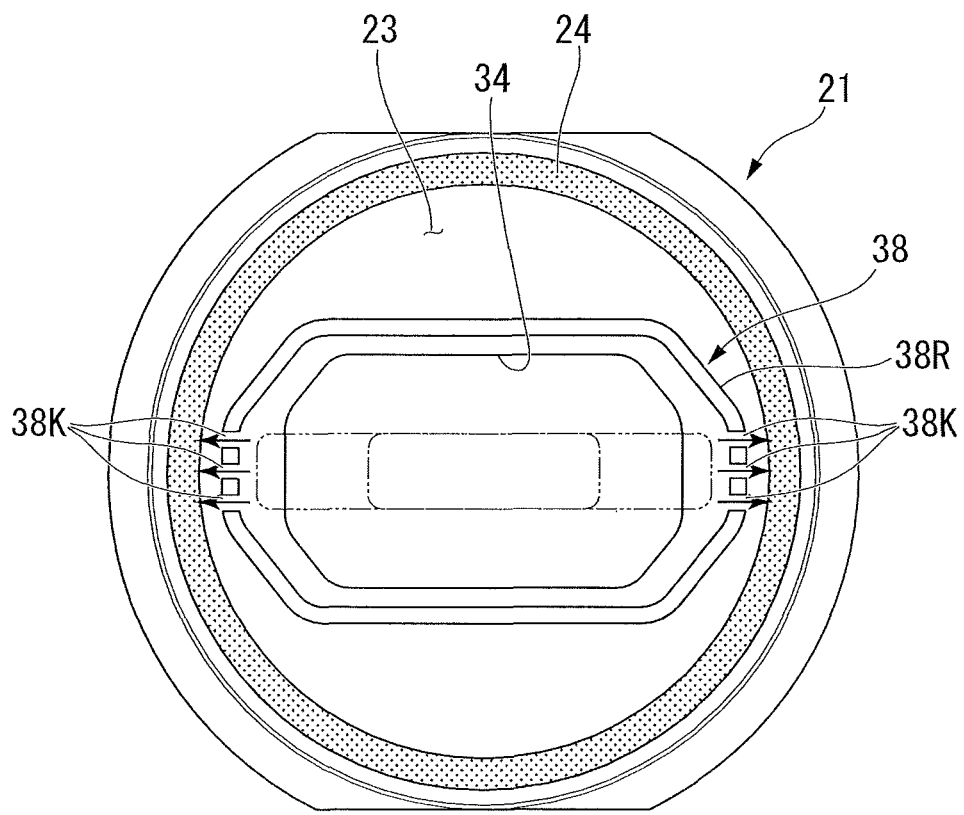
FIG. 8 is a view showing an example of a first member according to the first embodiment.

FIG. 8 is a view when the first member 21 is viewed from the lower surface 23 side. In the present embodiment, an introducing part 38, which introduces at least a portion of the liquid LQ from the liquid supply part 31, is disposed at the lower surface 23 of the first member 21. The introducing part 38 is a protruding part which is provided at the lower surface 23. The introducing part 38 introduces at least a portion of the liquid LQ from the liquid supply part 31 to the fluid recovery part 24.

The shape of the introducing part 38 is determined based on the movement direction of the second member 22. In the present embodiment, the introducing part 38 is provided to promote the flow of the liquid LQ in the direction parallel to the movement direction of the second member 22.

For example, when the second member 22 moves in the X axis direction, the shape of the introducing part 38 is determined so that the liquid LQ flows in the direction parallel to the X axis direction in the first space SP1 and reaches the fluid recovery part 24. For example, when the second member 22 moves in the +X direction, at least a portion of the liquid LQ in the first space SP1 flows in the +X direction by the introducing part 38. When the second member 22 moves in the −X direction, at least a portion of the liquid LQ in the first space SP1 flows in the −X direction by the introducing part 38.

In the present embodiment, the introducing part 38 includes a wall part 38R which is disposed at at least a portion of the surrounding of the opening 34 and a slit (opening) 38K which is formed at a portion of the wall part 38R.

The wall part 38 is disposed to surround the opening 34. The slit 38K is formed at each of the +X side and the −X side with respect to the optical path K so that the flow of the liquid LQ in the direction parallel to the X axis direction is promoted.

Due to the introducing part 38, a flow rate of the liquid LQ in the first space SP1 is increased with respect to the direction parallel to the movement direction of the second member 22. In the present embodiment, due to the introducing part 38, the flow rate of the liquid LQ is increased with respect to the X axis direction in the first space SP1. That is, velocity of the liquid LQ, which flows toward the space between the lower surface of the fluid recovery part 24 and the upper surface 25, is increased. Accordingly, the change of the position of the first interface LG1 with respect to the first member 21 or the change of the shape of the first interface LG1 is suppressed. Therefore, the liquid LQ in the first space SP1 is suppressed from being flowed outside the first space SP1.

Moreover, the position at which the slit 38K is formed is not limited to the +X side and the −X side with respect to the optical path K. For example, when the second member 22 moves to be parallel with the Y axis, the slit 38K may be added to the +Y side and the −Y side with respect to the optical path K. When the second member 22 does not move to be parallel with the Y axis, the slit 38K may be added to the +Y side and the −Y side with respect to the optical path K.

In addition, the shape (position or the like of the slit 38K) of the introducing part 38 may not be determined based on the movement direction of the second member 22. For example, the shape of the introducing part 38 may be determined so that the liquid LQ radially flows with respect to the optical path K in the entire circumference of the optical path K.

In the present embodiment, the second member 22 is able to be opposite to the entire lower surface 23. For example, as shown in FIG. 2, when the second member 22 is disposed at an origin where the optical axis of the terminal optical element 13 and the center of the opening 35 substantially coincide with each other, the entire lower surface 23 is opposite to the upper surface 25 of the second member 22. In addition, when the second member 22 is disposed at the origin, a portion of the emitting surface 12 is opposite to the upper surface 25 of the second member 22. Moreover, when the second member 22 is disposed at the origin, the lower surface of the fluid recovery part 24 is opposite to the upper surface 25 of the second member 22.

In addition, in the present embodiment, when the second member 22 is disposed at the origin, the center of the opening 34 substantially coincides with the center of the opening 35.

Next, an example of the operation of the second member 22 will be described. The second member 22 is able to cooperatively move with the movement of the substrate P (object). The second member 22 is able to move to be independent of the substrate P (object). The second member 22 is able to move in parallel with at least a portion of the movement of the substrate P (object). The second member 22 is able to move in a state where the liquid immersion space LS is formed. The second member 22 is able to move in a state where the liquid LQ is present in the first space SP1 and the second space SP2.

The second member 22 may move when the second member 22 and the substrate (object) are not opposite to each other. For example, the second member 22 may move when the object is not present below the second member 22. Moreover, the second member 22 may move when the liquid LQ is not present in the space between the second member 22 and the substrate P (object). For example, the second member 22 may move when the liquid immersion space LS is not formed.

For example, the second member 22 is moved based on movement conditions of the substrate P (object). For example, the controller 6 moves the second member 22 in parallel with at least a portion of the movement of the substrate P (object) based on the movement conditions of the substrate P (object). The controller 6 moves the second member 22 while performing the supply of the liquid LQ from the liquid supply part 31 and the recovery of the liquid LQ from the fluid recovery part 27 and the fluid recovery part 24 so that the liquid immersion space LS is continuous to be formed.

In the present embodiment, the second member 22 is able to move so that the relative movement between the second member 22 and the substrate P (object) is decreased. Moreover, the second member 22 is able to move so that the relative movement between the second member and the substrate P (object) is smaller than the relative movement between the first member 21 and the substrate P (object). For example, the second member 22 may move in synchronization with the substrate P (object).

The relative movement includes at least one of a relative speed and a relative acceleration. For example, in a state where the liquid immersion space LS is formed, that is, in a state where the liquid LQ is present in the second space SP2, the second member 22 may move so that the relative speed between the second member 22 and the substrate P (object) is decreased. Moreover, in the state where the liquid immersion space LS is formed, that is, in the state where the liquid LQ is present in the second space SP2, the second member 22 may move so that the relative acceleration between the second member and the substrate P (object) is decreased. In addition, in the state where the liquid immersion space LS is formed, that is, in the state where the liquid LQ is present in the second space SP2, the second member 22 may move so that the relative speed between the second member and the substrate P (object) is smaller than the relative speed between the first member 21 and the substrate P (object). Moreover, in the state where the liquid immersion space LS is formed, that is, in a state where the liquid LQ is present in the second space SP2, the second member 22 may move so that the relative acceleration between the second member and the substrate P (object) is smaller than the relative acceleration between the first member 21 and the substrate P (object).

For example, the second member 22 is able to move in the movement direction of the substrate P (object). For example, when the substrate P (object) moves in the +X direction (or the −X direction), the second member 22 is able to move in the +X direction (or the −X direction). Moreover, when the substrate P (object) moves in the +Y direction (or the −Y direction) while moving in the +X direction, the second member 22 is able to move in the +X direction. In addition, when the substrate P (object) moves in the +Y direction (or the −Y direction) while moving in the −X direction, the second member 22 is able to move in the −X direction. That is, in the present embodiment, when the substrate P (object) moves in the direction which includes the component of the X axis direction, the second member 22 moves in the X axis direction.

For example, the second member 22 may move in the X axis direction in parallel with at least a portion of the movement of the substrate P (object) in the direction including the component in the X axis direction.

Moreover, the second member 22 may move in the Y axis direction. When the substrate P (object) moves in the direction including the component in the Y axis direction, the second member 22 may move in the Y axis direction. For example, the second member 22 may move in the Y axis direction so that the difference in the relative speed between the second member and the substrate P (object) is decreased in parallel with at least a portion of the movement of the substrate P (object) in the direction including the component in the Y axis direction.

FIG. 9 shows an example of a state where the second member 22 moves. FIG. 9 is a view when the liquid immersion member 5 is viewed from below (−Z side).

In the descriptions below, the second member 22 moves in the X axis direction. Moreover, as described above, the second member 22 may move in the Y axis direction and may move in an arbitrary direction in the XY plane which includes the component in the X axis direction (or the Y axis direction).

When the substrate P (object) moves in the X axis direction (or a predetermined direction in the XY plane which includes the component in the X axis direction), as shown in FIGS. 9(A) to 9(C), the second member 22 moves in the X axis direction.

In the present embodiment, the second member 22 is able to move in a movable range which is defined with respect to the X axis direction. FIG. 9(A) shows a state where the second member 22 is disposed at the furthest end of the −X side of the movable range. FIG. 9(B) shows a state where the second member 22 is disposed at the center of the movable range. FIG. 9(C) shows a state where the second member 22 is disposed at the furthest end of the +X side of the movable end.

In the descriptions below, the position of the second member 22 shown in FIG. 9(A) is appropriately referred to as a first end part position, the position of the second member 22 shown in FIG. 9(B) is appropriately referred to as a center position, and the position of the second member 22 shown in FIG. 9(C) is appropriately referred to as a second end part position. Moreover, as shown in FIG. 9(B), the state where the second member 22 is disposed at the center position includes the state where the second member 22 is disposed at the origin.

In the present embodiment, the size of the opening 35 is determined based on the size of the movable range of the second member 22 so that the exposure light EL from the emitting surface 12 passes through the opening 35. The size of the movable range of the second member 22 includes the distance between the first end part position and the second end part position with respect to the X axis direction. The size in the X axis direction of the opening 35 is determined so that, even when the second member 22 moves in the X axis direction, the exposure light EL from the emitting surface 12 is not radiated to the second member 22.

In FIG. 9, the size W35 of the opening 35 with respect to the X axis direction is larger than the sum of the size Wpr of the exposure light EL (projection region PR) and the size (Wa+Wb) of the movable range of the second member 22. The size W35 is determined as the size in which, even when the second member 22 moves between the first end part position and the second end part position, the exposure light EL from the emitting surface 12 is not blocked. Accordingly, even when the second member 22 moves, the exposure light EL from the emitting surface 12 is not blocked by the second member 22 and can be radiated to the substrate P (object).

Figure 10:
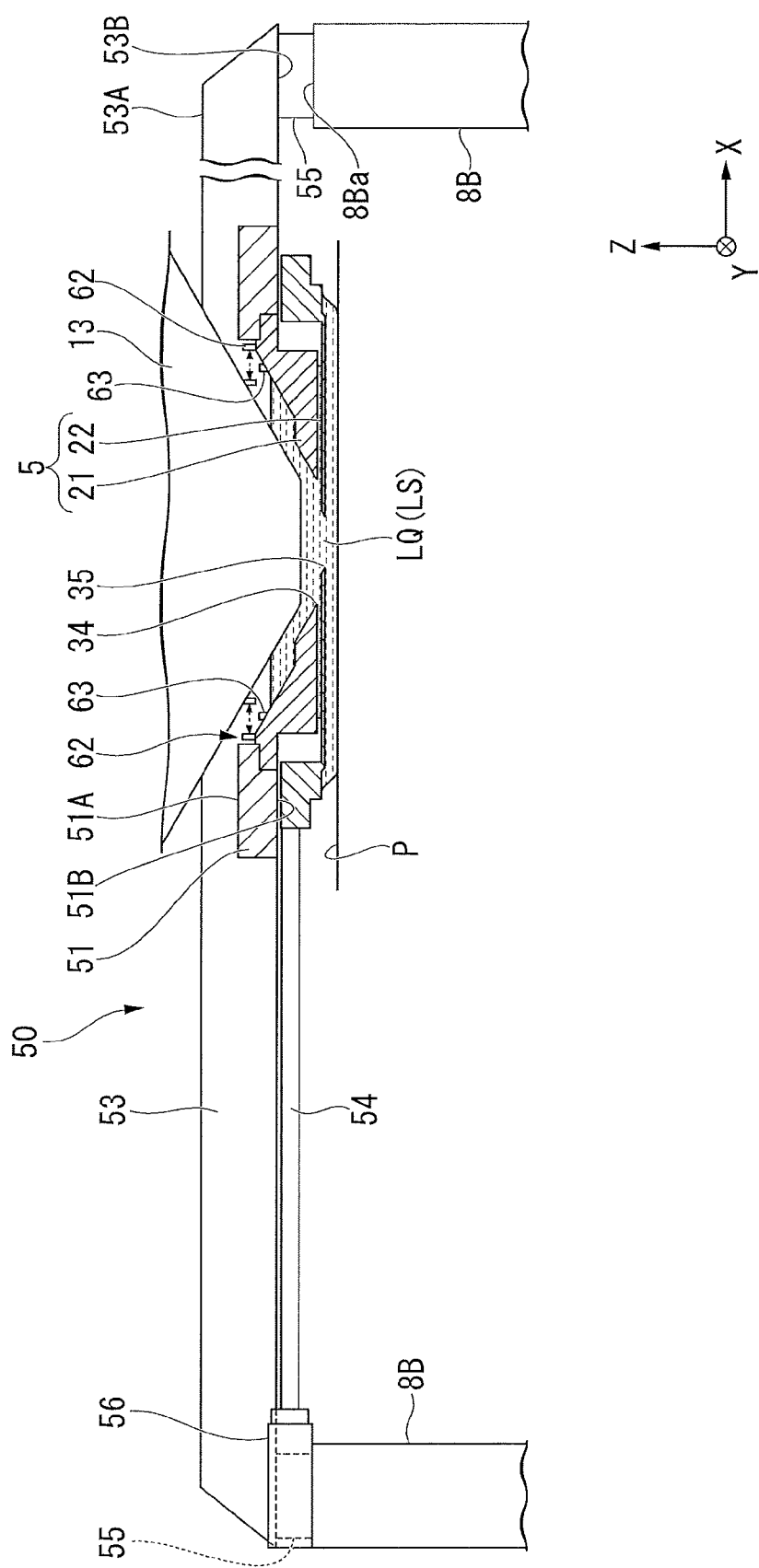
FIG. 10 is a view showing an example of a supporting apparatus according to the first embodiment.
Figure 11:
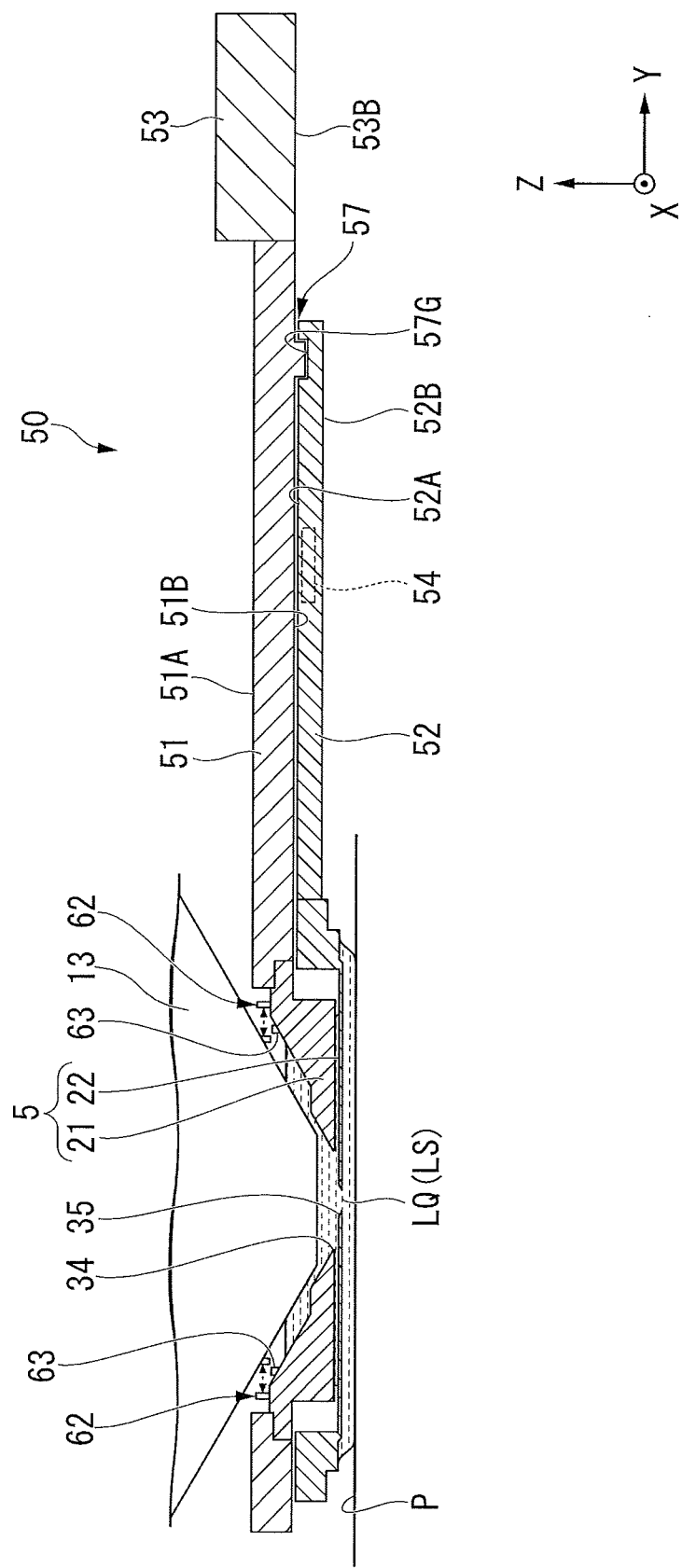
FIG. 11 is a view showing an example of the supporting apparatus according to the first embodiment.
Figure 12:
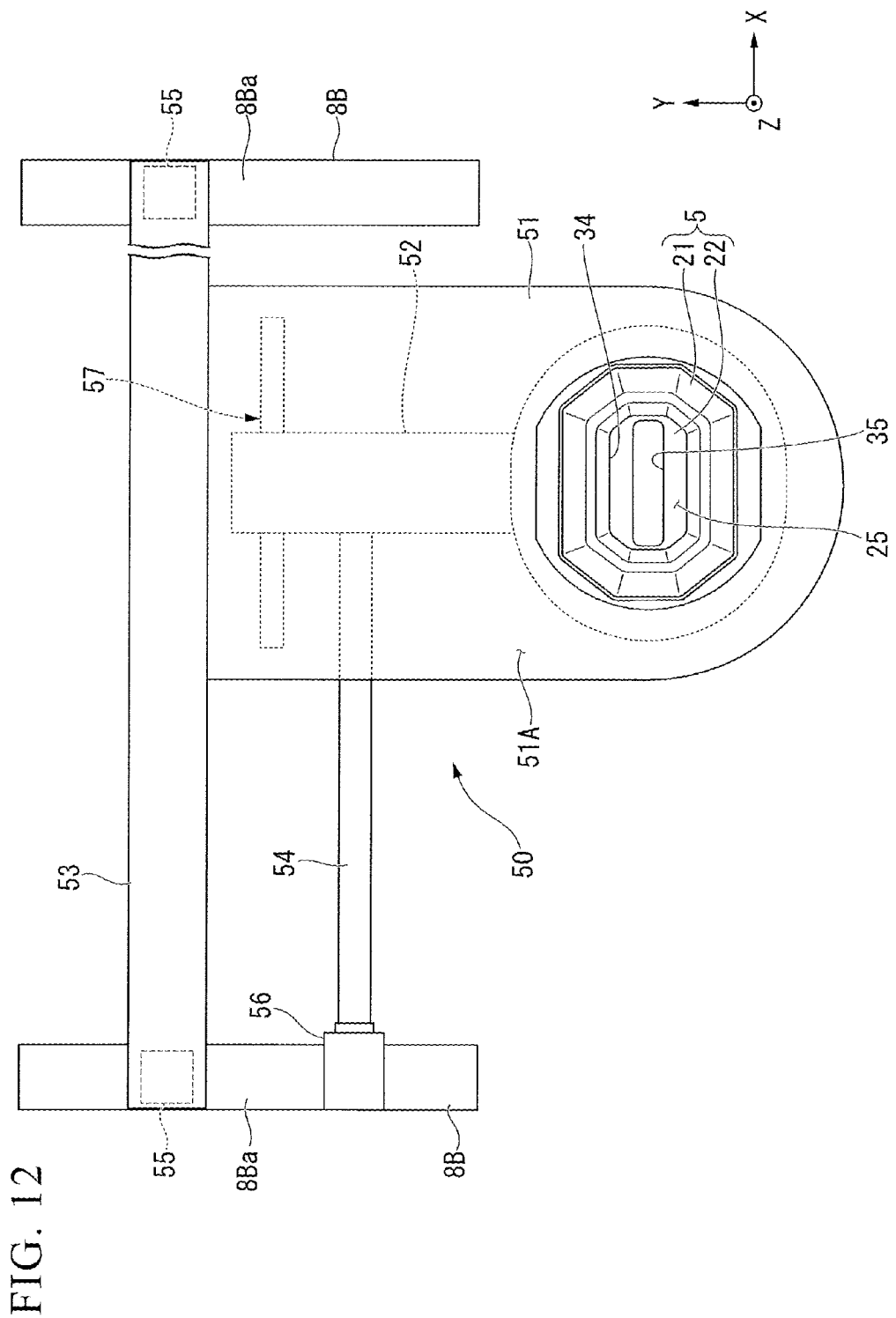
FIG. 12 is a view showing an example of the supporting apparatus according to the first embodiment.
Figure 13:
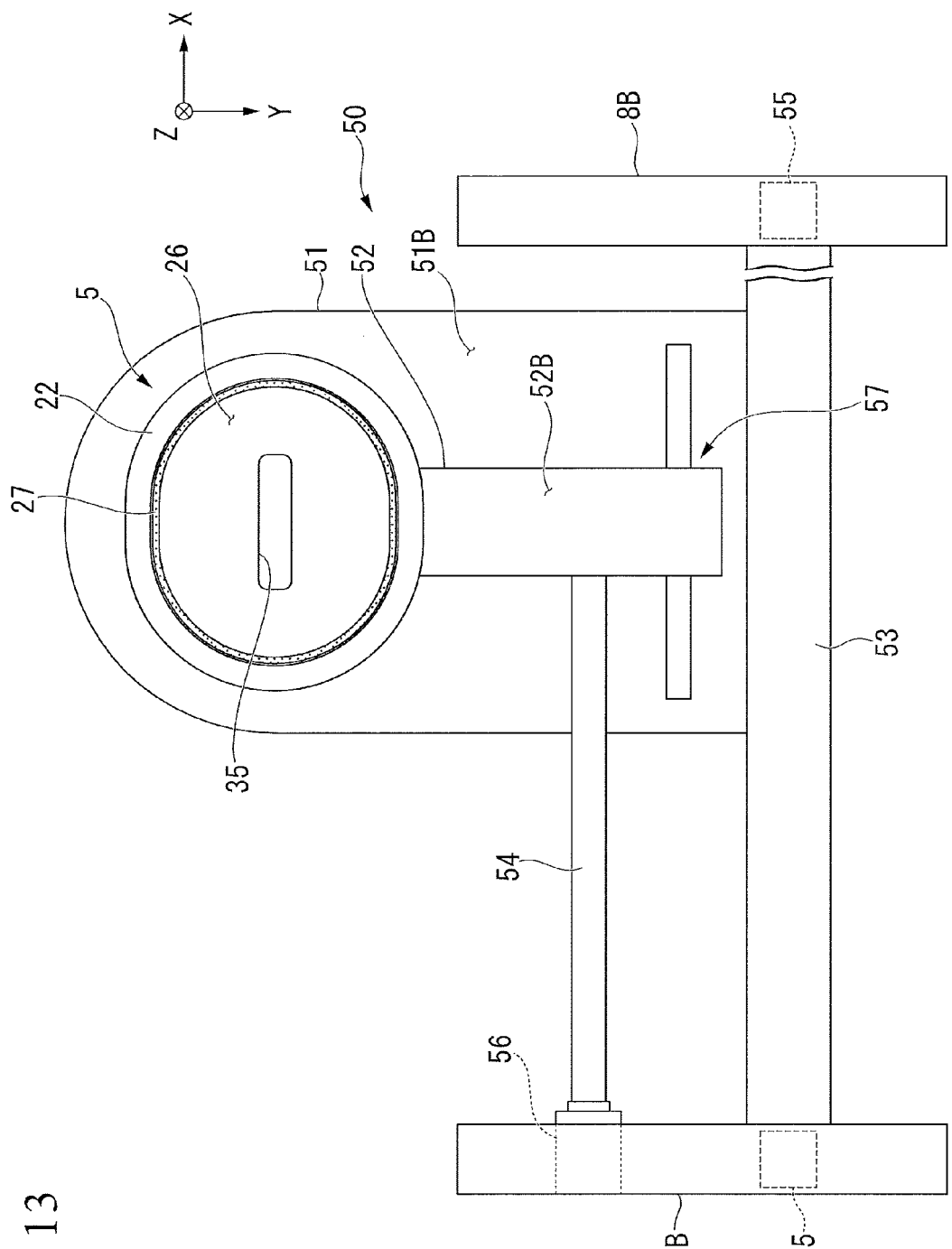
FIG. 13 is a view showing an example of the supporting apparatus according to the first embodiment.

Next, an example of a supporting apparatus 50 which supports the liquid immersion member 5 will be described. FIGS. 10 and 11 are side views showing examples of the liquid immersion member 5 and the supporting apparatus 50 according to the present embodiment. FIGS. 12 and 13 are plan views showing examples of the liquid immersion member 5 and the supporting apparatus 50 according to the present embodiment.

FIG. 10 is a view when viewed from the −Y side, and FIG. 11 is a view when viewed from the +X side. FIG. 12 is a view when viewed from the +Z side, and FIG. 13 is a view when viewed from the −Z side.

In the present embodiment, the supporting apparatus 50 includes a first supporting member 51 which supports the first member 21 and a second supporting member 52 which supports the second member 22. In addition, the supporting apparatus 50 includes a support frame 53 which supports the first supporting member 51 and a moving frame 54 which supports the second supporting member 52.

The first supporting member 51 is connected to the first member 21. The first member 21 is fixed to the first supporting member 51. The first supporting member 51 is disposed to surround the first member 21. The first supporting member 51 includes an upper surface 51A facing the +Z direction and a lower surface 51B facing the −Z direction.

The support frame 53 is connected to the first supporting member 51. The first supporting member 51 is fixed to the support frame 53. The support frame 53 supports the first member 21 via the first supporting member 51.

The second supporting member 52 is connected to the second member 22. The second member 22 is fixed to the second supporting member 52. In the present embodiment, the second supporting member 52 is connected to a portion of the second member 22 of the +Y side with respect to the center of the opening 35. The second supporting member 52 is connected to the second member 22 outside the first member 21 with respect to the optical path K. The second supporting member 52 includes an upper surface 52A facing the +Z direction and a lower surface 52B facing the −Z direction.

The moving frame 54 is connected to the second supporting member 52. The second supporting member 52 is fixed to the moving frame 54. The moving frame 54 supports the second member 22 via the second supporting member 52.

In the present embodiment, the first member 21 and the second member 22 do not contact each other. The first supporting member 51 and the second supporting member 52 do not contact each other. The lower surface 51B of the first supporting member 51 is opposite to the upper surface 52A of the second supporting member 52 via a gap.

The supporting apparatus 50 includes a prevention apparatus 55 which suppresses vibration of the first member 21. For example, the vibration isolator 55 suppresses the vibration of the first member 21 caused by the movement of the second member 22. The vibration isolator 55 is controlled by the controller 6.

At least a portion of the vibration isolator 55 is supported by the apparatus frame 8B. At least a portion of the vibration isolator 55 is disposed between the support frame 53 and the apparatus frame 8B. At least a portion of the vibration isolator 55 is disposed below the support frame 53. A lower surface 53B of the support frame 53, which faces the −Z direction, is opposite to the vibration isolator 55. At least a portion of the vibration isolator 55 is opposite to an upper surface 8Ba of the apparatus frame 8B which faces the +Z direction.

The vibration isolator 55 is disposed at each of the +X side and the −X side with respect to the optical axis of the terminal optical element 13. The support frame 53 is long in the X axis direction. The vibration isolator 55 is connected to each of the +X side end part and the −X side end part of the support frame 53.

Moreover, the vibration isolator 55 may be disposed at one location, and may be disposed at each of the plurality of positions such as three or more locations.

In the present embodiment, the vibration isolator 55 suppresses the vibration of the support frame 53, and suppresses the vibration of the first member 21 which is supported by the support frame 53.

For example, the vibration isolator 55 includes a plurality of actuators. The vibration isolator 55 suppresses the vibration of the first member 21 by operations of the actuators. That is, the vibration isolator 55 is a so-called active type vibration isolator. Moreover, the vibration isolator 55 may include a damping apparatus (damper) in addition to the actuators. For example, the vibration isolator 55 may include six piezo actuators. The vibration isolator 55 may use six actuators, and the first member 21 (support frame 53) may be moved in six directions of the X axis, the Y axis, the Z axis, the θX, the θY, and the θZ. That is, the vibration isolator 55 may be an active type vibration isolator having six degrees of freedom.

Moreover, the vibration isolator 55 operates the actuator and is able to move the first member 21.

That is, the vibration isolator 55 functions as a driving apparatus which is able to move the first member 21. The vibration isolator 55 is able to move the first member 21 with respect to a reference member. The vibration isolator 55 is able to move the first member 21 in six directions of the X axis, the Y axis, the Z axis, the θX, the θY, and the θZ.

The vibration isolator 55 is able to move the first member 21 so that displacement of the first member 21 with respect to the reference member is suppressed. For example, the vibration isolator 55 moves the first member 21 so that the displacement of the first member 21 caused by the movement of the second member 22 is suppressed.

The vibration isolator 55 is able to move the first member 21 so that the displacement of the first member 21 with respect to the terminal optical element 13 is suppressed. The vibration isolator 55 is able to move the first member 21 so that a relative position between the terminal optical element 13 and the first member 21 is not changed.

In addition, the reference member is not limited to the terminal optical element 13. The reference member may be a member in which the position is not substantially changed in the exposure apparatus EX. For example, the vibration isolator 55 may move the first member 21 so that the displacement of the first member 21 with respect to the reference frame 8A is suppressed.

The vibration isolator 55 may move the first member 21 so that the displacement of the first member 21 with respect to a holding member (barrel or the like) which holds optical elements of the projection optical system PL is suppressed.

In the present embodiment, a detection apparatus 62 which is able to detect the position of the first member 21 is provided. The detection apparatus 62 is able to detect the position of the first member 21 with respect to the reference member. In the present embodiment, the detection apparatus 62 is able to detect the position of the first member 21 with respect to the terminal optical element 13. In the present embodiment, the detection apparatus 62 is able to detect the position (the position with respect to the terminal optical element 13) of the first member 21 with respect to each of six directions of the X axis, the Y axis, the Z axis, the θX, the θY, and the θZ. At least a portion of the detection apparatus 62 may be disposed at the first member 21. Moreover, at least a portion of the detection apparatus 62 may be disposed at the first supporting member 51, and may be disposed at the support frame 53. In addition, at least a portion of the detection apparatus 62 may be disposed at the terminal optical element 13. Moreover, at least a portion of the detection apparatus 62 may be disposed at the holding member which holds the terminal optical element 13. In the present embodiment, the detection apparatus 62 includes an interferometer system. The detection apparatus 62 includes a laser interferometer which is disposed at the first member 21 and includes a light emitting portion and a light receiving portion of a laser light, and a reflection member which is disposed at the terminal optical element 13 (reference member). The laser interferometer may be disposed at the first supporting member 51 and may be disposed at the support frame 53. The reflection member may be disposed at at least one of the reference frame 8A and the holding members which hold the optical elements of the projection optical system PL. The laser light which is emitted from the light emitting portion of the laser interferometer is radiated to the reflection member. The light receiving portion of the laser interferometer detects at least a portion of the laser light which is reflected by the reflection member. For example, the detection apparatus 62 may detect the position of the first member 21 with respect to the reference frame 8A. The detection result of the detection apparatus 62 is output to the controller 6.

The controller 6 is able to obtain the position of the first member 21 with respect to the terminal optical element 13 based on the detection result of the detection apparatus 62. Moreover, the controller 6 is able to obtain a displacement amount of the first member 21 with respect to the terminal optical element 13 based on the detection result of the detection apparatus 62. In addition, the controller 6 is able to obtain the relative position between the terminal optical element 13 and the first member 21 based on the detection result of the detection apparatus 62.

Moreover, the controller 6 is able to obtain the size of the gap (the size of the third space SP3) between the terminal optical element 13 and the first member 21 based on the detection result of the detection apparatus 62.

In addition, the controller 6 is able to obtain the size of the gap (the size of the second space SP2) between the first member 21 and the object (the substrate P, the substrate stage 2, the measurement stage 3, or the like) based on the detection result of the detection apparatus 62. Moreover, the controller 6 may obtain the size of the gap between the first member 21 and the object based on the detection result of a detection system (a so-called focus leveling detection system) which is able to detect a position of the upper surface of the object, and the detection result of the detection apparatus 62.

For example, the controller 6 is able to control the vibration isolator 55 based on the detection result of the detection apparatus 62 so that the displacement of the first member 21 with respect to the terminal optical element 13 (reference member) is suppressed.

The controller 6 may control the vibration isolator 55 based on the detection result of the detection apparatus 62 so that the displacement amount of the first member 21 with respect to the terminal optical element 13 (reference member) is within a target range (allowable range). For example, the controller 6 may control the vibration isolator 55 so that the detection value of the detection apparatus 62 is smaller than the target value.

In the present embodiment, the detection apparatus 62 is able to detect the position (the position with respect to the reference member) of the first member 21 with respect to each of six directions of the X axis, the Y axis, the Z axis, the θX, the θY, and the θZ. The vibration isolator 55 is able to move the first member 21 in each of six directions of the X axis, the Y axis, the Z axis, the θX, the θY, and the θZ. In the present embodiment, a position adjustment system having six inputs and six outputs is provided to adjust the position of the first member 21 with respect to six directions.

The controller 6 is able to control the vibration isolator 55 so that the displacement amount of the first member 21 with respect to at least one direction of six directions is within the target range.

In addition, the controller 6 may adjust the position of the first member 21 by using the vibration isolator 55 so that a change amount of the relative position between the terminal optical element 13 and the first member 21 is smaller than the target value. Moreover, the controller 6 may suppress the displacement of the first member 21 with respect to the terminal optical element 13 by using the vibration isolator 55 so that the size of the gap (the size of the third space SP3) between the terminal optical element 13 and the first member 21 is within the target range. The controller 6 may adjust the position of the first member 21 by controlling the vibration isolator 55 so that a difference between the detection value of the size of the gap (the size of the third space SP3) between the terminal optical element 13 and the first member 21 which is detected using the detection apparatus 62, and the target value is decreased. The controller 6 may control the operation (moving mode) of the first member 21 by using the vibration isolator 55 so that a displacement rate (moving speed) of the first member 21 with respect to the terminal optical element 13 is smaller than the target speed. For example, the controller 6 may control the operation of the first member 21 so that the relative speed between the terminal optical element 13 and the first member 21 in the Z axis direction is smaller than the target speed. The controller 6 may control the operation of the first member 21 so that the change amount of the dimensions (size and volume) of the third space SP3 per unit time is smaller than the target value.

Moreover, the controller 6 may adjust the position of the first member 21 using the vibration isolator 55 so that the change amount of the relative position between the object (at least one of the substrate P, the substrate stage 2, and the measurement stage 3) and the first member 21 is smaller than the target value. In addition, the controller 6 may suppress the displacement of the first member 21 by using the vibration isolator 55 so that the size of the gap (the size of the second space PS2) between the first member 21 and the object is within the target range. The controller 6 may adjust the position of the first member 21 by controlling the vibration isolator 55 so that a difference between the detection value of the size of the gap (the size of the second space SP2) between the first member 21 and the object detected using the detection apparatus 62 and the target value is decreased. The controller 6 may control the operation (moving mode) of the first member 21 using the vibration isolator 55 so that a displacement rate (moving speed) of the first member 21 with respect to the object is smaller than the target speed. For example, the controller 6 may control the operation of the first member 21 so that the relative speed between the object and the first member 21 in the Z axis direction is smaller than the target speed. The controller 6 may control the operation of the first member 21 so that the change amount of the dimensions (size and volume) of the second space SP2 per unit time is smaller than the target value.

In the present embodiment, a detection apparatus 63 which is able to detect the acceleration of the first member 21 is provided.

In the present embodiment, the detection apparatus 63 is able to detect the acceleration of the first member 21 with respect to each of six directions of the X axis, the Y axis, the Z axis, the θX, the θY, and the θZ. In the present embodiment, at least a portion of the detection apparatus 63 may be disposed at the first member 21. Moreover, at least a portion of the detection apparatus 63 may be disposed at the first supporting member 51, and may be disposed at the support frame 53. The detection result of the detection apparatus 63 is output to the controller 6.

For example, the controller 6 is able to control the vibration isolator 55 based on the detection result of the detection apparatus 63 so that the vibration of the first member 21 is suppressed. In the present embodiment, the controller 6 may control the vibration isolator 55 so that the detection value of the detection apparatus 63 is smaller than the target value.

In the present embodiment, the detection apparatus 63 is able to detect the acceleration of the first member 21 with respect to each of six directions of the X axis, the Y axis, the Z axis, the θX, the θY, and the θZ. The vibration isolator 55 is able to move the first member 21 in each of six directions of the X axis, the Y axis, the Z axis, the θX, the θY, and the θZ. In the present embodiment, a vibration isolation system having six inputs and six outputs is provided to suppress the vibration of the first member 21 with respect to six directions. The controller 6 is able to control the vibration isolator 55 so that the vibration (acceleration) of the first member 21 with respect to at least one direction of six directions is within the target range.

In addition, the controller 6 may control the operation of the first member 21 so that the relative acceleration between the terminal optical element 13 and the first member 21 with respect to the Z axis direction is smaller than the target acceleration.

Moreover, in the present embodiment, the controller 6 may adjust the position of the first member 21, may suppress the displacement of the first member 21 with respect to the terminal optical element 13, and may suppress the vibration of the first member 21 by using the vibration isolator 55 so that a pressure change of the third space SP3 is suppressed. For example, when a pressure sensor which is able to detect the pressure of the third space SP3 is provided, the controller 6 may control the vibration isolator 55 based on the detection result of the pressure sensor so that the pressure change of the third space SP3 is suppressed.

Moreover, in the present embodiment, the controller 6 may adjust the position of the first member 21, may suppress the displacement of the first member 21 with respect to the object (substrate P or the like), and may suppress the vibration of the first member 21 by using the vibration isolator 55 so that the pressure change of the second space SP2 is suppressed. For example, when a pressure sensor which is able to detect the pressure of the second space SP2 is provided, the controller 6 may control the vibration isolator 55 based on the detection result of the pressure sensor so that the pressure change of the second space SP2 is suppressed.

In the present embodiment, the supporting apparatus 50 includes a driving apparatus 56 which moves the second member 22. The second member 22 is moved by the driving apparatus 56. For example, the driving apparatus 56 includes a motor, and is able to move the second member 22 using Lorentz force. The driving apparatus 56 is able to move the second member 22 with respect to the first member 21. The driving apparatus 56 is controlled by the controller 6.

In the present embodiment, at least a portion of the driving apparatus 56 is supported by the apparatus frame 8B. At least a portion of the driving apparatus 56 is disposed on the apparatus frame 8B. The upper surface 8Ba of the apparatus frame 8B facing the +Z direction is opposite to the driving apparatus 56.

The moving frame 54 supports the second member 22 via the second supporting member 52. In the present embodiment, the driving apparatus 56 moves the moving frame 54. The moving frame 54 is moved by the driving apparatus 56, and thus, the second supporting member 52 is moved. The second supporting member 52 is moved by the driving apparatus 56, and thus, the second member 22 is moved.

In the present embodiment, the support frame 53 is supported by the apparatus frame 8B. The support frame 53 is supported by the apparatus frame 8B via the vibration isolator 55. The vibration isolator 55 supports the first member 21 via the support frame 53 and the first supporting member 51. The first member 21 is supported by the vibration isolator 55 via the first supporting member 51 and the support frame 53. The apparatus frame 8B supports the first member 21 via the vibration isolator 55, the support frame 53, and the first supporting member 51.

In the present embodiment, the moving frame 54 is supported by the apparatus frame 8B. The moving frame 54 is supported by the apparatus frame 8B via the driving apparatus 56. The driving apparatus 56 supports the second member 22 via the moving frame 54 and the second supporting member 52. The second member 22 is supported by the driving apparatus 56 via the second supporting member 52 and the moving frame 54. The apparatus frame 8B supports the second member 22 via the driving apparatus 56, the moving frame 54, and the second supporting member 52.

In the present embodiment, the apparatus frame 8B supports the reference frame 8A which supports the projection optical system PL (terminal optical element 13), the support frame 53 (vibration isolator 55) which supports the first member 21, and the moving frame 54 (driving apparatus 56) which supports the second member 22.

Moreover, in the present embodiment, the first supporting member 51 may be a portion of the first member 21. In addition, in the present embodiment, the second supporting member 52 may be a portion of the second member 22.

In the present embodiment, the driving apparatus 56 is disposed at the −X side with respect to the optical axis of the terminal optical element 13. In the present embodiment, the moving frame 54 is a rod member which is long in the X axis direction.

In the present embodiment, the driving apparatus 56 is connected to the −X side end part of the moving frame 54. The second supporting member 52 is connected to the +X side end part of the moving frame 54.

Moreover, in the present embodiment, the moving frame 54 may include a plurality of members. For example, the moving frame 54 may include a first rod member which is connected to the driving apparatus 56, a second rod member which is connected to the second supporting member 52, and a link mechanism (a hinge mechanism) which is disposed between the first rod member and the second rod member. In addition, the moving frame 54 may include a rod member, and a link mechanism (hinge mechanism) which connects the rod member, one end of the rod member and the driving apparatus 56. Moreover, the moving frame 54 may include the rod member, and a link mechanism (hinge mechanism) which connects the other end of the rod member and the second supporting member 52. At least a portion of the moving frame 54 may be flexible.

Moreover, a plurality of moving frames 54 may be connected to the second supporting member 52. The driving apparatus 56 may be connected to each of the plurality of moving frames 54. A plurality of driving apparatuses 56 may be provided.

The supporting apparatus 50 includes a guide apparatus 57 which guides the second member 22. In the present embodiment, the guide apparatus 57 guides the second member 22 in the X axis direction. In the present embodiment, at least a portion of the guide apparatus 57 is disposed between the first supporting member 51 (first member 21) and the second supporting member 52 (second member 22).

The second member 22 is guided in the X axis direction by the guide apparatus 57. In the present embodiment, the movement of the second member 22 with respect to the directions of the Y axis, the Z axis, the θX, the θY, and the θZ is limited.

The guide apparatus 57 includes a gas bearing 57G between the lower surface 51B of the first supporting member 51 and the upper surface 52A of the second supporting member 52. In the present embodiment, the guide apparatus 57 includes a so-called air guide mechanism. For example, the gas bearing 57G includes a gas supply port which is disposed at the lower surface 51B and a gas discharge port which is disposed at the lower surface 51B. In addition, the gas supply port may be disposed at the upper surface 52A. The gas discharge port may be disposed at the upper surface 52A. By the gas bearing 57G, the second supporting member 22 (second member 22) is supported in a non-contact manner by the first supporting member 21 (first member 21).

By the gas bearing 57G the second supporting member 22 (second member 22) is guided in the X axis direction in a non-contact state with respect to the first supporting member 21 (first member 21).

In addition, in the present embodiment, at least a portion of the second supporting member 52 may be opposite to the support frame 53. The guide apparatus 57 may be disposed between the second supporting member 52 and the support frame 53.

Figure 14:
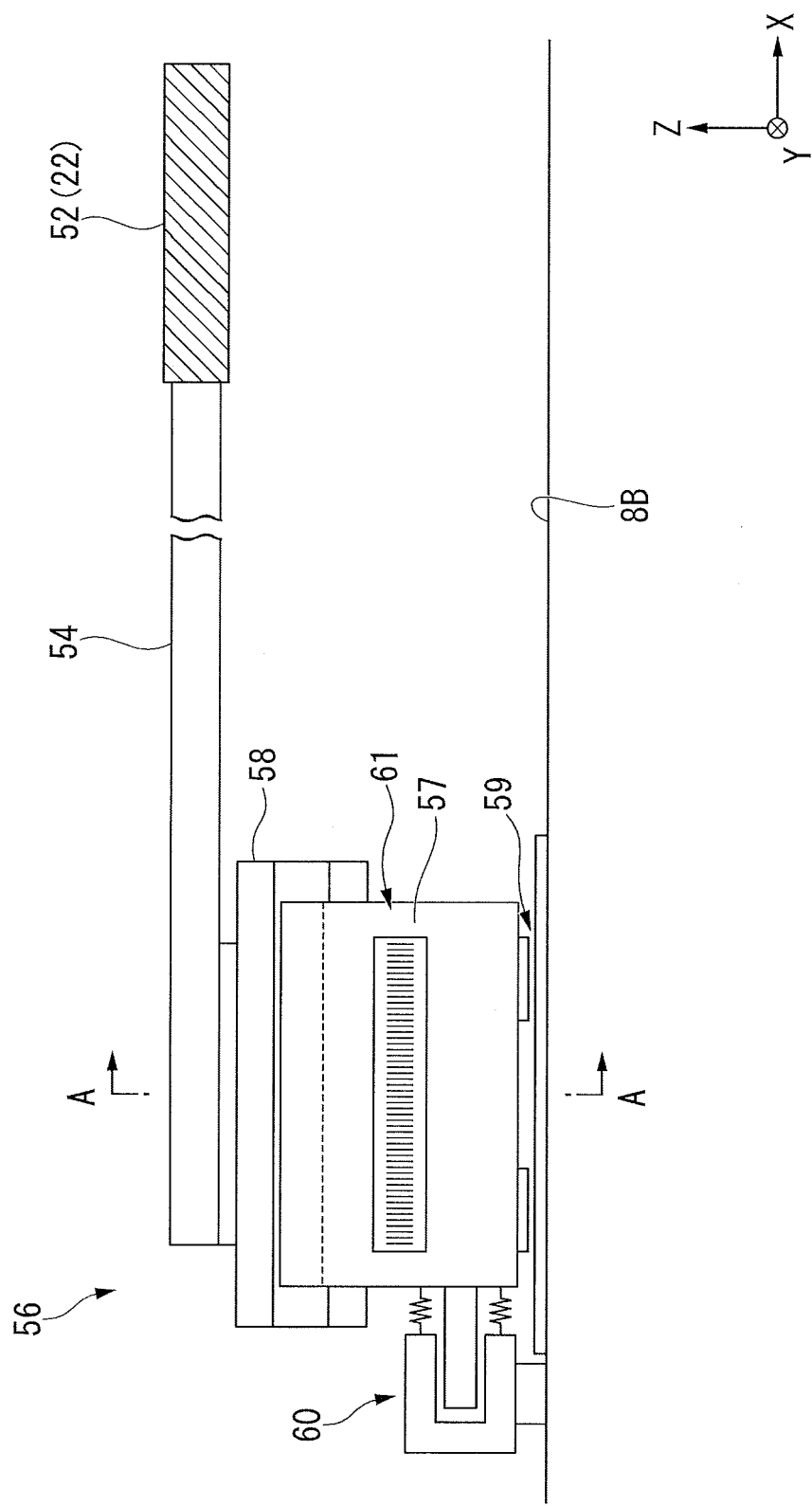
FIG. 14 is a view showing an example of a driving apparatus according to the first embodiment.
Figure 15:
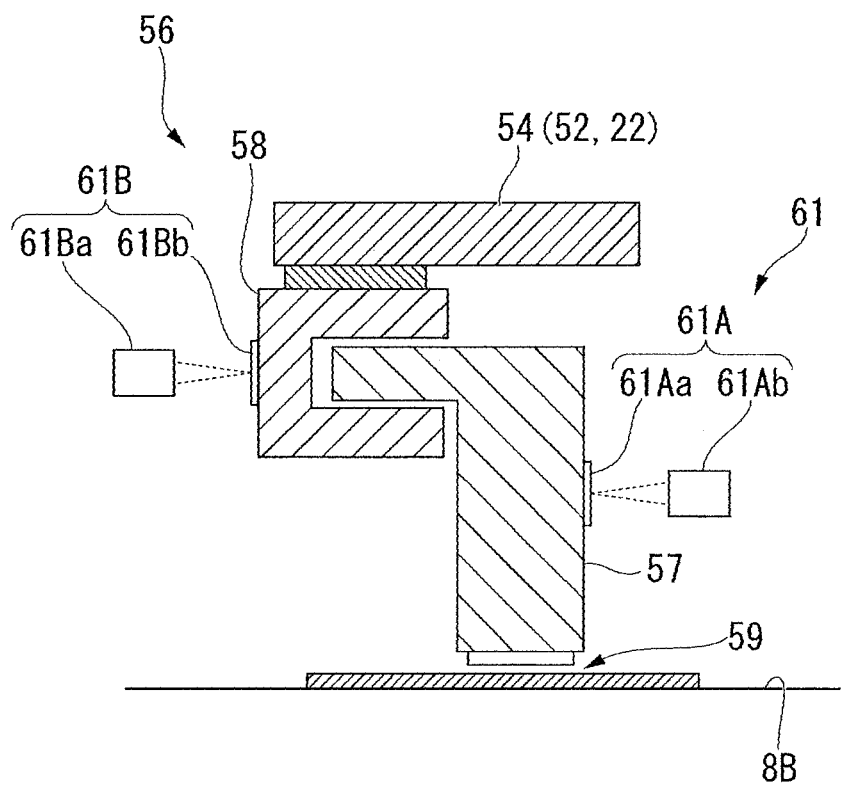
FIG. 15 is a view showing an example of the driving apparatus according to the first embodiment.

FIG. 14 is a view schematically showing an example of the driving apparatus 56 according to the present embodiment. FIG. 15 is a cross-sectional view taken along the A-A line of FIG. 14.

In the present embodiment, for example, the driving apparatus 56 includes an actuator which is operated by Lorentz force such as a linear motor or a voice coil motor. In the present embodiment, the driving apparatus 56 is able to move the second member 22 in at least the X axis direction.

In FIGS. 14 and 15, the driving apparatus 56 includes a stator 57 and a mover 58. The stator 57 is disposed at the apparatus frame 8B. The mover 58 is disposed at the moving frame 54. The mover 58 is connected to the second supporting member 52 (second member 22) via the moving frame 54.

The mover 58 is able to move in the X axis direction with respect to the stator 57. The mover 58 moves in the X axis direction, and thus, the second supporting member 52 (second member 22) connected to the mover 58 via the moving frame 54 moves in the X axis direction. The second supporting member 52 (second member 22) is moved in a state where the second supporting member 52 (second member 22) and the first supporting member 51 (first member 21) are at least partially opposite to each other via a gap.

In the present embodiment, the stator 57 is supported in a non-contact manner by the apparatus frame 8B. In the present embodiment, a gas bearing 59 is provided between the stator 57 and the apparatus frame 8B. By the gas bearing 59, the stator 57 is supported in a non-contact manner by the apparatus frame 8B.

In the present embodiment, the stator 57 moves in the −X direction by the movement in the +X direction of the mover 58. Moreover, by the movement in the −X direction of the mover 58, the stator 57 moves in the +X direction. That is, the stator 57 moves in the −X direction (+X direction) in at least a part of a period in which the mover 58 moves in the +X direction (−X direction).

By the movement of the stator 57, a reaction force which is caused by the movement of the mover 58 (the moving frame 54, the second supporting member 52, the second member 22) is cancelled, and a change of a gravity center position is suppressed. In the present embodiment, the stator 57 functions as a so-called counter mass.

In the present embodiment, since the stator 57 functions as the counter mass, even when the mover 58 moves in the X axis direction, occurrence of the vibration is suppressed.

In the present embodiment, the driving apparatus 56 includes a position adjustment apparatus 60 which adjust the position of the moving stator 57. In the present embodiment, the position adjustment apparatus 60 includes a damper using an electromagnetic force (a so-called electromagnetic damper). The electromagnetic damper is able to adjust a damping force (damping force characteristics).

Moreover, the position adjustment apparatus 60 may include a spring. By the position adjustment apparatus 60, for example, the moving stator 57 is returned to an initial position (an origin).

In the present embodiment, the driving apparatus 56 includes a position sensor 61 which detects positions of the stator 57 and the mover 58. The position sensor 61 includes a first sensor 61A which detects the position of the stator 57 and a second sensor 61B which detects the position of the mover 58. In the present embodiment, each of the first sensor 61A and the second sensor 61B includes an encoder. The first sensor 61A includes a scale member 61Aa which is disposed at the stator 57, and an encoder head 61Ab which detects the scale of the scale member 61Aa. The second sensor 61B includes a scale member 61Ba which is disposed at the mover 58, and an encoder head 61Bb which detects the scale of the scale member 61Ba. The positions of the encoder head 61Ab of the first sensor 61A and the encoder head 61Bb of the second sensor 61B are fixed.

The detection result of the position sensor 61 (first and second sensors 61A and 61B) are output to the controller 6. The controller 6 is able to obtain at least one of the position of the stator 57 (the position of the first sensor 61A with respect to the encoder head 61Ab), the position of the mover 58 (the position of the second sensor 61B with respect to the encoder head 61Bb), and a relative position between the stator 57 and the mover 58, based on the detection result of the position sensor 61. The controller 6 is able to control the driving apparatus 56 based on the detection result of the position sensor 61 so that the second member 22 is disposed at a desired position (the position in the X axis direction). Moreover, the controller 6 is able to control the driving apparatus 56 based on the detection result of the position sensor 61 so that the second member 22 moves within a desired movement range.

In addition, the controller 6 is able to control the driving apparatus 56 based on the detection result of the position sensor 61 so that the second member 22 moves at a desired speed. Moreover, the controller 6 is able to control the driving apparatus 56 based on the detection result of the position sensor 61 so that the second member 22 moves at a desired acceleration.

In addition, when the speed of the second member 22 is controlled, the controller 6 acquires speed information by calculation processing with respect to the detection value of the position sensor 61 and may control the speed of the second member 22 based on the speed information. Moreover, other than the position sensor 61, a speed sensor which is able to detect the speed of the second member 22 may be provided, and the speed of the second member 22 may be controlled based on the detection result of the speed sensor.

In addition, when the acceleration of the second member 22 is controlled, the controller 6 may acquire acceleration information by calculation processing with respect to the detection value of the position sensor 61 and may control the acceleration of the second member 22 based on the acceleration information. Moreover, other than the position sensor 61, an acceleration sensor which is able to detect the acceleration of the second member 22 may be provided, and the acceleration of the second member 22 may be controlled based on the detection result of the acceleration sensor.

Next, a method of exposing the substrate P using the exposure apparatus EX including the above-described configuration will be described.

In a substrate exchange position away from the liquid immersion member 5, processing which carries (loads) the substrate P before the exposure to the substrate stage 2 (first holding portion) is performed. Moreover, in at least a part of a period in which the substrate stage 2 is away from the liquid immersion member 5, the measurement stage 3 is disposed to be opposite to the terminal optical element 13 and the liquid immersion member 5. The controller 6 performs the supply of the liquid LQ from the liquid supply part 31 and the recovery of the liquid LQ from the fluid recovery part 27, and the liquid immersion space LS is formed at the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 are opposite to the substrate stage 2 (substrate P). In the state where the terminal optical element 13 and the liquid immersion member 5 are opposite to the substrate stage 2 (substrate P), the recovery of the liquid LQ from the fluid recovery part 27 is performed in parallel with the supply of the liquid LQ from the liquid supply part 31, and thus, the liquid immersion space LS is formed between the terminal optical element 13 and the liquid immersion member 5, and the substrate stage 2 (substrate P) so that the optical path K is filled with the liquid LQ.

In the present embodiment, the recovery of the liquid LQ from the fluid recovery part 24 is performed in parallel with the supply of the liquid LQ from the liquid supply part 31 and the recovery of the liquid LQ from the fluid recovery part 27.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ in the liquid immersion space LS between the projection optical system PL and the emitting surface 12, and the substrate P. Accordingly, the substrate P is exposed by the exposure light EL which is emitted from the emitting surface 12 via the liquid LQ in the liquid immersion space LS between the emitting surface 12 of the terminal optical element 13 and the substrate P, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the projection optical system PL and the liquid LQ in the liquid immersion space LS on the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 16:
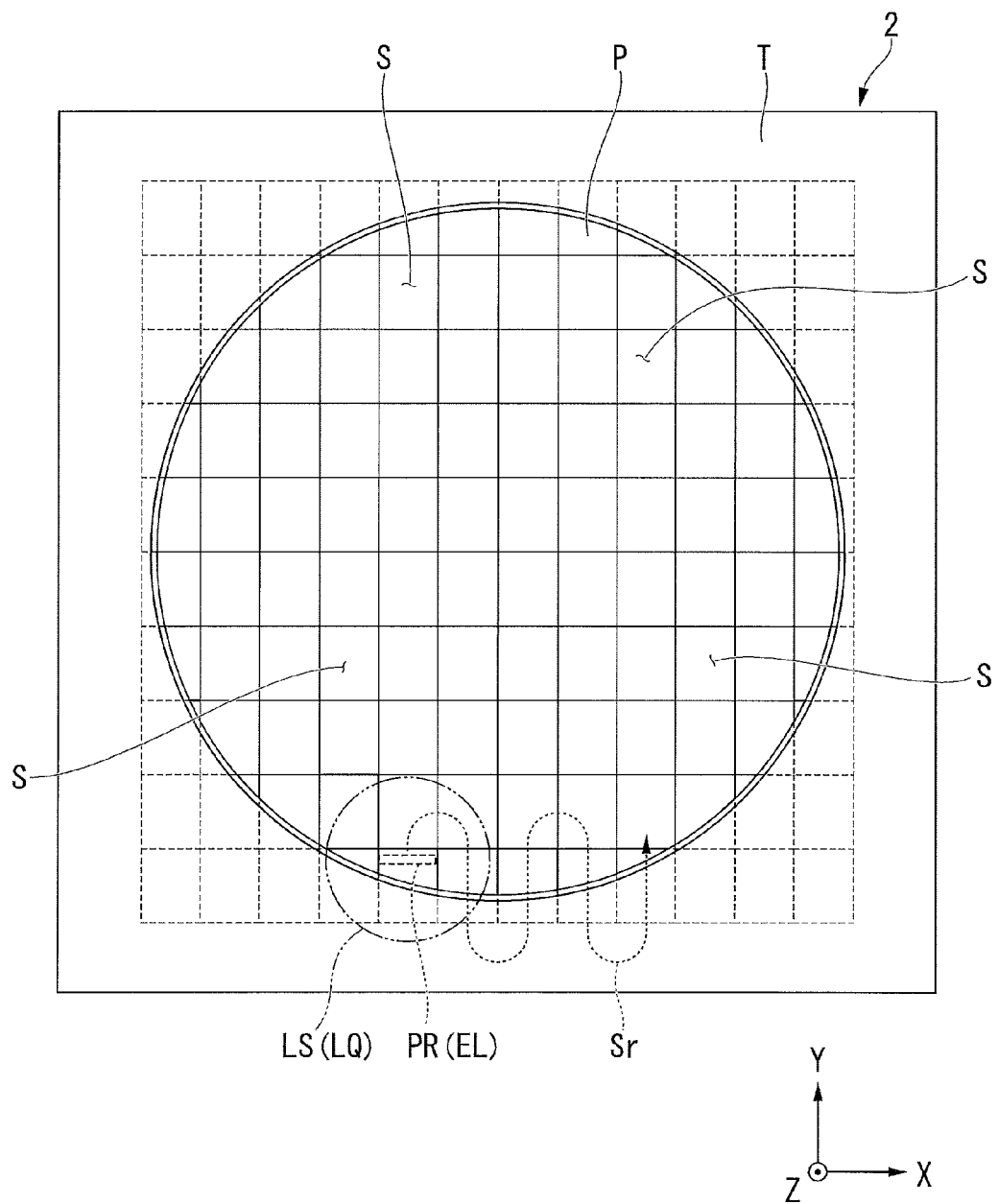
FIG. 16 is a view to explain an example of the operation of the exposure apparatus according to the first embodiment.

FIG. 16 is a view showing an example of the substrate P which is held by the substrate stage 2. In the present embodiment, a plurality of shot regions S, which are regions to be exposed on the substrate P, are arranged in a matrix form.

The controller 6 sequentially exposes the plurality of shot regions S of the substrate P by the exposure light EL emitted from the emitting surface 12 via the liquid LQ in the liquid immersion space LS between the emitting surface 12 and the substrate P while moving the substrate P held by the first holding portion in the Y axis direction (scanning direction) with respect to the exposure light EL emitted from the emitting surface 12 of the terminal optical element 13.

For example, in order to expose one shot region S of the substrate P, in the state where the liquid immersion space LS is formed, the controller 6 radiates the exposure light EL to the shot region S via the projection optical system PL and the liquid LQ in the liquid immersion space LS on the substrate P while moving the substrate P in the Y axis direction with respect to the exposure light EL emitted from the emitting surface 12 (the projection region PR of the projection optical system PL), and moving the mask M in the Y axis direction with respect to the illumination region IR of the illumination system IL in synchronization with the movement in the Y axis direction of the substrate P. Accordingly, the image of the pattern of the mask M is projected to the shot region S, and the shot region S is exposed by the exposure light EL which is emitted from the emitting surface 12.

After the exposure of the shot region S is terminated, in order to start the exposure of a next shot region S, in the state where the liquid immersion space LS is formed, the controller 6 moves the substrate P in the direction (for example, X axis direction, directions which are inclined with respect to the X axis direction and Y axis direction in the XY plane, or the like) which intersects the Y axis in the XY plane, and moves the next shot region S to an exposure starting position. Thereafter, the controller 6 starts the exposure of the shot region S.

The controller 6 repeats the operation which exposes the shot region while moving the shot region in the Y axis direction with respect to the position (projection region PR) radiated with the exposure light EL from the emitting surface 12 in the state where the liquid immersion space LS is formed above the substrate P (substrate stage 2), and after the exposure of the shot region, the operation which moves the substrate P in the direction (for example, X axis direction, directions which are inclined with respect to the X axis direction and Y axis direction in the XY plane, or the like) which intersects the Y axis direction in the XY plane so that the next shot region is disposed at the exposure start position in the state where the liquid immersion space LS is formed on the substrate P (substrate stage 2), and the controller sequentially exposes each of the plurality of shot regions of the substrate P.

In the descriptions below, the operation, which moves the substrate P (shot region) in the Y axis direction with respect to the position (projection region PR) radiated with the exposure light EL from the emitting surface 12 in a state where the liquid immersion space LS is formed above the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is terminated, is appropriately referred to as a step movement operation.

In the present embodiment, the scan movement operation includes an operation in which the substrate P moves in the Y axis direction from a state where a predetermined shot region S is placed at the exposure starting position to a state where the predetermined shot region is placed at the exposure termination position. The step movement operation includes an operation in which the substrate P moves in a direction intersecting the Y axis direction in the XY plane from a state where a predetermined shot region S is placed at the exposure termination position to a state where the next shot region S is placed at the exposure starting position.

The exposure starting position includes a position of the substrate P when one end in the Y axis direction of a predetermined shot region S passes through the projection region PR in order to expose the shot region S. The exposure termination position includes a position of the substrate P when the other end in the Y axis direction of the shot region S, which was radiated by the exposure light EL, passes through the projection region PR.

The exposure starting position of the shot region S includes a starting position of the scan movement operation in order to expose the shot region S. The exposure starting position of the shot region S includes a termination position of the step movement operation in order to dispose the shot region S at the exposure starting position.

The exposure termination position of the shot region S includes a termination position of the scan movement operation in order to expose the shot region S. The exposure termination position of the shot region S includes a starting position of the step movement operation in order to place the next shot region S at the exposure starting position after the exposure of the shot region S is terminated.

In the descriptions below, a period, in which the scan movement operation is performed in order to expose a predetermined shot region S, is appropriately referred to as a scan movement period. In the descriptions below, a period, in which the step movement operation is performed in order to start the exposure of the next shot region S after the exposure termination of a predetermined shot region S, is appropriately referred to as a step movement period.

The scan movement period includes the exposure period from the exposure start of a predetermined shot region S to the exposure termination. The step movement period includes a movement period of the substrate P from the exposure termination of a predetermined shot region S to the exposure start of the next shot region S.

In the scan movement operation, the exposure light EL is emitted from the emitting surface 12. In the scan movement operation, the exposure light EL is radiated to the substrate P (object). In the step movement operation, the exposure light EL is not emitted from the emitting surface 12. In the step movement operation, the exposure light EL is not radiated to the substrate P (object).

The controller 6 sequentially exposes each of the plurality of shot regions S of the substrate P while repeating the scan movement operation and the step movement operation. Moreover, the scan movement operation is an equal speed movement mainly with respect to the Y axis direction. The step movement operation includes acceleration and deceleration movement. For example, the step movement operation between from the exposure termination of a predetermined shot region S to the exposure start of the next shot region S includes one or both of the acceleration and deceleration movement with respect to the Y axis direction and the acceleration and deceleration movement with respect to the X axis direction.

Moreover, there is a case where at least a portion of the liquid immersion space LS may be formed above the substrate stage 2 (cover member T) in at least a portion of the scan movement operation and the step movement operation. There is a case where the liquid immersion space LS may be formed over the substrate P and the substrate stage 2 (cover member T) in at least a part of the scan movement operation and the step movement operation. When the exposure of the substrate P is performed in a state where the substrate stage 2 and the measurement stage 3 approach or contact each other, there is a case where the liquid immersion space LS may be formed over the substrate stage 2 (cover member T) and the measurement stage 3 in at least a part of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage apparatus 7.

The exposure conditions (exposure control information) include a plurality of arrangement information of the shot region S (the position of each of the plurality of shot regions S in the substrate P). Moreover, the exposure conditions (exposure control information) include size information (size information with respect to the Y axis direction) of each of the plurality of shot regions S.

The controller 6 sequentially exposes each of the plurality of shot regions S while moving the substrate P by a predetermined movement condition based on the exposure conditions (exposure control information) stored in the storage apparatus 7. The movement conditions of the substrate P (object) include at least one of the movement speed, the acceleration, the movement distance, the movement direction, and the movement locus in the XY plane.

As an example, when each of the plurality of shot regions S are sequentially exposed, the controller 6 radiates the exposure light EL to the projection region PR while moving the substrate stage 2 so that the projection region PR of the projection optical system PL and the substrate P relatively move along a movement locus shown by an arrow Sr in FIG. 16, and sequentially exposes each of the plurality of shot regions S via the liquid LQ by the exposure light EL. The controller 6 sequentially exposes each of the plurality of shot regions S while repeating the scan movement operation and the step movement operation.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. For example, the second member 22 moves in parallel with at least a portion of the scan movement operation of the substrate P (substrate stage 2) in the state where the liquid immersion space LS is formed. The exposure light EL is emitted from the emitting surface 12 in parallel with the movement of the second member 22. In addition, the second member 22 may not move during the scan movement operation. That is, the second member 22 may not move in parallel with the emission of the exposure light EL from the emitting surface 12. For example, the second member 22 may move so that the relative movement (relative speed, relative acceleration) between the second member and the substrate P (substrate stage 2) is decreased when the substrate P (substrate stage 2) performs the step movement operation. In addition, the second member 22 may move so that the relative movement (relative speed, relative acceleration) between the second member and the substrate P (substrate stage 2) is decreased when the substrate P (substrate stage 2) performs the scan movement operation.

Figure 17:
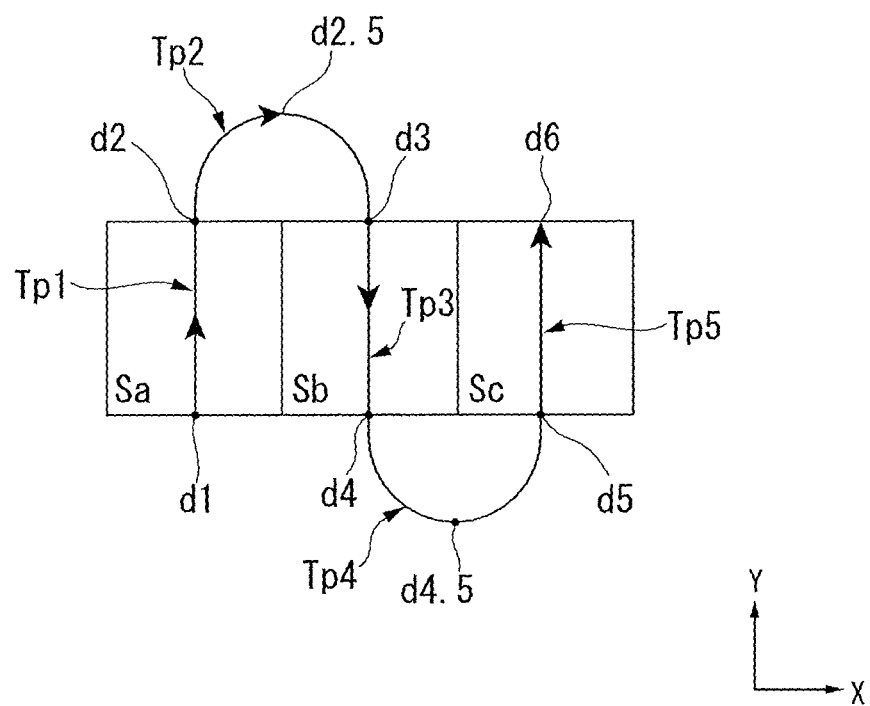
FIG. 17 is a schematic view to explain an example of the operation of the exposure apparatus according to the first embodiment.

FIG. 17 is a view schematically showing an example of the movement locus of the substrate P when sequentially exposing each of a shot region Sa, a shot region Sb, and a shot region Sc while performing the step movement which includes the components in the +X direction on the substrate P. The shot regions Sa, Sb, and Sc are disposed in the X axis direction.

As shown in FIG. 17, when the shot regions Sa, Sb, and Sc are exposed, the substrate P sequentially moves a pathway Tp1 from a position d1 to a position d2 adjacent at the +Y side with respect to the position d1, a pathway Tp2 from the position d2 to a position d3 adjacent at the +X side with respect to the position d2, a pathway Tp3 from the position d3 to a position d4 adjacent at the —Y side with respect to the position d3, a pathway Tp4 from the position d4 to a position d5 adjacent at the +X side with respect to the position d4, and a pathway Tp5 from the position d5 to a position d6 adjacent at the +Y side with respect to the position d5, under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2. 5. The pathway Tp4 includes a curved line passing through a position d4. 5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the +Y direction. The pathway Tp3 is a pathway on which the substrate P moves in the −Y direction. The pathway Tp5 is a pathway on which the substrate P moves in the +Y direction. The pathway Tp2 and the pathway Tp4 are pathways on which the substrate P moves in the direction which has the +X direction as the main component.

When the substrate P moves on the pathway Tp1 in the state where the liquid immersion space LS is formed, the exposure light EL is radiated to the shot region Sa via the liquid LQ. When the substrate P moves on the pathway Tp3 in the state where the liquid immersion space LS is formed, the exposure light EL is radiated to the shot region Sb via the liquid LQ. When the substrate P moves on the pathway Tp5 in the state where the liquid immersion space LS is formed, the exposure light EL is radiated to the shot region Sc via the liquid LQ. When the substrate P moves on the pathway Tp2 and the pathway Tp4, the exposure light EL is not radiated.

Each of the operations in which the substrate P moves the pathway Tp1, the operation in which the substrate P moves the pathway Tp3, and the operation in which the substrate P moves the pathway Tp5 includes the scan movement operation. Moreover, each of the operations in which the substrate P moves the pathway Tp2 and the operation in which the substrate P moves the pathway Tp4 includes the step movement operation.

That is, each of the periods in which the substrate P moves the pathway Tp1, the period in which the substrate P moves the pathway Tp3, and the period in which the substrate P moves the pathway Tp5 includes the scan movement period (exposure period). Each of the periods in which the substrate P moves the pathway Tp2 and the period in which the substrate P moves the pathway Tp4 includes the step movement period.

Figure 18:
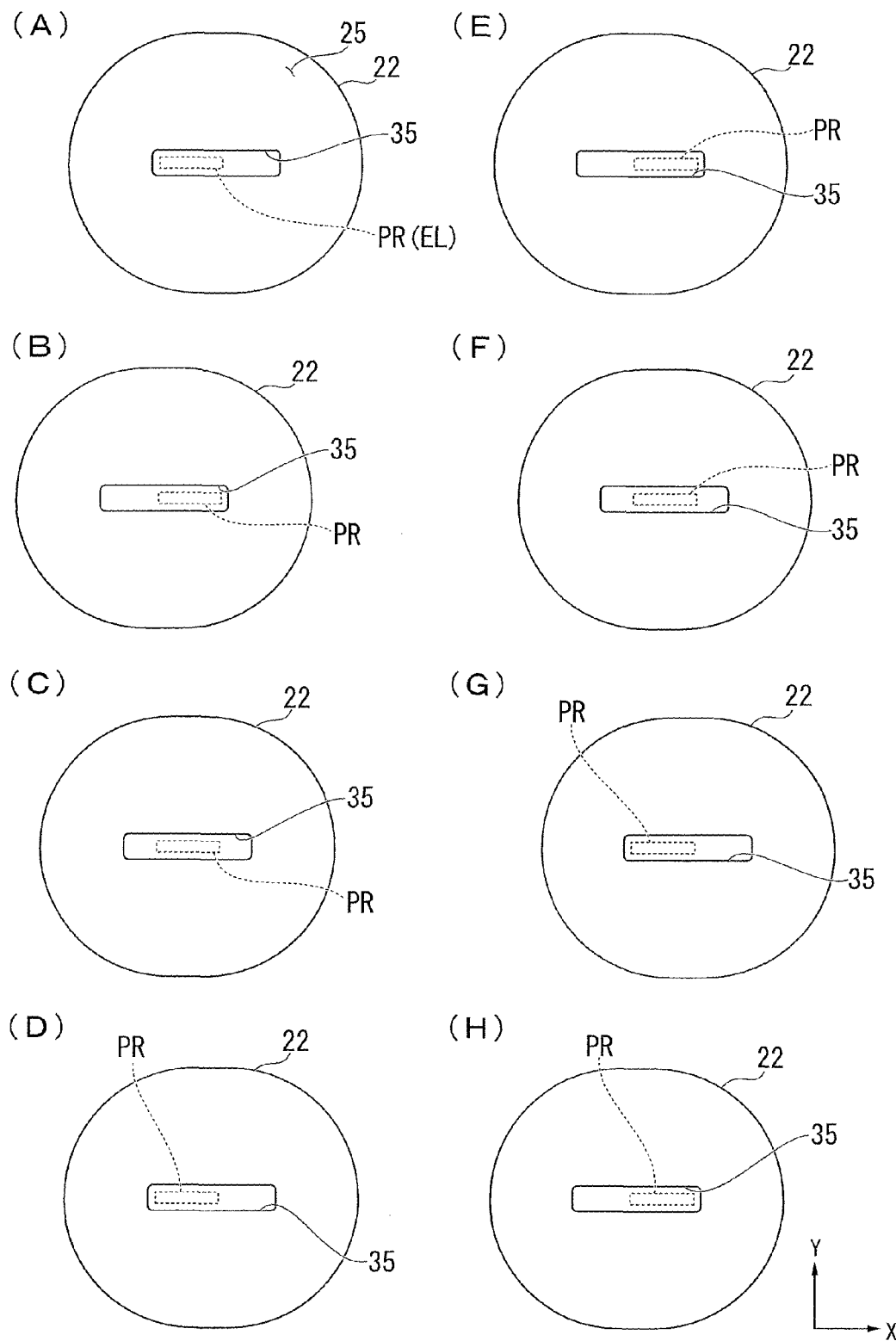
FIG. 18 is a schematic view showing an example of an operation of the liquid immersion member according to the first embodiment.

FIG. 18 is a schematic view showing an example of the operation of the second member 22. FIG. 18 is a view when the second member 22 is viewed from the upper surface 25 side. When the substrate P is positioned at the position d1, the second member 22 is disposed at the position shown in FIG. 18(A) with respect to the projection region PR (the optical path K of the exposure light EL). When the substrate P is positioned at the position d2, the second member 22 is disposed at the position shown in FIG. 18(B) with respect to the projection region PR (the optical path K of the exposure light EL). That is, during the scan movement operation of the substrate P from the position d1 to the position d2, the second member 22 moves in the −X direction, which is opposite to the direction (+X direction) of the step movement of the substrate P. When the substrate P is positioned at the position d2.5, the second member 22 is disposed at the position shown in FIG. 18(C) with respect to the projection region PR (the optical path K of the exposure light EL). When the substrate P is positioned at the position d3, the second member 22 is disposed at the position shown in FIG. 18(D) with respect to the projection region PR (the optical path K of the exposure light EL). That is, during the step movement operation of the substrate P from the position d2 to the position d3, the second member 22 moves in the +X direction, which is the same as the direction (+X direction) of the step movement of the substrate P. When the substrate P is positioned at the position d4, the second member 22 is disposed at the position shown in FIG. 18(E) with respect to the projection region PR (the optical path K of the exposure light EL). That is, during the scan movement operation of the substrate P from the position d3 to the position d4, the second member 22 moves in the −X direction, which is opposite to the direction (+X direction) of the step movement of the substrate P. When the substrate P is positioned at the position d4.5, the second member 22 is disposed at the position shown in FIG. 18(F) with respect to the projection region PR (the optical path K of the exposure light EL). When the substrate P is positioned at the position d5, the second member 22 is disposed at the position shown in FIG. 18(G) with respect to the projection region PR (the optical path K of the exposure light EL). That is, during the step movement operation of the substrate P from the position d4 to the position d5, the second member 22 moves in the +X direction, which is the same as the direction (+X direction) of the step movement of the substrate P. When the substrate P is positioned at the position d6, the second member 22 is disposed at the position shown in FIG. 18(H) with respect to the projection region PR (the optical path K of the exposure light EL). That is, during the scan movement operation of the substrate P from the position d5 to the position d6, the second member 22 moves in the −X direction, which is opposite to the direction (+X direction) of the step movement of the substrate P.

In the present embodiment, the positions of the second member 22 shown in FIGS. 18(A), 18(D), and 18(G) include the second end part position. The positions of the second member 22 shown in FIGS. 18(B), 18(E), and 18(H) include the first end part position. The positions of the second member 22 shown in FIGS. 12(C) and 12(F) include the center position.

In the descriptions below, the positions of the second member 22 shown in FIGS. 18(A), 18(D), and 18(G) are set to the second end part position, the positions of the second member 22 shown in FIGS. 18(B), 18(E), and 18(H) are set to the first end part position, and the positions of the second member 22 shown in FIGS. 18(C) and 18(F) are set to the center position.

When the substrate P moves on the pathway Tp1, the second member 22 moves in the −X direction so as to be changed from the state shown in FIG. 18(A) to the state shown in FIG. 18(B). That is, the second member 22 moves from the second end part position to the first end part position via the center position. When the substrate P moves on the pathway Tp2, the second member 22 moves in the +X direction so as to be changed from the state shown in FIG. 18(B) to the state shown in FIG. 18(D) via the state shown in FIG. 18(C). That is, the second member 22 moves from the first end part position to the second end part position via the center position. When the substrate P moves on the pathway Tp3, the second member 22 moves in the −X direction so as to be changed from the state shown in FIG. 18(D) to the state shown in FIG. 18(E). That is, the second member 22 moves from the second end part position to the first end part position via the center position. When the substrate P moves on the pathway Tp4, the second member 22 moves in the +X direction so as to be changed from the state shown in FIG. 18(E) to the state shown in FIG. 18(G) via the state shown in FIG. 18(F). That is, the second member 22 moves from the first end part position to the second end part position via the center position. When the substrate P moves on the pathway Tp5, the second member 22 moves in the −X direction so as to be changed from the state shown in FIG. 18(G) to the state shown in FIG. 18(H). That is, the second member 22 moves from the second end part position to the first end part position via the center position.

That is, in the present embodiment, the second member 22 moves in the +X direction so that the relative movement between the second member and the substrate P is decreased in at least a part of a period in which the substrate P moves along the pathway Tp2. In other words, the second member 22 moves in the +X direction so that the relative speed between the second member and the substrate P with respect to the X axis direction is decreased in at least a part of a period in which the substrate P performs the step movement operation which includes the component in the +X direction. Similarly, the second member 22 moves in the +X axis direction so that the relative speed between the second member and the substrate P with respect to the X direction is decreased in at least a part of a period in which the substrate P moves along the pathway Tp4.

Moreover, in the present embodiment, the second member 22 moves in the −X direction in at least a part of a period in which the substrate P moves along the pathway Tp3. Accordingly, after the movement of the substrate P on the pathway Tp3, during in the movement of the pathway Tp4, even when the second member 22 moves in the +X direction, the exposure light EL is able to pass through the opening 35. Also in the case where the substrate P moves on the pathways Tp1 and Tp5, the exposure light is able to pass through the opening.

That is, when the substrate P repeats the scan movement operation and the step movement operation including the component in the +X direction, during the step movement operation, the second member 22 moves in the +X direction from the first end part position to the second end part position so that the relative speed between the second member and the substrate P is decreased, and during the scan movement operation, the second member 22 returns from the second end part position to the first end part position so that the second member 22 moves in the +X direction again in the next step movement operation. That is, since the second member 22 moves in −X direction in at least a part of a period in which the substrate P performs the vertical scan movement operation, the size of the opening 35 can be suppressed to the required minimum.

Moreover, in the embodiment, even when the second member 22 is disposed at the first end part position (second end part position), at least a portion of the fluid recovery part 27 is continuously opposite to the substrate P (object). Accordingly, for example, in the step movement operation, the fluid recovery part 27 is able to recover the liquid LQ on the substrate P (object).

Moreover, in the example described using FIGS. 17 and 18, when the substrate P is positioned at the positions d1, d3, and d5, the second member 22 is disposed at the second end part position. When the substrate P is positioned at the positions d1, d3, and d5, the second member 22 may be disposed at the center position and may be disposed between the center position and the second end part position.

In addition, in the example described using FIGS. 17 and 18, when the substrate P is positioned at the positions d2, d4, and d6, the second member 22 is disposed at the first end part position. When the substrate P is positioned at the positions d2, d4, and d6, the second member 22 may be disposed at the center position and may be disposed between the center position and the first end part position.

Moreover, when the substrate P is positioned at the positions d2.5 and d4.5, the second member 22 may be disposed at positions different from the center position. That is, when the substrate P is positioned at the positions d2.5 and d4.5, for example, the second member 22 may be disposed between the center position and the second end part position and may be disposed between the center position and the first end part position.

Due to the movement of the second member 22, vibration may occur. Moreover, due to the operation of the driving apparatus 56, vibration may occur. In the present embodiment, the second member 22 is supported by the apparatus frame 8B via the second supporting member 52, the moving frame 54, or the like. In addition, the driving apparatus 56 is also supported by the apparatus frame 8B. In the present embodiment, the vibration isolator 10 is disposed between the apparatus frame 8B and the reference frame 8A. Accordingly, even when vibration occurs due to the movement of the second member 22, the operation of the driving apparatus 56, or the like, by the vibration isolator 10, the vibration is suppressed from being transmitted to the reference frame 8A. Therefore, the vibration of the terminal optical element 13 (projection optical system PL) and the change in the position of the terminal optical element 13 (projection optical system PL) are suppressed.

Moreover, in the present embodiment, the vibration isolator 55 is provided to suppress the vibration of the first member 21. In the present embodiment, the vibration isolator 55 is disposed between the apparatus frame 8B and the support frame 53. Accordingly, even when vibration occurs due to the movement of the second member 22, the operation of the driving apparatus 56, or the like, by the vibration isolator 55, the vibration is suppressed from being transmitted to the support frame 53. Therefore, the vibration of the first member 21 and the change in the position of the first member 21 are suppressed.

In the present embodiment, the second member 22 moves in the plane which is substantially perpendicular to the optical axis of the terminal optical element 13. In this case, the first member 21 may vibrate not only in the X axis direction and the Y axis direction but also in the Z axis direction which is substantially parallel to the optical axis of the terminal optical element 13. Moreover, the position of the first member 21 with respect to the Z axis direction may be changed. In this case, for example, the size (the size of the third space SP3) of the gap between the first member 21 and the terminal optical element 13 may be changed, the pressure of the third space SP3 may be changed, the terminal optical element 13 may be displaced (or deformed) due to the change of the pressure of the third space SP3, or the liquid LQ may flow out from the third space SP3. In addition, if the first member 21 vibrates in the Z axis direction or the position of the first member 21 with respect to the Z axis direction is changed, there is a possibly that the size of the gap (the size of the second space SP2) between the first member 21 and the object (at least one of the substrate P, the substrate stage 2, and the measurement stage 3) is changed, the pressure of the second space SP2 is changed, the object is displaced (or deformed) due to the change in the pressure of the second space SP2, and the liquid LQ flows out from the second space SP2. As a result, there is a possibility that an exposure failure occurs or a defective device is obtained.

In the present embodiment, the vibration isolator 55 is able to suppress the vibration of the first member 21 with respect to at least the Z axis direction. Moreover, in the present embodiment, the vibration isolator 55 is able to move the first member 21 so that the displacement of the first member 21 with respect to at least the Z axis direction is suppressed. Accordingly, occurrence of the exposure failure and occurrence of the defective device are suppressed.

Moreover, in the present embodiment, the vibration isolator 55 is able to suppress the vibration of the first member 21 with respect to not only the Z axis direction but also to six directions of the X axis, the Y axis, the Z axis, the θX, the θY, and the θZ, and is able to move the first member 21 so that the displacement of the first member 21 with respect to six directions is suppressed. When the first member 21 may vibrate or may be displaced in at least one direction of six directions, the vibration and the displacement are favorably suppressed due to the movement of the second member 22. Accordingly, occurrence of the exposure failure and occurrence of the defective device are effectively suppressed.

In addition, in the present embodiment, the vibration isolator 55 may suppress the vibration of the first member 21 only with respect to the Z axis direction. Moreover, the vibration isolator 55 may move the first member 21 so that the displacement of the first member 21 is suppressed only with respect to the Z axis direction.

Moreover, in the present embodiment, the vibration isolator 55 may suppress the vibration of the first member 21 with respect to any of two to five optional directions of six directions of the X axis, the Y axis, the Z axis, the θX, the θY, and the θZ. Moreover, the vibration isolator 55 may move the first member 21 in order to suppress the displacement of the first member 21 with respect to any of two to five optional directions of six directions of the X axis, the Y axis, the Z axis, the θX, the θY, and the θZ. For example, the vibration isolator 55 may be operated based on a direction (or a direction with a high vibration level) with a high possibility of an occurrence of the vibration of the first member 21 or a direction (or a direction with a high displacement level) with a high possibility of an occurrence of the displacement of the first member 21.

In the present embodiment, the first member 21 is moved by the vibration isolator 55 based on the detection result of the detection apparatus 62. Accordingly, the displacement of the first member 21 with respect to the terminal optical element 13 (reference member) is favorably suppressed.

Moreover, in the present embodiment, the vibration isolator 55 is operated so that the vibration of the first member 21 is suppressed based on the detection result of the detection apparatus 63. Accordingly, the vibration of the first member 21 is favorably suppressed.

In addition, the vibration isolator 55 may be controlled so that the displacement of the first member 21 is suppressed based on the detection result of the detection apparatus 63. Moreover, the vibration isolator 55 may be controlled so that the vibration of the first member 21 is suppressed based on the detection result of the detection apparatus 62.

In addition, in the present embodiment, the controller 6 may control the vibration isolator 55 without using the detection results from the detection apparatuses 62 and 63.

For example, when vibration conditions (at least one of frequency, amplitude, a vibration direction, and a vibration mode) of the first member 21 are changed based on the movement conditions of the second member 22, the vibration isolator 55 may be controlled so that the vibration of the first member 21 is suppressed based on the movement conditions of the second member 22.

For example, when a relationship between the movement conditions of the second member 22 and the vibration conditions of the first member 21 are stored in the storage apparatus 7, the controller 6 may control the vibration isolator 55 so that the vibration of the first member 21 is suppressed based on the information from the storage apparatus 7.

For example, as described referring to FIGS. 16 to 18, when the movement conditions of the object (substrate P or the like) based on the exposure recipe (exposure control information) are determined and the movement conditions of the second member 22 based on the movement conditions of the objet are determined, it is possible to obtain information with respect to the vibration conditions of the first member 21 based on the movement conditions of the second member 22 before the liquid immersion space LS is formed on the object (or before the substrate P is exposed). In addition, for example, the information with respect to the vibration conditions of the first member 21 is able to be obtained by a preliminary experiment (an identification experiment with respect to the first member 21, or the like), simulation, or the like, in advance.

Accordingly, by storing in the storage apparatus 7 the relationships between the movement conditions of the second member 22 and the vibration conditions of the first member 21, which are acquired in advance by the identification experiment, simulation, or the like, before the liquid immersion space LS is formed on the object or the substrate P is exposed, it is possible for the controller 6 to control the vibration isolator 5 so that the vibration of the first member 21 based on the information of the storage apparatus 7 is suppressed.

Moreover, when the displacement conditions (at least one of a displacement amount and a displacement direction) of the first member 21 are changed based on the movement conditions of the second member 22, the vibration isolator 55 may be controlled so that the displacement of the first member 21 is suppressed based on the movement conditions of the second member 22.

For example, when relationships between the movement conditions of the second member 22 and the positions of the first member 21 with respect to the reference member (terminal optical element 13 or the like) are stored in the storage apparatus 7, the controller 6 may control the vibration isolator 55 so that the displacement of the first member 21 is suppressed based on the information of the storage apparatus 7.

For example, as described referring to FIGS. 16 to 18, when the movement conditions of the object (substrate P or the like) based on the exposure recipe (exposure control information) are determined and the movement conditions of the second member 22 based on the movement conditions of the object are determined, the information related to the position of the first member 21 with respect to the reference member is able to be obtained based on the movement conditions of the second member 22 before the liquid immersion space LS is formed on the object (or before the substrate P is exposed). Moreover, for example, the information with respect to the position of the first member 21 is able to be obtained by a preliminary experiment, simulation, or the like, in advance.

Accordingly, by storing in the storage apparatus 7 the relationships between the movement conditions of the second member 22 and the positions of the first member 21 with respect to the reference member, which are acquired in advance by the preliminary experiment, simulation, or the like, before the liquid immersion space LS is formed on the object or the substrate P is exposed, it is possible for the controller 6 to control the vibration isolator 5 so that the displacement of the first member 21 based on the information of the storage apparatus 7 is suppressed.

That is, in the present embodiment, the controller 6 is able to perform a feedback control, which controls the vibration isolator 55, based on the detection results of the detection apparatuses 62 and 63. Moreover, the controller 6 is able to perform a feed-forward control, which controls the vibration isolator 55, based on the information of the storage apparatus 7.

As described above, according to the present embodiment, since the vibration isolator 55 is provided, occurrence of exposure failure and occurrence of a defective device can be suppressed.

Moreover, in the present embodiment, the first member 21 may vibrate regardless of the movement of the second member 22. The vibration isolator 55 may suppress the vibration of the first member 21 regardless of the movement of the second member 22.

In addition, in the present embodiment, the first member 21 may be displaced regardless of the movement of the second member 22. The vibration isolator 55 may suppress the displacement of the first member 21 regardless of the movement of the second member 22.

Moreover, in the present embodiment, the vibration isolator 55 may be a so-called passive type vibration isolator which does not include an actuator and includes a damping apparatus (damper).

In addition, in the present embodiment, the first member 21 may be supported by the reference frame 8A.

Moreover, in the present embodiment, at least a portion of the reference frame 8A and the support frame 53 may be the same member.

Figure 19:
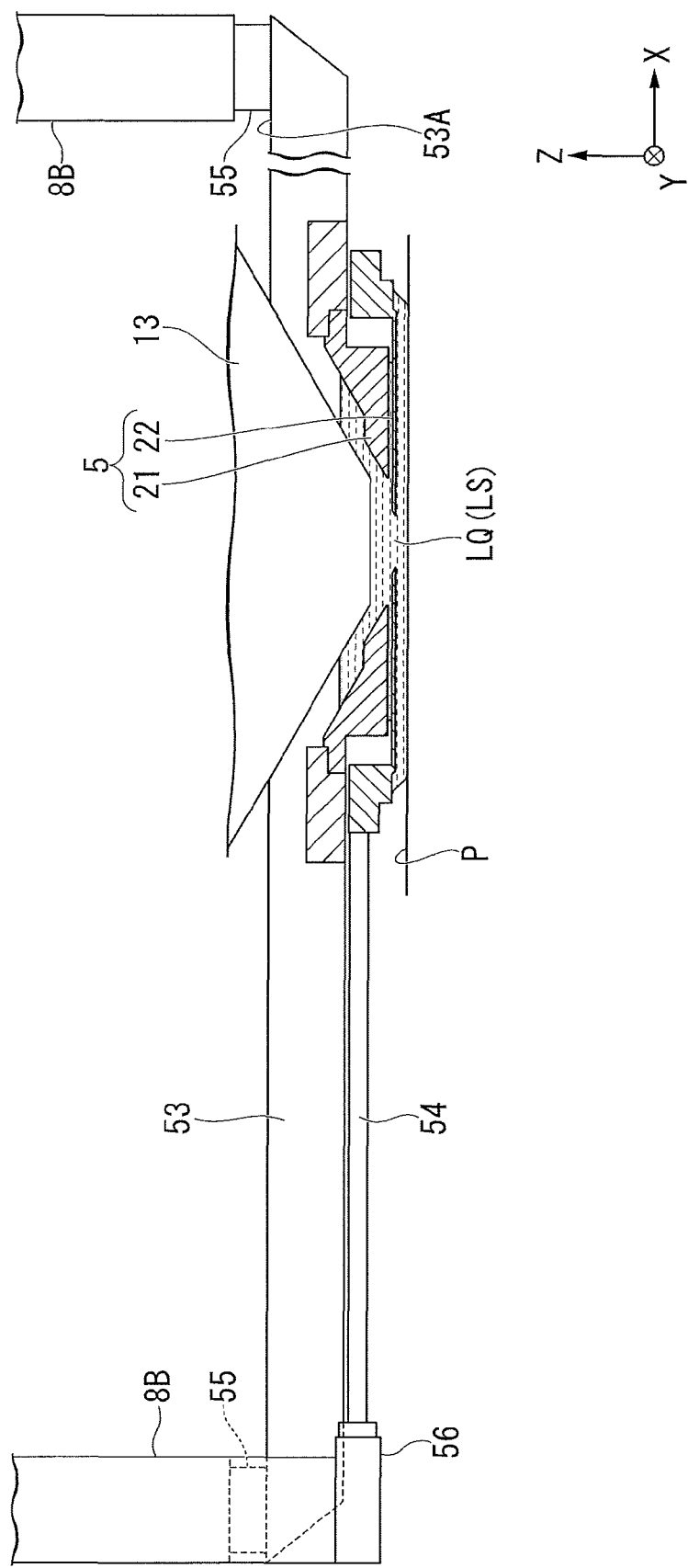
FIG. 19 is a view showing an example of the supporting apparatus according to the first embodiment.

In addition, as shown in FIG. 19, the vibration isolator 55 may be disposed to be opposite to the upper surface 53A of the support frame 53 facing the +Z direction. For example, at least a portion of the apparatus frame 8B is disposed above the support frame 53, and the vibration isolator 55 may be disposed to be suspended from the apparatus frame 8B. The vibration isolator 55, which is suspended from the apparatus frame 8B, may hold the support frame 53 in a suspending manner. That is, the support frame 53 may be disposed to be suspended from the vibration isolator 55.

Moreover, as shown in FIG. 19, the driving apparatus 56 may be disposed below the apparatus frame 8B. That is, the driving apparatus 56 may be disposed to be suspended from the apparatus frame 8B.

Moreover, in the present embodiment, the liquid immersion member 5 does not include a channel which fluidly connects the first space SP1 and the second space SP2 except for the opening 35. For example, an opening (hole) which fluidly connects the first space SP1 and the second space SP2 may be formed outside the opening 35 with respect to the optical path K.

Moreover, in the present embodiment, the supply port, which supplies the liquid LQ to the first space SP1, may be provided on at least one of the first member 21 and the second member 22. For example, a supply port supplying the liquid LQ may be provided at the lower surface 23 of the first member 21 between the opening 34 and the liquid recovery part 24.

Second Embodiment

A second embodiment will be described. In the descriptions below, the same reference numerals are attached to the same or similar components as those of the above-described embodiment, and the descriptions thereof are simplified or omitted.

Figure 20:
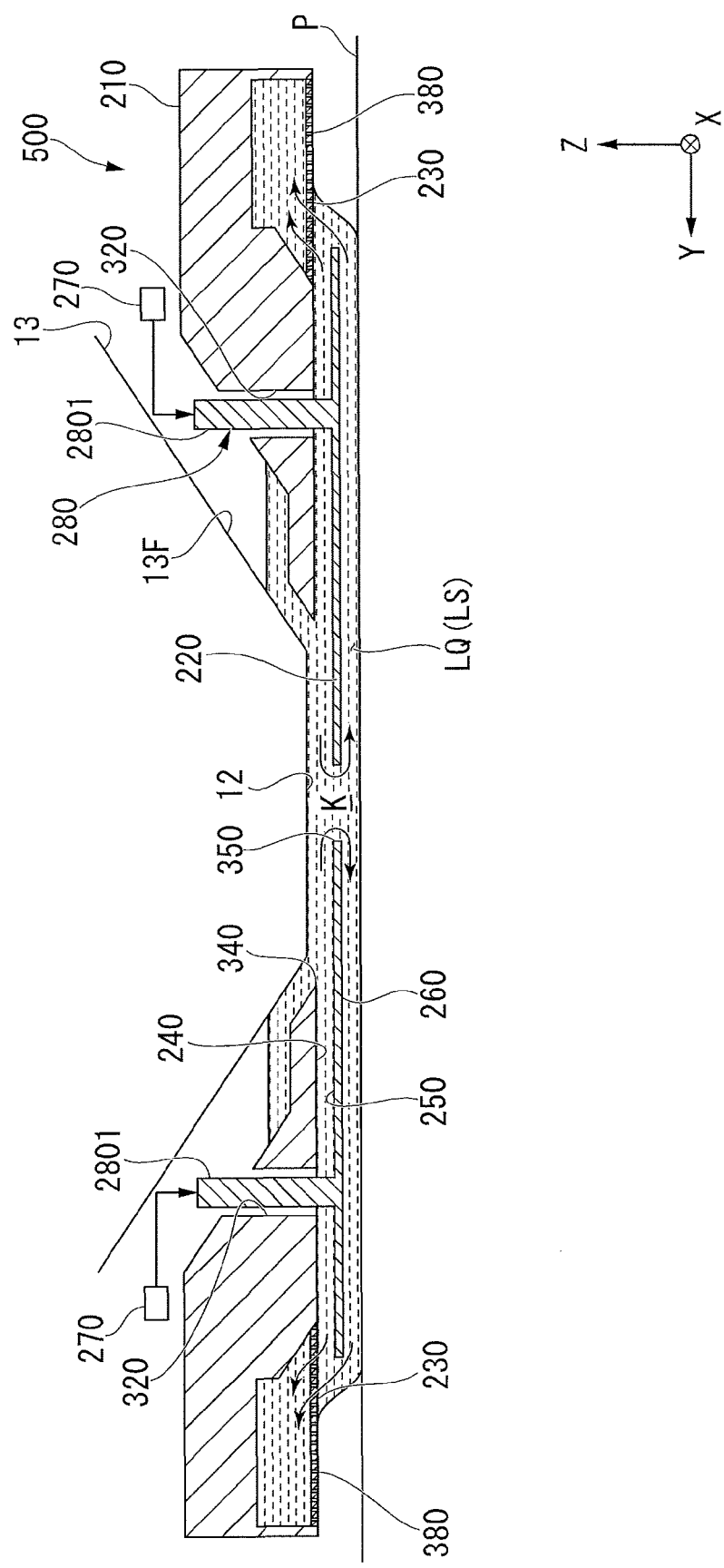
FIG. 20 is a side cross-sectional view showing an example of a liquid immersion member according to a second embodiment.
Figure 21:
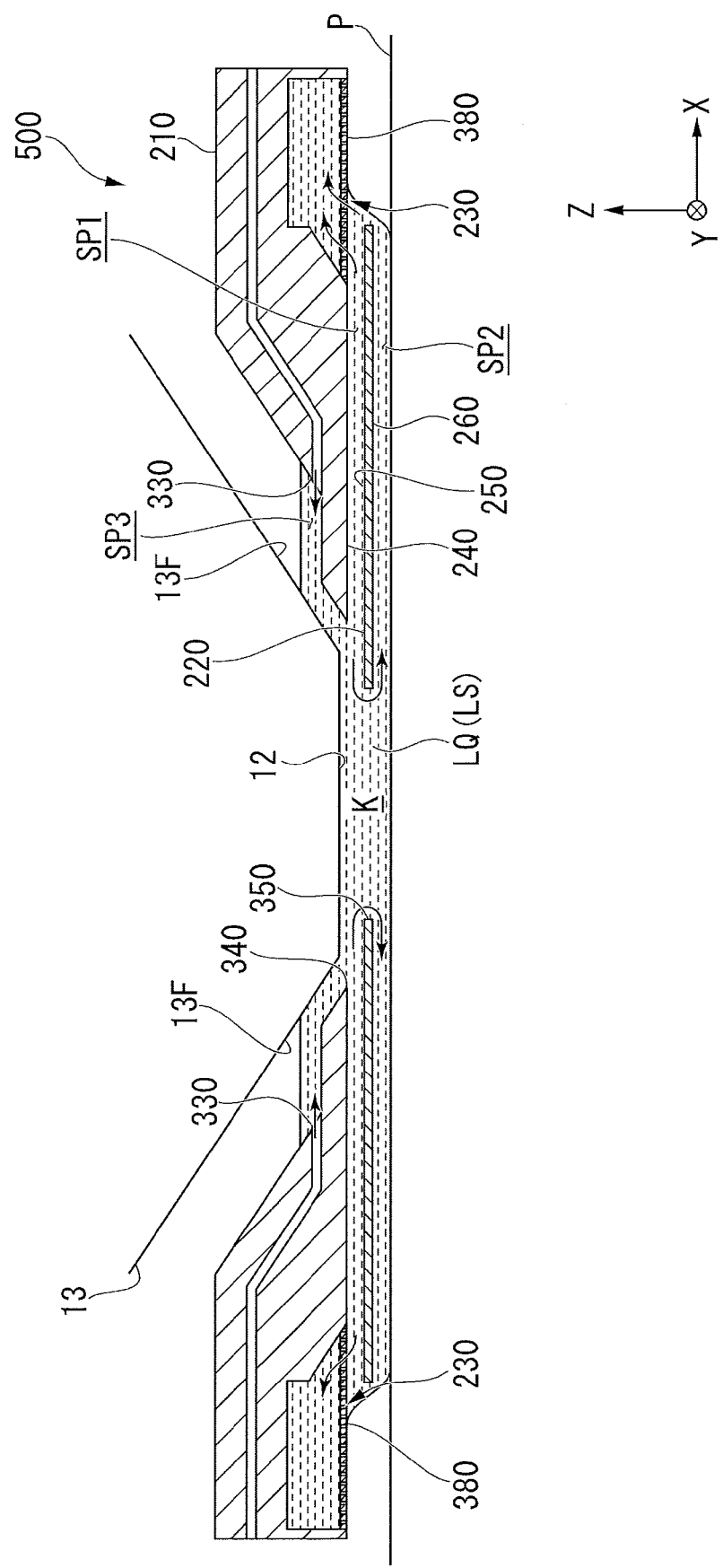
FIG. 21 is a side cross-sectional view showing an example of the liquid immersion member according to the second embodiment.
Figure 22:
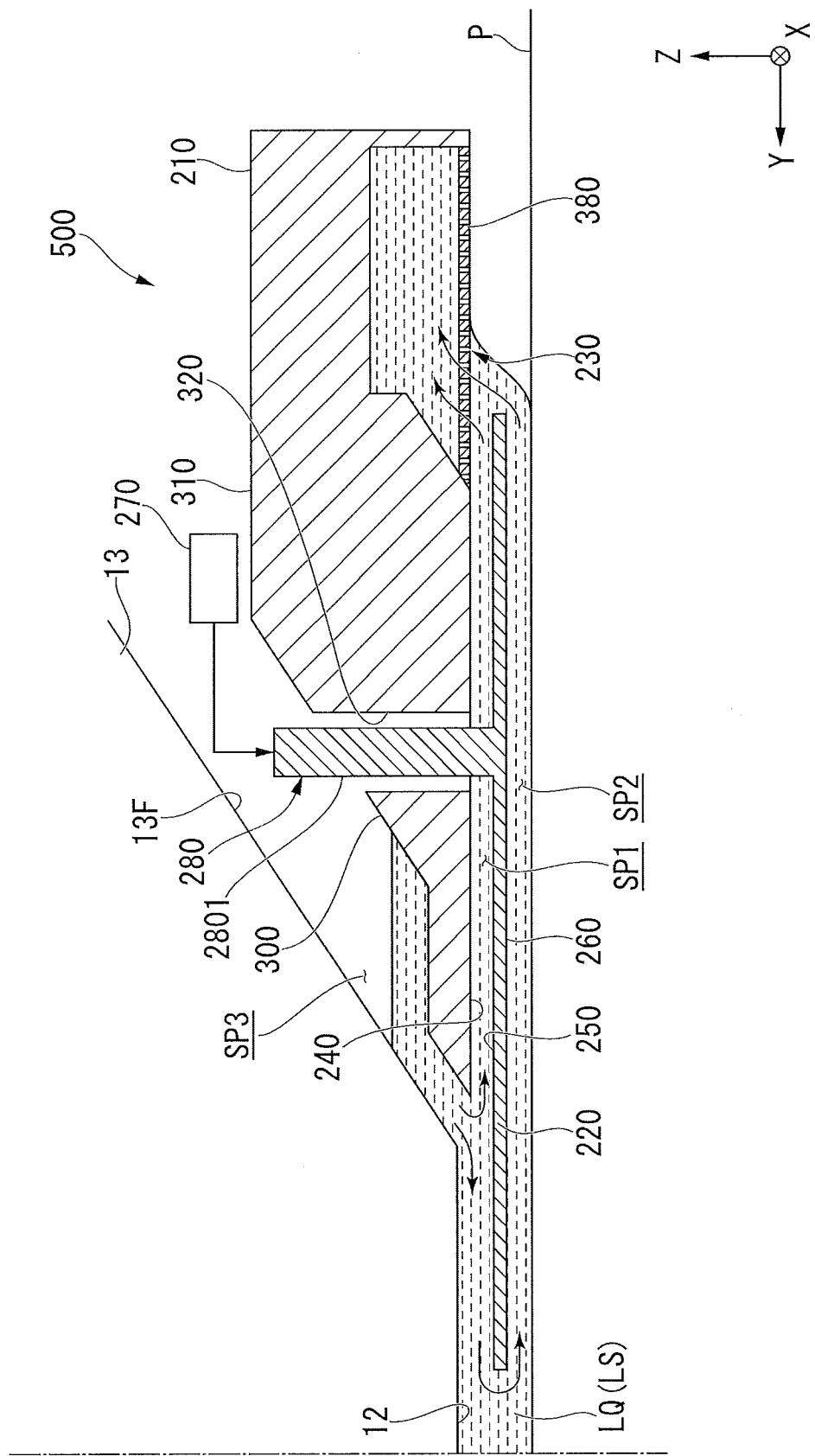
FIG. 22 is a side cross-sectional view showing an example of the liquid immersion member according to the second embodiment.
Figure 23:
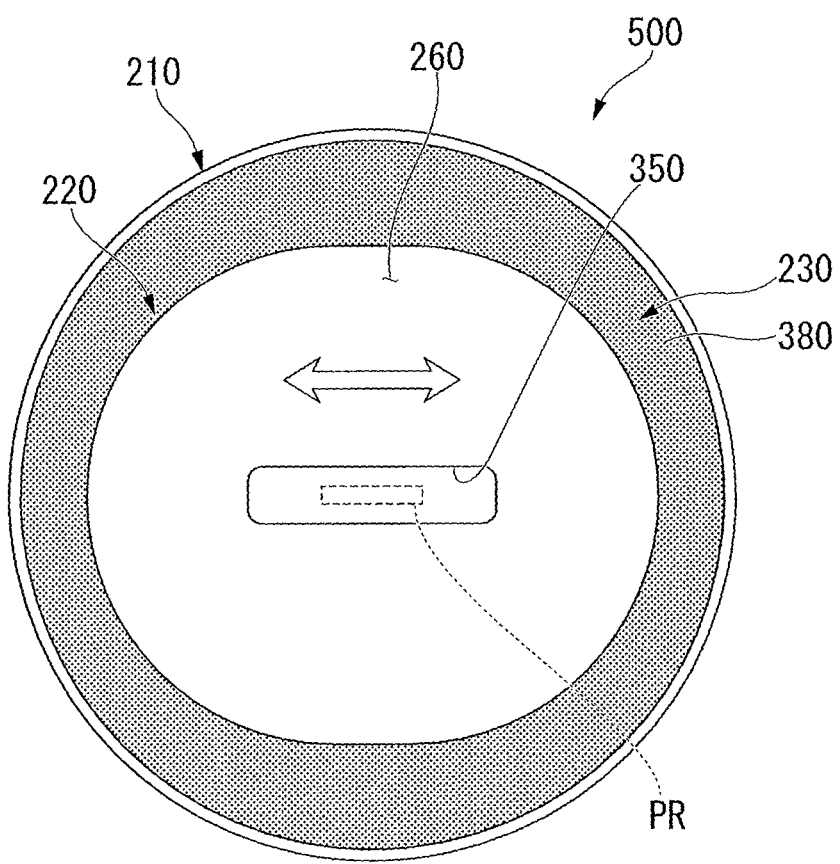
FIG. 23 is a view when the liquid immersion member according to the second embodiment is viewed from below.
Figure 24:
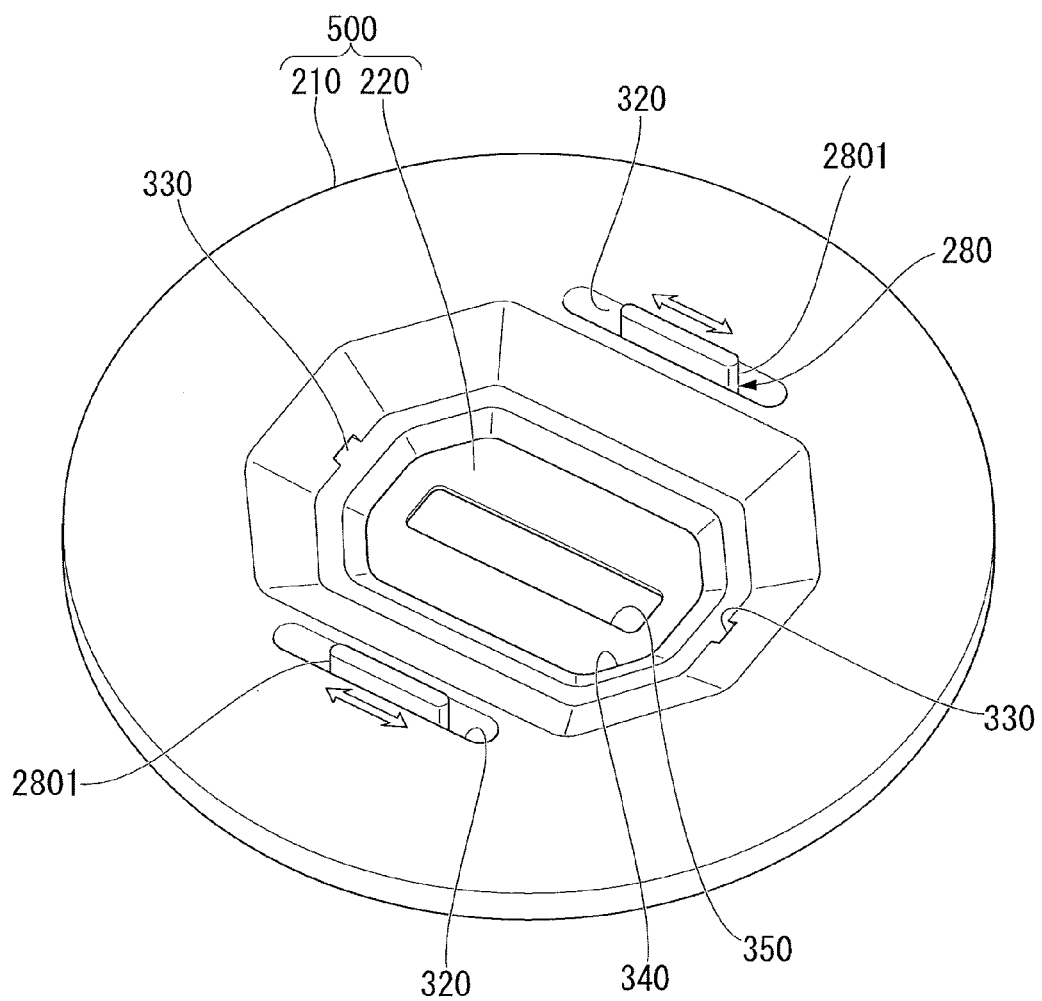
FIG. 24 is a perspective view showing an example of the liquid immersion member according to the second embodiment.
Figure 25:
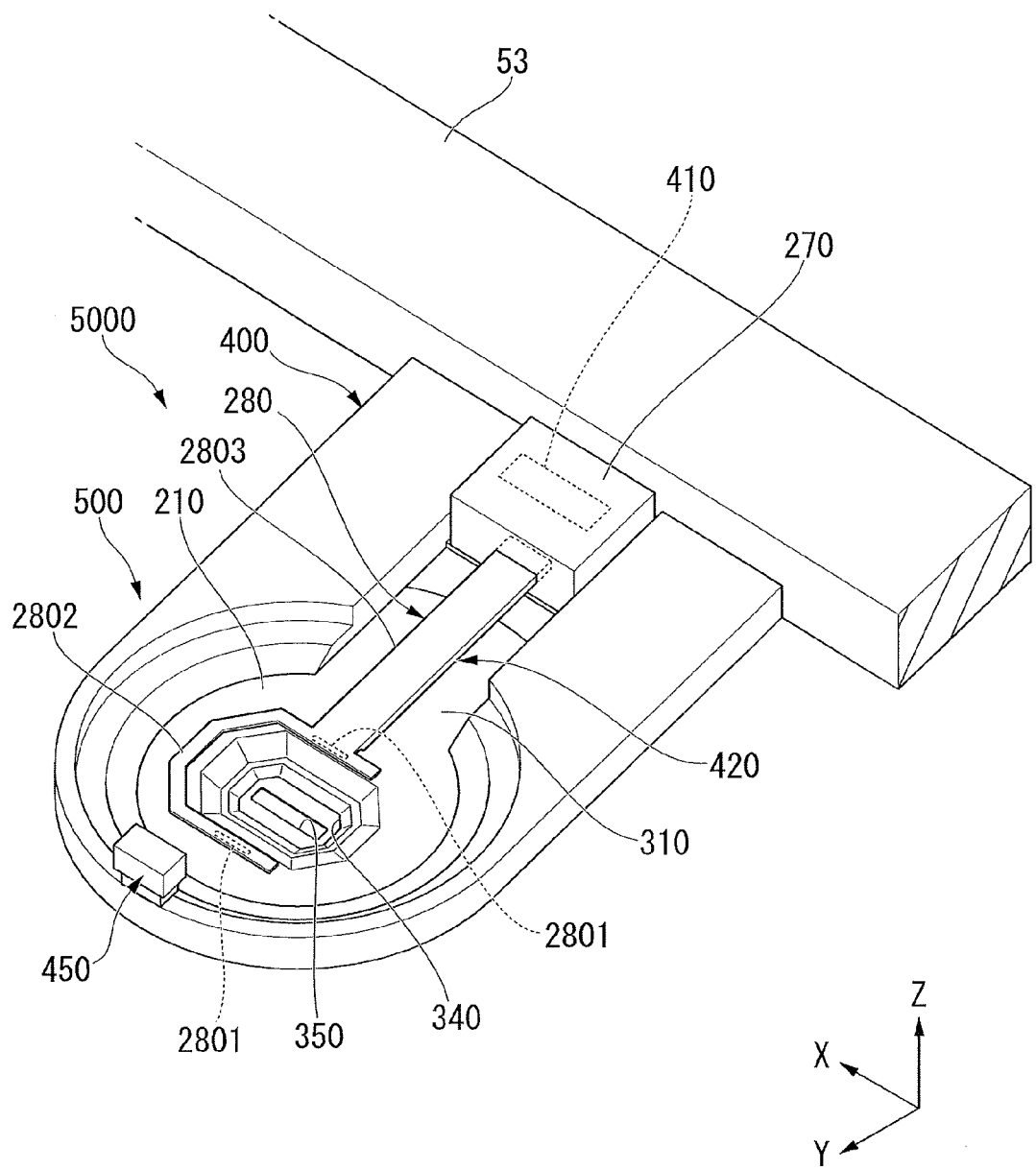
FIG. 25 is a perspective view showing an example of a supporting apparatus according to a second embodiment.

FIG. 20 is a cross-sectional view parallel to the YZ plane of a liquid immersion member 500 according to the present embodiment. FIG. 21 is a cross-sectional view parallel to the XZ plane of the liquid immersion member 500. FIG. 22 is a view in which a portion of FIG. 20 is enlarged. FIG. 23 is a view when the liquid immersion member 500 is viewed from the lower side (−Z side). FIG. 24 is a perspective view of the liquid immersion member 500. FIG. 25 is a perspective view showing an example of a supporting apparatus 5000 which supports the liquid immersion member 500.

The liquid immersion member 500 includes a first member 210 which is disposed at at least a portion of the surrounding of the terminal optical element 13, a second member 220 which is disposed at at least a portion of the surrounding of the optical path K below the first member 210 and which is able to move with respect to the first member 210, a supply part 330 which is able to supply the liquid LQ to form the liquid immersion space LS, and a recovery part 230 which is able to recover the liquid LQ. The first member 210 is an annular member which is disposed at the surrounding of the terminal optical element 13. The second member 220 is an annular member which is disposed at the surrounding of the optical path K. The first member 210 includes an opening 340 through which the exposure light EL from the emitting surface 12 is able to pass. The second member 220 includes an opening 350 through which the exposure light EL from the emitting surface 12 is able to pass.

The first member 210 includes a lower surface 240 facing the −Z axis direction. The second member 220 includes an upper surface 250 facing the +Z axis direction and a lower surface 260 facing the −Z axis direction. The substrate P (object) is able to be opposite to the lower surface 260. The upper surface 250 is opposite to the lower surface 240 via a gap. Moreover, in the present embodiment, at least a portion of the upper surface 250 is opposite to the emitting surface 12 via a gap. In addition, the upper surface 250 may not be opposite to the emitting surface 12.

A supply port 330 is disposed inside the recovery part 230 with respect to a radial direction to the optical axis (optical path K) of the terminal optical element 13. The supply part 330 is disposed at the first member 210. In the present embodiment, the supply port 330 is disposed to be opposite to the side surface 13F. The supply port 330 supplies the liquid LQ to the third space SP3. Moreover, the supply port 330 may be disposed at the second member 220, and may be disposed at both of the first member 210 and the second member 220.

The recovery part 230 is disposed outside the lower surface 240 of the first member 210 with respect to the optical path K (the optical axis of the terminal optical element 13). The lower surface 240 does not recover the liquid LQ. The substrate P (object) is able to be opposite to at least a portion of the recovery part 230. The recovery part 230 is able to recover at least a portion of the liquid LQ from the first space SP1 which the upper surface 250 faces and the second space SP2 which the lower surface 260 faces. The first space SP1 includes a space between the lower surface 240 and the upper surface 250. The second space SP2 includes a space between the lower surface 260 and the upper surface of the substrate P (object). In the present embodiment, the recovery part 230 is disposed at the first member 210. At least a portion of the second member 220 is opposite to the recovery part 230. The second member 220 may not be opposite to the recovery part 230. In addition, the recovery part 230 may be disposed at a member different from the first member 210 and the second member 220.

In the present embodiment, the recovery part 230 includes a porous member 380. The liquid LQ above the substrate P (object) is recovered via holes of the porous member 380. The holes (openings) of the porous member 380 function as recovery ports which recover the liquid LQ. In the present embodiment, the porous member 380 includes a mesh plate.

Since the recovery operation of the liquid LQ from the recovery part 230 (recovery ports) is performed in parallel with the supply operation of the liquid LQ from the supply port 330, the liquid immersion space LS is formed between the terminal optical element 13 and the liquid immersion member 500 of one side and the substrate P (object) of the other side, by the liquid LQ.

The supporting apparatus 5000 includes a first supporting member 400 which supports the first member 210, a second supporting member 280 which supports the second member 200, and a driving apparatus 270 which is able to move the second member 220. The first supporting member 400 is supported by the support frame 53. The driving apparatus 270 is supported by the support frame 53. The second supporting member 280 is connected to the driving apparatus 270. The second supporting member 280 is supported by the support frame 53 via the driving apparatus 270.

The support frame 53 supports first member 210 via the first supporting member 400. The support frame 53 supports the second member 220 via the driving apparatus 270 and the second supporting member 280.

Similar to the above-described embodiment, the support frame 53 may not be supported by the apparatus frame 8B via the vibration isolator 55. The apparatus frame 8B may support the first member 210 and the second member 220 via the vibration isolator 55 and the support frame 53.

The second member 220 is driven by the driving apparatus 270. For example, the driving apparatus 270 includes a motor, and is able to move the second member 220 using Lorentz force. The driving apparatus 270 moves the second member 220 in at least the X axis direction. Moreover, the driving apparatus 270 may move the second member 220 in six directions of the X axis, the Y axis, the Z axis, the θX, the θY, and the θZ.

The supporting member 280 is connected to at least a portion of the second member 220. The supporting member 280 is moved by the driving apparatus 270, and thus, the second member 220 is moved. In the present embodiment, the supporting member 280 includes a first portion 2801 which includes an upper end part and a lower end part, a second portion 2802 which is connected to the upper end part of the first portion 2801, and a third portion 2803 which is connected to the second portion 2802. The lower end part of the first portion 2801 is connected to at least a portion of the upper surface 250 of the second member 220.

In the present embodiment, the first portions 2801 of the supporting member 280 are each disposed at the +Y side and the −Y side with respect to the optical path K (the optical axis of the terminal optical element 13).

Moreover, the disposition of the plurality of first portions 2801 is not limited to the +Y side and the −Y side. For example, the first portions may be disposed at each of the +X side and the −X side, and may be disposed at each of the +Y side, the −Y side, the +X side, and the −X side.

In the present embodiment, the second portion 2802 is connected to the plurality of first portions 2801. The third portion 2803 is disposed between the second portion 2802 and the driving apparatus 270. The driving apparatus 270 is connected to the third portion 2803. Moreover, the second portion 2802 and the third portion 2803 may be considered as an integral component. In the present embodiment, the driving apparatus 270 is disposed at the −Y side with respect to the optical axis of the terminal optical element 13.

In the present embodiment, the first member 210 includes an inner surface 300 opposite to the side surface 13F of the terminal optical element 13, and an upper surface 310 which is disposed at the surrounding of the upper end of the inner surface 300. The side surface 13F of the terminal optical element 13 is a non-emitting surface in which the exposure light EL is not emitted. The exposure light EL passes through the emitting surface 12 without passing through the side surface 13F.

In the present embodiment, the plurality of first portions 2801 are disposed so as to move in each of a plurality of holes 320 which are provided at the first member 210. In the present embodiment, the holes 320 are provided at each of the +Y side and the −Y side with respect to the optical path K. Each of the holes 320 penetrates the first member 210 so as to connect the upper side space and the lower side space of the first member 210 with respect to the Z axis direction. The upper side space of the first member 210 includes the third space SP3 between the terminal optical element 13 and the first member 210. The lower side space of the first member 210 includes the first space SP1 between the first member 210 and the second member 220. Moreover, the lower side space of the first member 210 may include the second space SP2 between the second member 220 and the object (substrate P or the like).

In the present embodiment, each of the holes 320 is formed so as to connect the inner surface 300 and the lower surface 240 of the first member 210. Moreover, as shown in FIG. 24, each of the holes 320 extends in the X axis direction, and the first portion 2801 which is disposed at the hole 320 is able to move in the X axis direction. The supporting member 280 is moved in the X axis direction by the driving apparatus 270, and thus, the second member 220 is moved in the X axis direction.

In addition, at least one of the holes 320 in which the first portions 2801 are disposed may be formed so as to connect the upper surface 310 and the lower surface 240 of the first member 210.

A vibration isolator 450, which suppresses the vibration of the first member 210, is provided. In the present embodiment, at least a portion of the vibration isolator 450 is connected to the first supporting member 400. At least a portion of the vibration isolator 450 may be connected to the first member 210. The vibration isolator 450 may be connected to both of the first member 210 and the first supporting member 400. The vibration isolator 450 includes a so-called mass damper. The vibration isolator 450 suppresses the vibration of the first member 210 caused by the movement of the second member 220. The vibration isolator 450 can suppress the vibration of the first member 210 generated regardless of the movement of the second member 22. For example, the vibration isolator 450 suppresses the vibration of the first member 210 with respect to the Z axis direction. In addition, the vibration isolator 450 may suppress the vibration of the first member 210 with respect to six directions of the X axis, the Y axis, the Z axis, the θX, the θY, and the θZ.

The vibration isolator 450 may be disposed at one location in the first member 210 (first supporting member 400), and may be disposed at plurality of locations.

In the present embodiment, a temperature adjustment apparatus 410, which adjusts the temperature of the driving apparatus 270, is provided. For example, the temperature adjustment apparatus 410 may include a tube member which is disposed so as to contact at least a portion of the driving apparatus 270, and a fluid supply apparatus which supplies a fluid (one or both of liquid and gas), in which temperature is adjusted, to a channel included in the tube member. In addition, the temperature adjustment apparatus 410 may include a fluid supply apparatus which supplies the fluid, in which the temperature is adjusted, to an inner channel which is formed in at least a portion of the driving apparatus 270. According to the supplied fluid, the temperature of the driving apparatus 270 may be adjusted. Moreover, the temperature adjustment apparatus 410 may include a peltier element which is disposed at the driving apparatus 270.

In addition, a temperature adjustment apparatus which adjusts the temperature of the driving apparatus 56 may be provided in the above-described first embodiment. Moreover, a temperature adjustment apparatus which adjust the temperature of the vibration isolator 55 may be provided.

In the present embodiment, the second member 220 and the supporting member 280 do not contact the first member 210. A gap is formed between the first member 210 and the second member 220, and a gap is formed between the first member 210 and the supporting member 280. The driving apparatus 270 is able to move the second member 220 and the supporting member 280 so that the second member 220, the supporting member 280, and the first member 210 do not contact one another.

In the present embodiment, the supporting apparatus 5000 includes a supporting part 420 which supports at least a portion of the second member 220 in a non-contact manner. In the present embodiment, the supporting part 420 supports the third portion 2803 in a non-contact manner. Moreover, the second portion 2802 and the third portion 2803 may be considered as an integral component. In this case, the supporting part 420 supports the second portion in a non-contact manner.

Figure 26:
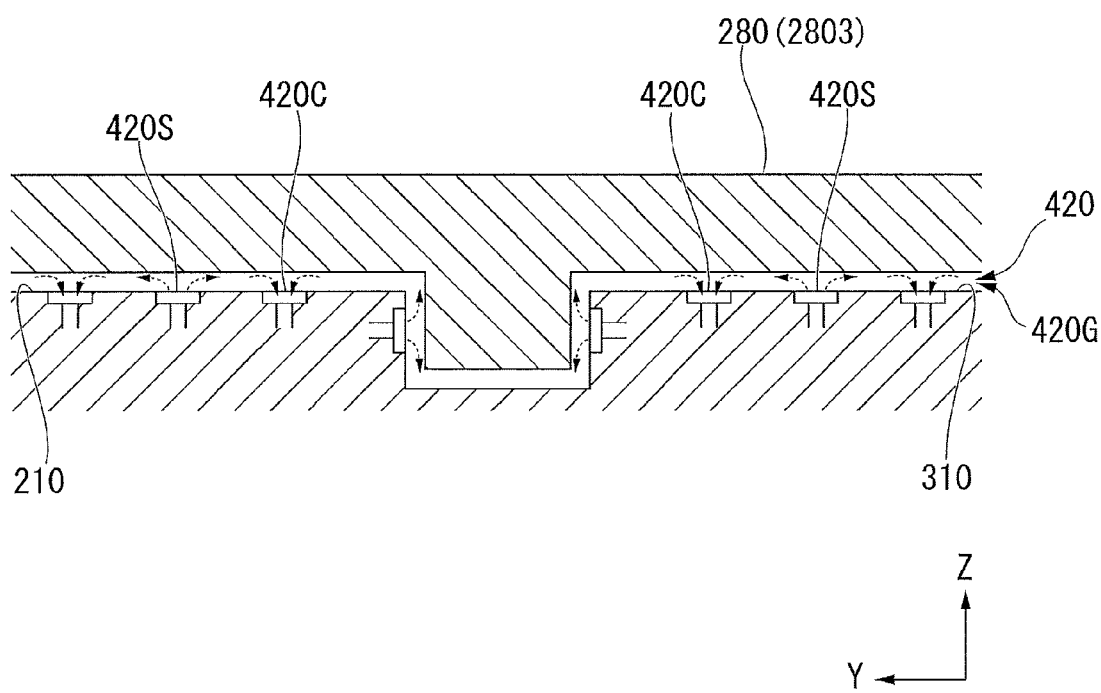
FIG. 26 is a view showing an example of a supporting part according to the second embodiment.

FIG. 26 is a view showing an example of the supporting part 420. In the present embodiment, at least a portion of the supporting part 420 is disposed at the first member 210. In the present embodiment, at least a portion of the supporting part 420 is disposed at the upper surface 310 of the first member 210.

The supporting apparatus 5000 includes a gas bearing 420G between the lower surface of the third portion 2803 and the upper surface 310 (supporting part 420) of the first member 210. The supporting part 420 includes the gas bearing 420G. The gas bearing 420G includes a gas supply port 420S which supplies gas between the third portion 2803 and the first member 210, and a gas discharge port 420C which discharges the gas between the third portion 2803 and the first member 210. According to the gas bearing 420G, the third portion 2803 (second supporting member 280) is supported (first member 210) in a non-contact manner with respect to the supporting part 420. Moreover, the supporting part 420G guides the second supporting member 280 (third portion 2803) in the X axis direction.

In addition, at least one of the second member 220 and the supporting member 280, and the first member 210 may contact each other.

As described above, according to the present embodiment, the support frame 53 which supports the first member 210 and the second member 220 is supported by the vibration isolator 55, for example, even when vibration occurs due to the movement of the second member 220, transmission of the vibration to the apparatus frame 8B or transmission of the vibration to the reference frame 8A is suppressed.

Accordingly, for example, vibration of the terminal optical element 13 (projection optical system PL) can be suppressed. Therefore, occurrence of exposure failure and occurrence of a defective device are suppressed.

Moreover, in the present embodiment, the vibration isolator 450 is connected to the first member 210 to suppress the vibration of the first member 210. Accordingly, for example, even when vibration occurs due to the movement of the second member 220, the vibration of the first member 210 is suppressed. Moreover, by suppressing the vibration of the first member 210, the change in the size of the third space SP3 or the change in the pressure of the third space SP3 is suppressed. Therefore, the displacement (or deformation) of the terminal optical element 13 or the flowing-out of the liquid LQ from the third space SP3 is suppressed. In addition, by suppressing the vibration of the first member 210, the change in the size of the second space SP2 or the change in the pressure of the second space SP2 is suppressed. Accordingly, the displacement (or deformation) of the object (substrate P or the like) or the flowing-out of the liquid LQ from the second space SP2 is suppressed.

Figure 27:
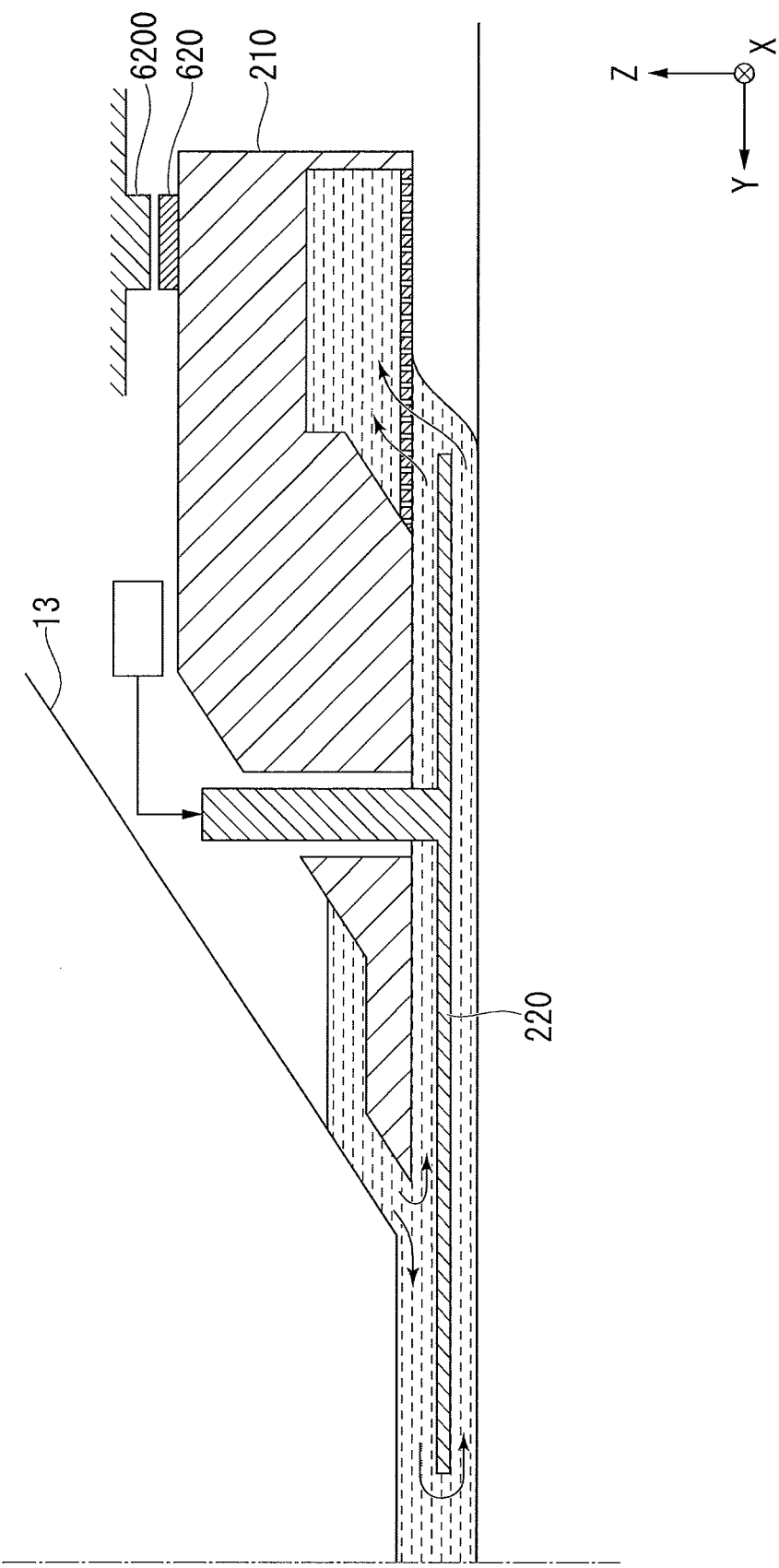
FIG. 27 is a view showing an example of a detection apparatus according to the second embodiment.

As shown in FIG. 27, a detection apparatus 620, which detects the position of the first member 210 with respect to the reference member 6200, may be provided. The position of the reference member 6200 is substantially fixed. For example, the reference member 6200 may be at least a portion of the projection optical system PL. For example, the reference member 6200 may be a holding member (barrel or the like) which holds the optical elements of the projection optical system PL. The reference member 6200 may be the reference frame 8A which supports the projection optical system PL. The reference member 6200 may be a member which is fixed to the projection optical system PL, and may be a member which is fixed to the reference frame 8A.

The detection apparatus 620 includes a position sensor (displacement sensor) which is able to detect the position of the first member 210 with respect to the reference member 6200. The detection apparatus 620 is able to detect the position of the first member 210 at least with respect to the Z axis direction. In the present embodiment, at least a portion of the detection apparatus 620 is opposite to the reference member 6200 via a gap. Moreover, the detection apparatus 620 may detect the positions of the first member 210 with respect to six directions of the X axis, the Y axis, the Z axis, the θX, the θY, and the θZ.

The detection result of the detection apparatus 620 is output to the controller 6. The controller 6 may move the first member 210 based on the detection result of the detection apparatus 620 so that the displacement of the first member 210 with respect to the reference member 6200 is suppressed. The controller 6 may move the support frame 53 by using the vibration isolator 55 based on the detection result of the detection apparatus 620 so that the displacement of the first member 210 with respect to the reference member 6200 is suppressed.

Moreover, the controller 6 may detect the vibration of the first member 210 by using the detection apparatus 620. The controller 6 may detect the vibration (acceleration) of the first member 210 by performing calculation processing with respect to the detection value of the detection apparatus 620. The controller 6 may control the vibration isolator 450 based on the detection result of the detection apparatus 620 so that the vibration of the first member 210 is suppressed. When the vibration isolator 450 includes an actuator, the controller 6 is able to perform active vibration-isolation (vibration-proof) by using the vibration isolator 450 based on the detection result of the detection apparatus 620 so that the vibration of the first member 210 is suppressed. Moreover, when a vibration sensor, (an acceleration sensor or the like), which is able to detect the vibration of the first member 210, is disposed at the first member 210, the controller 6 may control the vibration isolator 450 based on the detection result of the vibration sensor so that the vibration of the first member 210 is suppressed.

Figure 28:
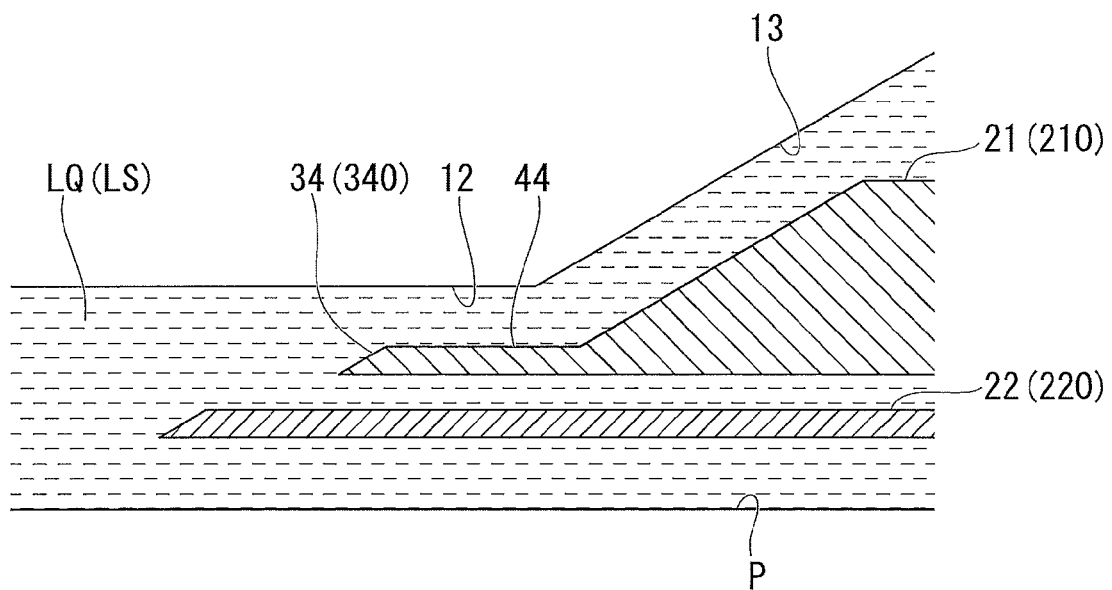
FIG. 28 is a view showing an example of a liquid immersion member.

Furthermore, in the above-described first, second, and third embodiments, as shown in FIG. 28, at least a portion of the first member 21 (210) may be opposite to the emitting surface 12 of the terminal optical element 13. In the example shown in FIG. 28, the first member 21 (210) includes an upper surface 44 which is disposed at the surrounding of the opening 34 (340). The upper surface 44 is disposed at the surrounding of the upper end of the opening 34 (340). Moreover, in the example shown in FIG. 28, a portion of the upper surface of the second member 22 (220) is also opposite to the emitting surface 12.

Figure 29:
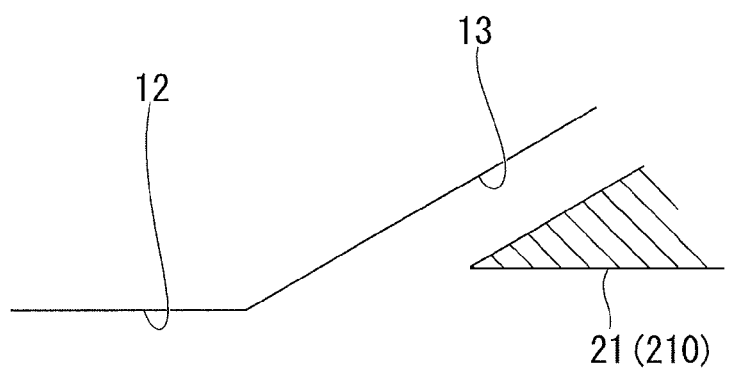
FIG. 29 is a view showing an example of a liquid immersion member.

In addition, in the above-described first and second embodiments, as shown in FIG. 29, the lower surface of the first member 21 (210) may be disposed at more +Z side than the emitting surface 12. Moreover, the position (height) of the lower surface of the first member 21 (210) and the position (height) of the emitting surface 12 with respect to the Z axis direction may be substantially the same as each other. The lower surface of the first member 21 (210) may be disposed at more −Z side than the emitting surface 12.

In addition, in each of the above-described embodiments, a suction port, which sucks at least one of the liquid LQ and the gas from the space between the first member 21 (210) and the terminal optical element 13, may be provided at the first member 21.

Moreover, in the above-described embodiment, the controller 6 includes a computer system which includes a CPU or the like. In addition, the controller 6 includes an interface which is able to perform communication with a computer system and an external apparatus. For example, the storage apparatus 7 includes a memory such as a RAM, a hard disk, and a recording medium such as a CD-ROM. In the storage apparatus 7, an operating system (OS) which controls the computer system is installed and a program used to control the exposure apparatus EX is stored.

Moreover, an input apparatus which is able to input signals may be connected to the controller 6. The input apparatus includes input equipment such as a keyboard or a mouse, a communication apparatus or the like which is able to input data from the external apparatus, and the like. Moreover, a display apparatus such as a liquid crystal display may be also provided.

The controller (computer system) 6 is able to read various information which includes the programs which are recorded in the storage apparatus 7. Programs are recorded in the storage apparatus 7, and the programs make the controller 6 perform the control of the liquid immersion exposure apparatus which exposes the substrate by the exposure light via the liquid filled in the optical path of the exposure light between the emitting surface of the optical member from which the exposure light is emitted and the substrate.

According to the above-described embodiments, the programs which are recorded in the storage apparatus 7 may make the controller 6 perform: forming the liquid immersion space of the liquid on the substrate, using the liquid immersion member that includes the first member disposed at at least a portion of the surrounding of the optical member, and the second member that is disposed at at least a portion of the surrounding of the optical path of the exposure light below the first member and that includes the second upper surface opposite to a first lower surface of the first member via a gap, and the second lower surface that is able to be opposite to the substrate capable of moving below the optical member; exposing the substrate by the exposure light emitted from the emitting surface via the liquid in the liquid immersion space; moving the second member with respect to the first member in at least a portion of the exposure of the substrate; and suppressing the vibration of the first member by the vibration isolator.

In addition, according to the above-described embodiments, the programs which are recorded in the storage apparatus 7 may make the controller 6 perform: forming the liquid immersion space of the liquid on the substrate, using the liquid immersion member that includes the first member disposed at at least a portion of the surrounding of the optical member, and the second member that is disposed at at least a portion of the surrounding of the optical path of the exposure light below the first member and that includes the second upper surface opposite to a first lower surface of the first member via a gap, and the second lower surface that is able to be opposite to the substrate capable of moving below the optical member; exposing the substrate by the exposure light emitted from the emitting surface via the liquid in the liquid immersion space; moving the second member with respect to the first member in at least a portion of the exposure of the substrate; and moving the first member by the first driving apparatus to suppress the displacement of the first member with respect to the reference member.

The programs which are stored in the storage apparatus 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each of the above-described embodiments, the optical path K at the emitting surface 12 side (image surface side) of the terminal optical element 13 of the projection optical system PL is filled with the liquid LQ. However, for example, the projection optical system PL may be the projection optical system in which the optical path of the incident side (object surface side) at the terminal optical element 13 is also filled with the liquid LQ as disclosed in PCT International Publication No. WO 2004/019128.

In addition, in each of the above-described embodiments, the liquid LQ is water. However, the liquid may be liquid other than the water. It is preferable that the liquid LQ be transparent with respect to the exposure light EL, have a high refractive index with respect to the exposure light EL, and be stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, such as, for example, supercritical liquid.

Moreover, in each of the above-described embodiments, the substrate P includes a semiconductor wafer for manufacturing a semiconductor device. However, for example, the substrate may include a glass substrate for a display device, a ceramic wafer for a thin film magnetic head, a mask or an original plate (synthetic quartz, silicon wafer) of a reticle which is used in an exposure apparatus, or the like.

Moreover, in each of the above-described embodiments, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus may be a projection exposure apparatus (stepper) of a step-and-repeat system in which patterns of the mask M are collectively exposed in a state where the mask M and the substrate P are stationary and the substrate P is sequentially step-moved.

In addition, the exposure apparatus EX may be an exposure apparatus (a collective exposure apparatus of a stitch system) in which, in the exposure of a step-and-repeat system, after the reduced image of a first pattern is transferred on the substrate P using the projection optical system in a state where the first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

In addition, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 30:
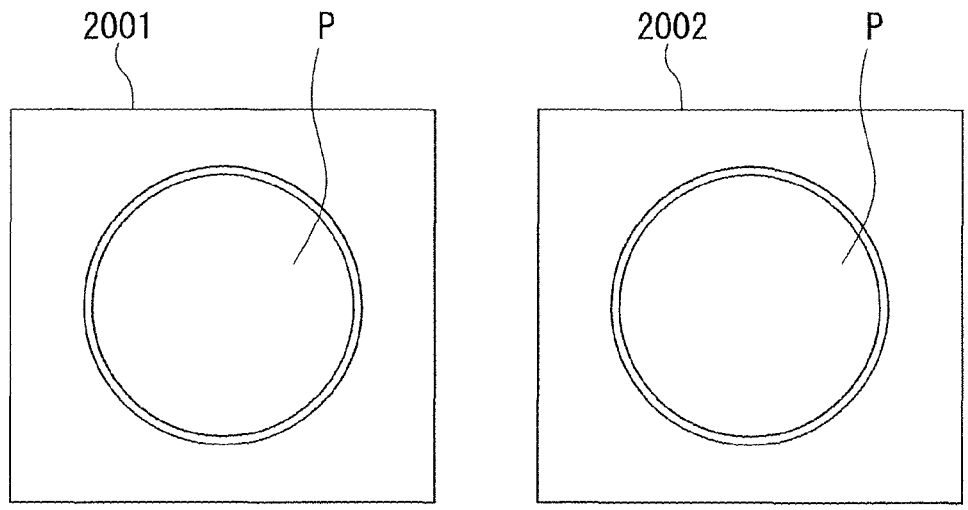
FIG. 30 is a view showing an example of a substrate stage.

In addition, in each of the above-described embodiments, the exposure apparatus EX may be an exposure apparatus of a twin stage type which includes a plurality of substrate stages, as disclosed in U.S. Pat. No. 6,341,007, U.S. Pat. No. 6,208,407, U.S. Pat. No. 6,262,796, or the like. For example, as shown in FIG. 30, when the exposure apparatus EX includes two substrate stages 2001 and 2002, the object which is able to be arranged so as to be opposite to the emitting surface 12 includes at least one of one substrate stage, a substrate which is held by a first holding portion of the one substrate stage, another substrate stage, and a substrate which is held by a first holding portion of another substrate stage.

Moreover, the exposure apparatus EX may be an exposure apparatus which includes the plurality of substrate stages and measurement stages.

The exposure apparatus EX may be an exposure apparatus for manufacturing a semiconductor element which exposes a semiconductor element pattern on the substrate P, an exposure apparatus for manufacturing a liquid crystal display element or a display, or an exposure apparatus for manufacturing a thin film magnetic head, an imaging element (CCD), a micromachine, a MEMS, a DNA chip, or a reticle or mask, or the like.

Moreover, in each of the above-described embodiments, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. In addition, instead of the variable molding masks which include a non-light emission type image display element, a pattern-forming apparatus which includes a self light-emission type image display element may be provided.

In each of the above-described embodiments, the exposure apparatus EX includes the projection optical system PL. However, the components in each of the above-described embodiments may be applied to an exposure apparatus and an exposing method which do not use the projection optical system PL. For example, the components in each of the above-described embodiments may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of the exposure apparatus by various subsystems is terminated, a general adjustment is performed, and thus, various accuracies in the overall exposure apparatus are secured. Moreover, it is preferable that the manufacturing of the exposure apparatus be performed in a clean room in which a temperature, a degree of cleanness, or the like is controlled.

Figure 31:
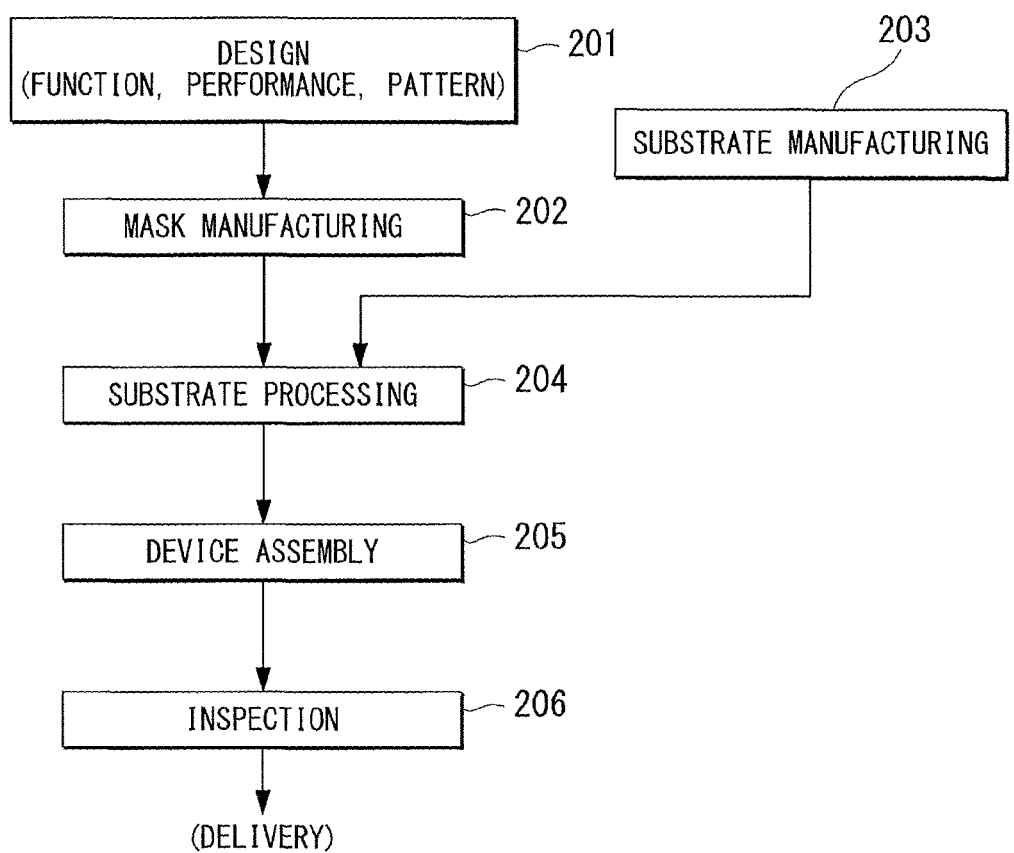
FIG. 31 is a flowchart for explaining an example of a device manufacturing method.

As shown in FIG. 31, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask and developing the exposed substrate according to the above-described embodiments, a device assembly step (which includes manufacturing processes such as a dicing process, a bonding process, and a package process) 205, an inspection step 206, or the like.

Moreover, the aspects of each embodiment described above may be appropriately combined. In addition, some components may not be used. Moreover, as long as legally permitted, the disclosures of all publications and United States Patents with respect to the exposure apparatuses or the like cited in each of the above-mentioned embodiment and modifications are incorporated in the disclosures of the present application.

DESCRIPTION OF REFERENCE SYMBOLS

2 . . . substrate stage, 3 . . . measurement stage, 5 . . . liquid immersion member, 6 . . . controller, 7 . . . storage apparatus, 8A . . . reference frame, 8B . . . apparatus frame, 12 . . . emitting surface, 13 . . . terminal optical element, 21 . . . first member, 22 . . . second member, 23 . . . lower surface, 24 . . . fluid recovery part, 25 . . . upper surface, 26 . . . lower surface, 27 . . . fluid recovery part, 29 . . . outer surface, 30 . . . inner surface, 31 . . . liquid supply part, 32 . . . driving apparatus, 34 . . . opening, 35 . . . opening, 51 . . . first supporting member, 52 . . . second supporting member, 53 . . . support frame, 54 . . . moving frame, 55 . . . vibration isolator, 56 . . . driving apparatus, 62 . . . detection apparatus, 63 . . . detection apparatus, 410 . . . temperature adjustment apparatus, 450 . . . vibration isolator, EL . . . exposure light, EX . . . exposure apparatus, IL . . . illumination system, K . . . optical path, LQ . . . liquid, LS . . . liquid immersion space, P . . . substrate

The invention claimed is:

1. An exposure apparatus that exposes a substrate by exposure light via liquid between an emitting surface of an optical member and the substrate, the exposure apparatus comprising:
a liquid immersion member configured to form a liquid immersion space on an object and comprising a first member and a second member, the first member being disposed at least at a portion surrounding the optical member, the second member being disposed at least at a portion surrounding an optical path of the exposure light below the first member, the second member being movable with respect to the first member and comprising a second upper surface and a second lower surface, the second upper surface being opposite to a first lower surface of the first member via a gap, the second lower surface being capable of being opposite to the object, the object being movable below the optical member; and
a vibration isolator configured to suppress a vibration of the first member, wherein
the object comprises the substrate,
in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and
the exposure light is radiated to a shot region of the substrate via liquid of the liquid immersion space while the substrate is moving in the first pathway, and the exposure light is not radiated while the substrate is moving in the second pathway.

2. The exposure apparatus according to claim 1,
wherein the second member is moved in the plane which is substantially perpendicular to the optical axis of the optical member, and
wherein the vibration isolator suppresses the vibration of the first member with respect to a first direction which is substantially parallel to the optical axis.

3. The exposure apparatus according to claim 1,
wherein the vibration isolator suppresses the vibration of the first member caused by a movement of the second member.

4. The exposure apparatus according to claim 1,
wherein at least a portion of the vibration isolator is connected to the first member.

5. The exposure apparatus according to claim 1, further comprising:
a first frame supporting the optical member;
a second frame supporting the first member;
a third frame supporting the first and second frames; and
a driving apparatus configured to move the second member, at least a portion of the driving apparatus being supported by the third frame.

6. The exposure apparatus according to claim 5, further comprising:
a supporting member which is connected to the second member,
wherein the second member moves according to a movement of the supporting member, the supporting member being moved by the driving apparatus.

7. The exposure apparatus according to claim 6,
wherein a stator of the driving apparatus is disposed at the third frame, and a mover of the driving apparatus is connected to the supporting member.

8. The exposure apparatus according to claim 6,
wherein the supporting member is moved in a state where the supporting member and at least a portion of the first member are opposite to each other via a gap.

9. The exposure apparatus according to claim 6,
wherein the first member comprises a hole which connects an upper space and a lower space of the first member, and
wherein a first portion of the supporting member is moved inside of the hole.

10. The exposure apparatus according to claim 9,
wherein the first portions are each disposed at one side and another side with respect to the optical axis of the optical member.

11. The exposure apparatus according to claim 9,
wherein the supporting member comprises a second portion which is connected to an upper end of the first portion, and
wherein the driving apparatus is connected to the second portion.

12. The exposure apparatus according to claim 11,
wherein the driving apparatus is disposed at one side with respect to the optical axis of the optical member.

13. The exposure apparatus according to claim 11, further comprising:
a supporting part that supports the second portion in a non-contact manner.

14. The exposure apparatus according to claim 13, further comprising:
a gas bearing positioned between the second portion and at least a portion of the supporting part.

15. The exposure apparatus according to claim 9,
wherein the lower space of the first member comprises a space between the first member and the second member.

16. The exposure apparatus according to claim 5, further comprising:
a temperature adjustment apparatus configured to adjust a temperature of the driving apparatus.

17. The exposure apparatus according to claim 1, further comprising:
a supply part that is disposed at the liquid immersion member and that is configured to supply liquid to form the liquid immersion space; and
a recovery part that is disposed at the liquid immersion member and that is configured to recover at least a portion of liquid of the liquid immersion space,
wherein the second member is moved in parallel with a supply of liquid from the supply part and a recovery of liquid from the recovery part.

18. The exposure apparatus according to claim 17,
wherein the recovery part is disposed at the first member, and recovers at least a portion of liquid from at least one of a first space facing the second upper surface and a second space facing the second lower surface.

19. The exposure apparatus according to claim 18,
wherein at least a portion of the second member is opposite to the recovery part.

20. The exposure apparatus according to claim 17,
wherein the recovery part comprises a porous member.

21. The exposure apparatus according to claim 17,
wherein the supply part is disposed at the first member.

22. The exposure apparatus according to claim 1,
wherein the first member comprises a first opening through which the exposure light is able to pass, and
wherein the second member comprises a second opening through which the exposure light is able to pass.

23. The exposure apparatus according to claim 1,
wherein the second member is movable in at least a part of a period in which the exposure light is emitted from the emitting surface.

24. The exposure apparatus according to claim 1,
wherein the substrate moves in a third pathway after moving in the second pathway, the movement of the substrate in the third pathway comprises a movement in a fourth direction opposite to the second direction, and the second member moves in a fifth direction opposite to the third direction in at least a part of a period while the substrate is moving in the third pathway.

25. The exposure apparatus according to claim 1,
wherein the object also comprises a substrate stage which moves while holding the substrate.

26. A device manufacturing method, comprising:
exposing the substrate by using the exposure apparatus according to claim 1; and
developing the exposed substrate.

27. An exposure apparatus that exposes a substrate by exposure light via liquid between an emitting surface of an optical member and the substrate, the exposure apparatus comprising:
a liquid immersion member configured to form a liquid immersion space on an object and comprising a first member and a second member, the first member being disposed at least at a portion surrounding the optical member, the second member being disposed at least at a portion surrounding an optical path of the exposure light below the first member, the second member being movable with respect to the first member and comprising a second upper surface and a second lower surface, the second upper surface being opposite to a first lower surface of the first member via a gap, the second lower surface being capable of being opposite to the object, the object being movable below the optical member; and
a first driving apparatus configured to move the first member so that a displacement of the first member with respect to a reference member is suppressed, wherein the object comprises the substrate,
in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and the exposure light is radiated to a shot region of the substrate via liquid of the liquid immersion space while the substrate is moving in the first pathway, and the exposure light is not radiated while the substrate is moving in the second pathway.

28. The exposure apparatus according to claim 27,
wherein the reference member is the optical member.

29. The exposure apparatus according to claim 27,
wherein the second member is moved in the plane which is substantially perpendicular to the optical axis of the optical member, and
wherein the first member is moved by the first driving apparatus so that the displacement of the first member with respect to a first direction, which is substantially parallel with the optical axis, is suppressed.

30. The exposure apparatus according to claim 27,
wherein the first member is moved by the first driving apparatus so that the displacement of the first member caused by a movement of the second member is suppressed.

31. The exposure apparatus according to claim 30, further comprising:
a storage apparatus configured to store a relationship between a movement condition of the second member and a position of the first member with respect to the reference member,
wherein the first member is moved by the first driving apparatus based on information of the storage apparatus.

32. The exposure apparatus according to claim 27, further comprising:
a detection apparatus configured to detect a position of the first member with respect to the reference member,
wherein the first member is moved by the first driving apparatus based on a detection result of the detection apparatus.

33. The exposure apparatus according to claim 27, further comprising:
a first frame supporting the optical member;
a second frame supporting the first member;
a third frame supporting the first and second frames; and
a second driving apparatus configured to move the second member, at least a portion of the second driving apparatus being supported by the third frame.

34. The exposure apparatus according to claim 33, further comprising:
a supporting member which is connected to the second member,
wherein the second member moves according to a movement of the supporting member, the supporting member being moved by the second driving apparatus.

35. The exposure apparatus according to claim 34,
wherein a stator of the second driving apparatus is disposed at the third frame, and a mover of the second driving apparatus is connected to the supporting member.

36. The exposure apparatus according to claim 34,
wherein the supporting member is moved in a state where the supporting member and at least a portion of the first member are opposite to each other via a gap.

37. The exposure apparatus according to claim 34,
wherein the first member comprises a hole which connects an upper space and a lower space of the first member, and
wherein a first portion of the supporting member is moved inside of the hole.

38. The exposure apparatus according to claim 37,
wherein the first portions are each disposed at one side and another side with respect to the optical axis of the optical member.

39. The exposure apparatus according to claim 37,
wherein the supporting member comprises a second portion which is connected to an upper end of the first portion, and
wherein the second driving apparatus is connected to the second portion.

40. The exposure apparatus according to claim 39,
wherein the second driving apparatus is disposed at one side with respect to the optical axis of the optical member.

41. The exposure apparatus according to claim 39, further comprising:
a supporting part that supports the second portion in a non-contact manner.

42. The exposure apparatus according to claim 41, further comprising:
a gas bearing positioned between the second portion and at least a portion of the supporting part.

43. The exposure apparatus according to claim 37,
wherein the lower space of the first member comprises a space between the first member and the second member.

44. The exposure apparatus according to claim 43, further comprising:
a temperature adjustment apparatus configured to adjust a temperature of the driving apparatus.

45. The exposure apparatus according to claim 27, further comprising:
a supply part that is disposed at the liquid immersion member and that is configured to supply liquid to form the liquid immersion space; and
a recovery part that is disposed at the liquid immersion member and that is configured to recover at least a portion of liquid of the liquid immersion space,
wherein the second member is moved in parallel with a supply of liquid from the supply part and a recovery of liquid from the recovery part.

46. The exposure apparatus according to claim 45,
wherein the recovery part is disposed at the first member, and recovers at least a portion of liquid from at least one of a first space facing the second upper surface and a second space facing the second lower surface.

47. The exposure apparatus according to claim 46,
wherein at least a portion of the second member is opposite to the recovery part.

48. The exposure apparatus according to claim 45,
wherein the recovery part comprises a porous member.

49. The exposure apparatus according to claim 45,
wherein the supply part is disposed at the first member.

50. The exposure apparatus according to claim 27,
wherein the first member comprises a first opening through which the exposure light is able to pass, and
wherein the second member comprises a second opening through which the exposure light is able to pass.

51. The exposure apparatus according to claim 27, wherein the second member is movable in at least a part of a period in which the exposure light is emitted from the emitting surface.

52. The exposure apparatus according to claim 27, wherein the substrate moves in a third pathway after moving in the second pathway, the movement of the substrate in the third pathway comprises a movement in a fourth direction opposite to the second direction, and the second member moves in a fifth direction opposite to the third direction in at least a part of a period while the substrate is moving in the third pathway.

53. The exposure apparatus according to claim 27, wherein the object also comprises a substrate stage which moves while holding the substrate.

54. A device manufacturing method, comprising:
exposing the substrate by using the exposure apparatus according to claim 27; and
developing the exposed substrate.

55. An exposing method in which a substrate is exposed by exposure light via liquid between an emitting surface of an optical member and the substrate, the exposing method comprising:
forming a liquid immersion space of the liquid on the substrate by using a liquid immersion member that comprises a first member and a second member, the first member being disposed at least at a portion surrounding the optical member, the second member being disposed at least at a portion surrounding an optical path of the exposure light below the first member and comprising a second upper surface and a second lower surface, the second upper surface being opposite to a first lower surface of the first member via a gap, the second lower surface being capable of being opposite to the substrate, the substrate being movable below the optical member;
exposing the substrate via the liquid of the liquid immersion space by the exposure light emitted from the emitting surface;
moving the second member with respect to the first member in at least a portion of exposure of the substrate; and
suppressing vibration of the first member by using a vibration isolator, wherein
the object comprises the substrate,
in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and
the exposure light is radiated to a shot region of the substrate via liquid of the liquid immersion space while the substrate is moving in the first pathway, and the exposure light is not radiated while the substrate is moving in the second pathway.

56. A device manufacturing method comprising: exposing the substrate using the exposure method according to claim 55; and developing the exposed substrate.

57. An exposing method in which a substrate is exposed by exposure light via liquid between an emitting surface of an optical member and the substrate, the exposing method comprising:
forming a liquid immersion space of the liquid on the substrate by using a liquid immersion member that comprises a first member and a second member, the first member being disposed at least at a portion surrounding the optical member, the second member being disposed at least at a portion surrounding an optical path of the exposure light below the first member and comprising a second upper surface and a second lower surface, the second upper surface being opposite to a first lower surface of the first member via a gap, the second lower surface being capable of being opposite to the substrate, the substrate being movable below the optical member;
exposing the substrate via the liquid of the liquid immersion space by the exposure light emitted from the emitting surface; and
moving the second member with respect to the first member in at least a portion of exposure of the substrate, and moving the first member by a first driving apparatus so that displacement of the first member with respect to a reference member is suppressed, wherein
the object comprises the substrate,
in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and
the exposure light is radiated to a shot region of the substrate via liquid of the liquid immersion space while the substrate is moving in the first pathway, and the exposure light is not radiated while the substrate is moving in the second pathway.

58. A non-transitory computer-readable recording medium on which is stored a program which causes a computer to execute a control of an exposure apparatus that exposes a substrate by exposure light via liquid between an emitting surface of an optical member and the substrate, wherein the program causes the exposure apparatus to perform the steps of:
forming a liquid immersion space of the liquid on the substrate by using a liquid immersion member that comprises a first member and a second member, the first member being disposed at least at a portion surrounding the optical member, the second member being disposed at least at a portion surrounding an optical path of the exposure light below the first member and comprising a second upper surface and a second lower surface, the second upper surface being opposite to a first lower surface of the first member via a gap, the second lower surface being capable of being opposite to the substrate, the substrate being movable below the optical member;
exposing the substrate via the liquid of the liquid immersion space by the exposure light emitted from the emitting surface;

moving the second member with respect to the first member in at least a portion of exposure of the substrate; and suppressing vibration of the first member by using a vibration isolator, wherein the object comprises the substrate, in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and the exposure light is radiated to a shot region of the substrate via liquid of the liquid immersion space while the substrate is moving in the first pathway, and the exposure light is not radiated while the substrate is moving in the second pathway.

59. A non-transitory computer-readable recording medium on which is stored a program which causes a computer to execute a control of an exposure apparatus that exposes a substrate by exposure light via liquid between an emitting surface of an optical member and the substrate, wherein the program causes the exposure apparatus to perform the steps of:

forming a liquid immersion space of the liquid on the substrate by using a liquid immersion member that comprises a first member and a second member, the first member being disposed at least at a portion surrounding the optical member, the second member being disposed at least at a portion surrounding an optical path of the exposure light below the first member and comprising a second upper surface and a second lower surface, the second upper surface being opposite to a first lower surface of the first member via a gap, the second lower surface being capable of being opposite to the substrate, the substrate being movable below the optical member;

exposing the substrate via the liquid of the liquid immersion space by the exposure light emitted from the emitting surface; and moving the second member with respect to the first member in at least a portion of exposure of the substrate, and moving the first member by a first driving apparatus so that displacement of the first member with respect to a reference member is suppressed, wherein the object comprises the substrate, in a state where the liquid immersion space is formed, the substrate moves in a second pathway after moving in a first pathway within a plane substantially perpendicular to an optical axis of the optical member, the movement of the substrate in the first pathway comprises a movement in a second direction substantially parallel with a second axis in the plane, the movement of the substrate in the second pathway comprises a movement in a third direction substantially parallel with a third axis orthogonal to the second axis in the plane, and the second member moves in the third direction in at least a part of a period while the substrate is moving in the second pathway, and the exposure light is radiated to a shot region of the substrate via liquid of the liquid immersion space while the substrate is moving in the first pathway, and the exposure light is not radiated while the substrate is moving in the second pathway.

\* \* \* \* \*

UNITED STATES PATENT AND TRADEMARK OFFICE
CERTIFICATE OF CORRECTION

PATENT NO. : 9,494,870 B2  
APPLICATION NO. : 14/047433  
DATED : November 15, 2016  
INVENTOR(S) : Shinji Sato Page 1 of 1

It is certified that error appears in the above-identified patent and that said Letters Patent is hereby corrected as shown below:

On the Title Page

The following should be added:

-- Related U.S. Application Data

(60) Provisional Application No. 61/716,821, filed on Oct. 22, 2012. --

Signed and Sealed this
Twenty-fifth Day of April, 2017

Michelle K. Lee
*Director of the United States Patent and Trademark Office*